US012771320B2

(12) United States Patent
Nishimura

(10) Patent No.: US 12,771,320 B2
(45) Date of Patent: Oct. 20, 2026

(54) PIEZOELECTRIC RESONATOR

(71) Applicant: Murata Manufacturing Co., Ltd., Nagaokakyo (JP)

(72) Inventor: Toshio Nishimura, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 116 days.

(21) Appl. No.: 19/010,385

(22) Filed: Jan. 6, 2025

(65) Prior Publication Data

US 2025/0141426 A1 May 1, 2025

Related U.S. Application Data

(63) Continuation of application No. PCT/JP2024/014668, filed on Apr. 11, 2024.

(30) Foreign Application Priority Data

Apr. 14, 2023 (JP) ................................ 2023-066681

(51) Int. Cl.
*H03H 9/19* (2006.01)
*H03H 9/02* (2006.01)
(Continued)

(52) U.S. Cl.
CPC .......... *H03H 9/19* (2013.01); *H03H 9/02086* (2013.01); *H03H 9/0542* (2013.01); *H03H 9/1021* (2013.01); *H03H 9/132* (2013.01)

(58) Field of Classification Search
CPC .... H03H 9/19; H03H 9/02086; H03H 9/0542; H03H 9/1021; H03H 9/132; H03H 9/02157; H03H 9/177
(Continued)

(56) References Cited

U.S. PATENT DOCUMENTS 6,111,341 A 8/2000 Hirama
2012/0299444 A1* 11/2012 Yokoyama .............. H03H 9/13
310/326

(Continued)

FOREIGN PATENT DOCUMENTS

JP 2007184816 * 7/2007
JP 2008-005333 A 1/2008
(Continued)

OTHER PUBLICATIONS

International Search Report received for PCT Patent Application No. PCT/JP2024/014668, mailed on Jun. 18, 2024, 2 pages (English Translation Only).

*Primary Examiner* — Richard Tan
(74) *Attorney, Agent, or Firm* — ArentFox Schiff LLP

(57) ABSTRACT

A piezoelectric resonator that includes: a piezoelectric member and an excitation electrode that overlap with each other in a thickness direction, the piezoelectric resonator has a high acoustic velocity region and a low acoustic velocity region, in a plan view in the thickness direction, the high acoustic velocity region overlaps a center portion of the excitation electrode, and the low acoustic velocity region overlaps an end portion of the excitation electrode, the high acoustic velocity region includes a plurality of holes, in a first direction intersecting the thickness direction, a dimension of a portion of the low acoustic velocity region adjacent to the high acoustic velocity region in the first direction is smaller than a dimension of the high acoustic velocity region in the first direction, and in the plan view, an area of the low acoustic velocity region is smaller than an area of the high acoustic velocity region.

19 Claims, 50 Drawing Sheets

(51) Int. Cl.

| | |
|---|---|
| ***H03H 9/05*** | (2006.01) |
| ***H03H 9/10*** | (2006.01) |
| ***H03H 9/13*** | (2006.01) |

(58) Field of Classification Search
USPC ............................................................ 331/73
See application file for complete search history.

(56) References Cited

U.S. PATENT DOCUMENTS

| | | | |
|---|---|---|---|
| 2013/0043960 | A1 | 2/2013 | Ishii et al. |
| 2014/0175944 | A1 | 6/2014 | Koyama et al. |
| 2023/0246632 | A1 | 8/2023 | Toshio |

FOREIGN PATENT DOCUMENTS

| | | | |
|---|---|---|---|
| JP | 2013-046189 | A | 3/2013 |
| JP | 2014-127743 | A | 7/2014 |
| WO | 98/38736 | A1 | 9/1998 |
| WO | 2022/080426 | A1 | 4/2022 |

* cited by examiner

VIBRATION DISTRIBUTION OF S0 MODE

VIBRATION DISTRIBUTION OF S1Z MODE

VIBRATION DISTRIBUTION OF S1X MODE

VIBRATION DISTRIBUTION OF S0 MODE

VIBRATION DISTRIBUTION OF S1Z MODE

VIBRATION DISTRIBUTION OF S1X MODE

VIBRATION DISTRIBUTION OF S0 MODE

VIBRATION DISTRIBUTION OF S1Z MODE

VIBRATION DISTRIBUTION OF S1X MODE

510

PIEZOELECTRIC RESONATOR

CROSS REFERENCE TO RELATED APPLICATIONS

The present application is a continuation of International application No. PCT/JP2024/014668, filed Apr. 11, 2024, which claims priority to Japanese Patent Application No. 2023-066681, filed Apr. 14, 2023, the entire contents of each of which are incorporated herein by reference.

TECHNICAL FIELD

The present invention relates to a piezoelectric resonator.

BACKGROUND ART

In various electronic devices such as mobile communication terminals, communication base stations, and home appliances, piezoelectric resonators are used for applications of timing devices, sensors, oscillators, and the like. The piezoelectric resonator includes a piezoelectric member having a pair of main surfaces, and a pair of excitation electrodes provided on the pair of main surfaces of the piezoelectric member.

For example, Patent Document 1 discloses a configuration that reduces spurious oscillations, which are vibrations occurring at frequencies other than the frequency of the main vibration, by flattening a shape of a vibration displacement while changing a mesa thickness ratio of an inverted mesa shape of the excitation electrodes.

Patent Document 1: International Publication No. WO 98/38736

SUMMARY OF THE INVENTION

However, it is desired to further reduce the spurious oscillation and improve an electromechanical coupling coefficient.

The present invention has been made in view of the above circumstances, and an object of the present invention is to provide a piezoelectric resonator capable of improving an electromechanical coupling coefficient.

According to an aspect of the present invention, there is provided a piezoelectric resonator including: a piezoelectric member and an excitation electrode that overlap with each other in a thickness direction, wherein the piezoelectric member has a high acoustic velocity region and a low acoustic velocity region in which an acoustic velocity is lower than an acoustic velocity in the high acoustic velocity region, in a plan view in the thickness direction, the high acoustic velocity region overlaps a center portion of the excitation electrode, and the low acoustic velocity region overlaps an end portion of the excitation electrode, the excitation electrode includes a plurality of holes in the high acoustic velocity region such that a mass per unit area of the high acoustic velocity region is smaller than a mass per unit area of the low acoustic velocity region, in a first direction intersecting the thickness direction, a dimension of a portion of the low acoustic velocity region that is adjacent to the high acoustic velocity region in the first direction is smaller than a dimension of the high acoustic velocity region in the first direction, and in the plan view in the thickness direction, an area of the low acoustic velocity region is smaller than an area of the high acoustic velocity region.

According to the present invention, it is possible to provide a piezoelectric resonator capable of improving an electromechanical coupling coefficient.

DETAILED DESCRIPTION OF THE PREFERRED EMBODIMENTS

Figure 1:
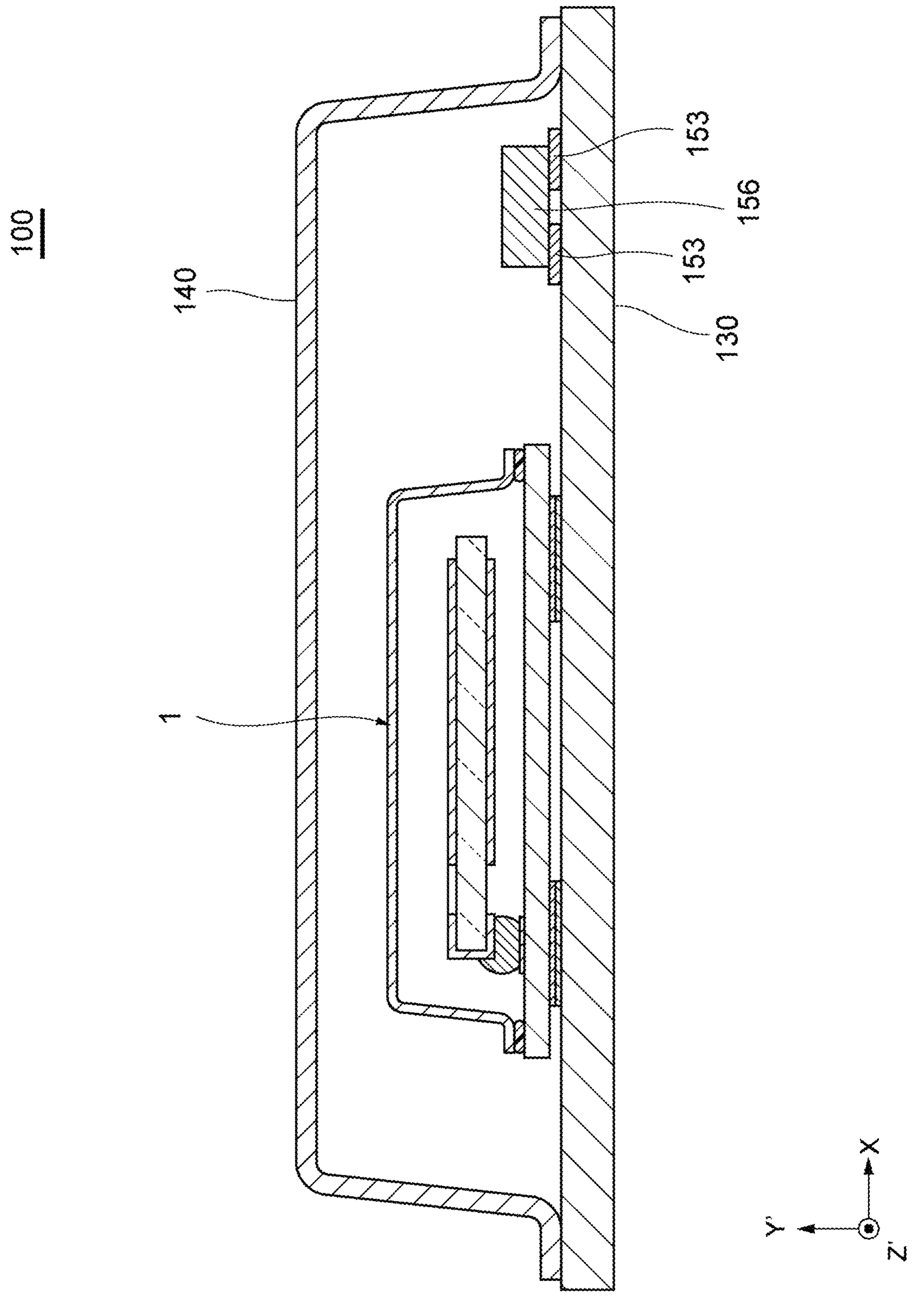
FIG. 1 is a cross-sectional view of a crystal oscillator according to a first embodiment.

Hereinafter, embodiments of the present invention will be described. In the following description of the drawings, the same or similar components are denoted by the same or similar reference numerals. The drawings are examples, and the dimension and shape of each portion are schematic. The technical scope of the present invention should not be interpreted as being limited to the embodiments.

Each drawing is attached with an orthogonal coordinate system including an X axis, a Y' axis, and a Z' axis for convenience, in order to clarify a mutual relationship between the respective drawings and to help understanding of a positional relationship between respective members. The X axis, the Y' axis, and the Z' axis correspond to each other in each drawing. The X axis, the Y' axis, and the Z' axis correspond to crystallographic axes of a quartz crystal element 11 to be described later. The X axis corresponds to an electric axis (polar axis) of the quartz crystal, the Y axis corresponds to a mechanical axis of the quartz crystal, and the Z axis corresponds to an optical axis of the quartz crystal. The Y' axis and the Z' axis are axes obtained by respectively rotating the Y axis and the Z axis around the X axis in a direction from the Y axis to the Z axis by 35° 15'±1'30".

In the following description, a direction parallel to the X axis is referred to as an "X axis direction", a direction parallel to the Y' axis is referred to as a "Y' axis direction", and a direction parallel to the Z' axis is referred to as a "Z' axis direction". In addition, a direction of a tip of an arrow on the X axis, the Y' axis, and the Z' axis is referred to as "positive" or "+ (plus)", and a direction opposite to the arrow is referred to as "negative" or "− (minus)". For convenience, the description is made assuming that the +Y' axis direction is the upward direction and the −Y' axis direction is the downward direction, but the vertical direction of a quartz crystal resonator 10, a quartz crystal resonator unit 1, and a crystal oscillator 100 is not limited. In addition, a plane specified by the X axis and the Z' axis is defined as a Z'X plane, and the same applies to a plane specified by other axes. The Y' axis direction corresponds to an example of a "thickness direction".

First Embodiment

First, a schematic configuration of a crystal oscillator 100 according to an embodiment will be described with reference to FIG. 1. FIG. 1 is a cross-sectional view of the crystal oscillator 100 according to a first embodiment.

In the following description, as a piezoelectric oscillator, a crystal oscillator (XO) including a quartz crystal resonator unit will be described as an example. In addition, as a piezoelectric resonator unit, a quartz crystal resonator unit including a quartz crystal resonator will be described as an example. In addition, as the piezoelectric resonator, a quartz crystal resonator including a quartz crystal element will be described as an example. The quartz crystal element is a type of a piezoelectric body (piezoelectric member) that vibrates according to an applied voltage. The piezoelectric resonator according to the embodiment of the present invention is not limited to the quartz crystal resonator, and may be an element using another piezoelectric body such as a ceramic material.

As illustrated in FIG. 1, a crystal oscillator 100 includes a quartz crystal resonator unit 1, a mounting substrate 130, a lid 140, and an electronic component 156.

The quartz crystal resonator unit 1 and the electronic component 156 are accommodated in a space formed between the mounting substrate 130 and the lid 140. The space formed by the mounting substrate 130 and the lid 140 is, for example, airtightly sealed. The space may be airtightly sealed in a vacuum state or may be airtightly sealed in a state of being filled with a gas such as an inert gas.

The mounting substrate 130 is a circuit substrate having a flat plate shape. The mounting substrate 130 includes, for example, a glass epoxy plate and a wiring layer patterned on the glass epoxy plate.

The quartz crystal resonator unit 1 is provided on one surface (an upper surface in FIG. 1) of the mounting substrate 130. More specifically, the quartz crystal resonator unit 1 is electrically coupled to the wiring layer of the mounting substrate 130 by solder 153.

The lid 140 includes a cavity with a bottom that is open on one side (a lower side in FIG. 1). In other words, the lid 140 includes a top wall portion having a flat plate shape, side wall portions that extend from an outer edge of the top wall portion toward the mounting substrate 130, and flange portions that extend from tips of the side wall portions to outer side portions. The flange portion is bonded to one surface (the upper surface in FIG. 1) of the mounting substrate 130. Thereby, the quartz crystal resonator unit 1 bonded to the mounting substrate 130 is accommodated in the lid 140. The lid 140 is formed of a metal material, and is formed, for example, by drawing a metal plate.

The electronic component 156 is provided on one surface (the upper surface in FIG. 1) of the mounting substrate 130. More specifically, the wiring layer of the mounting substrate 130 and the electronic component 156 are bonded by the solder 153. Thereby, the electronic component 156 is mounted on the mounting substrate 130.

The electronic component 156 is electrically coupled to the quartz crystal resonator unit 1 via the wiring layer of the mounting substrate 130. The electronic component 156 includes, for example, a capacitor, an IC chip, and the like. The electronic component 156 is, for example, a part of an oscillation circuit that oscillates the quartz crystal resonator unit 1, a part of a temperature compensation circuit that compensates for the temperature characteristics of the quartz crystal resonator unit 1, or the like. In a case where the electronic component 156 includes the temperature compensation circuit, the crystal oscillator 100 corresponds to an example of a temperature compensated crystal oscillator (TCXO). The crystal oscillator 100 may correspond to an example of a voltage controlled crystal oscillator (VCXO) or may correspond to an example of an oven controlled crystal oscillator (OCXO).

Figure 2:
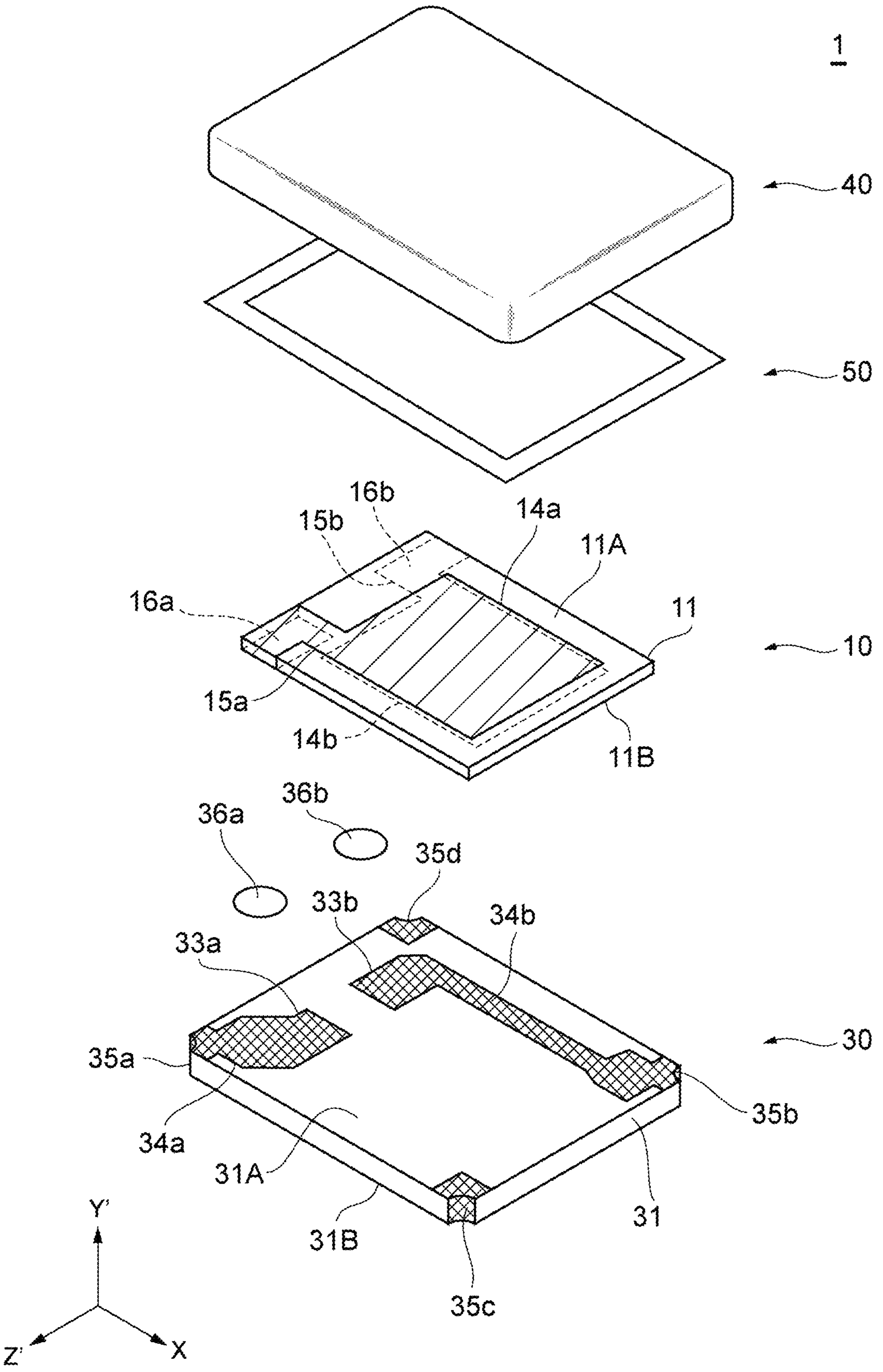
FIG. 2 is an exploded perspective view of a quartz crystal resonator unit according to the first embodiment.
Figure 3:
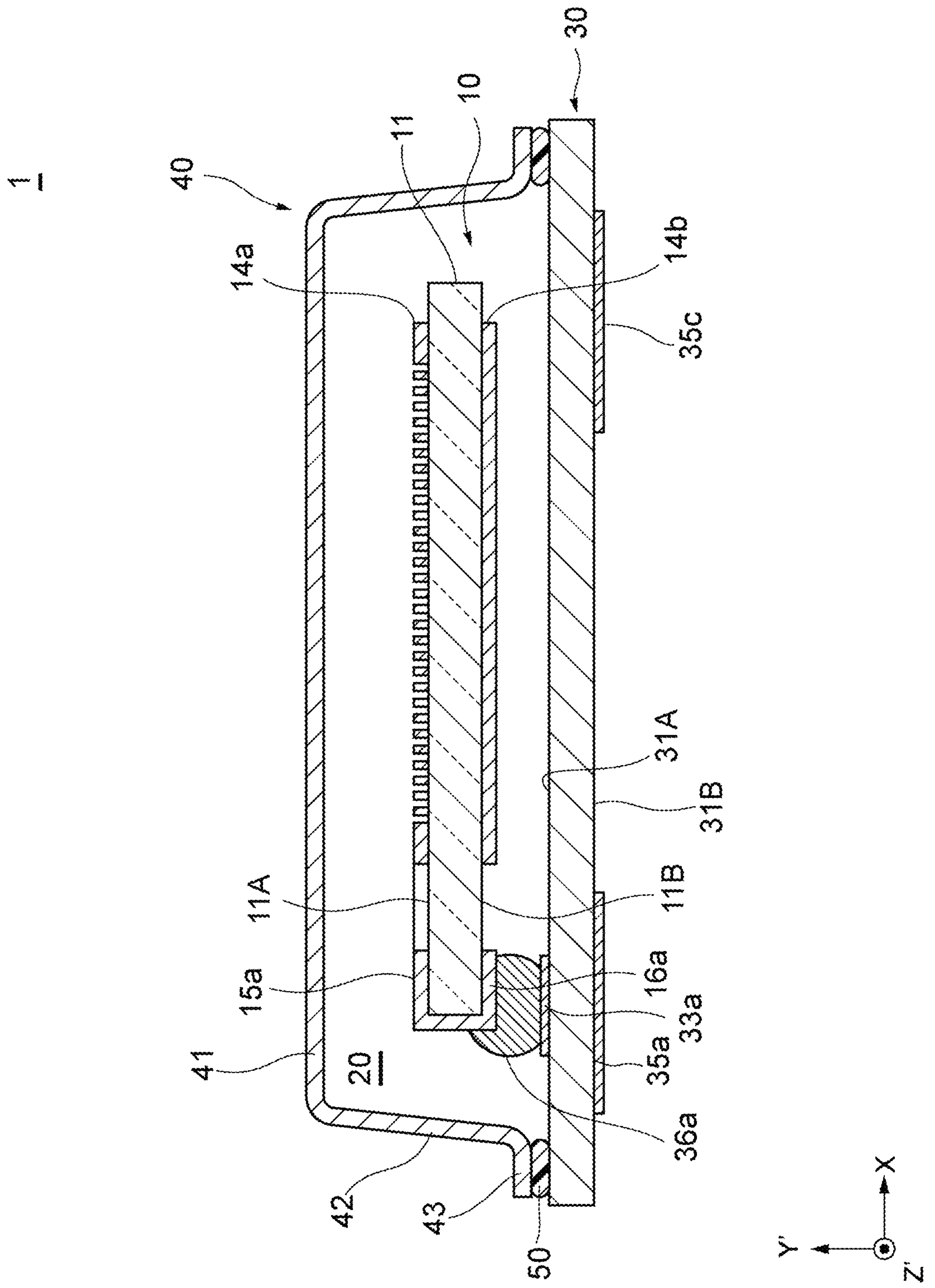
FIG. 3 is a cross-sectional view of the quartz crystal resonator unit according to the first embodiment.

Next, a configuration of the quartz crystal resonator unit 1 according to the first embodiment will be described with reference to FIG. 2 and FIG. 3. FIG. 2 is an exploded perspective view of the quartz crystal resonator unit according to the first embodiment. FIG. 3 is a cross-sectional view of the quartz crystal resonator unit according to the first embodiment.

The quartz crystal resonator unit 1 includes a quartz crystal resonator 10, a base member 30, a lid member 40, and a bonding portion 50.

The quartz crystal resonator 10 is an electromechanical energy conversion element that mutually converts electric energy and mechanical energy by a piezoelectric effect. A frequency of a main mode of the quartz crystal resonator 10 is, for example, approximately 0.8 GHz to 2.0 GHz, and for example, approximately 0.95 GHz. A frequency of an inharmonic mode of the quartz crystal resonator 10 is, for example, within a range of approximately 1% of the frequency of the main mode. The quartz crystal resonator 10 includes a flaky quartz crystal element 11, a first excitation electrode 14*a* and a second excitation electrode 14*b* which are included in a pair of excitation electrodes, a first extended electrode 15*a* and a second extended electrode 15*b* which are included in a pair of extended electrodes, and a first connection electrode 16*a* and a second connection electrode 16*b* which are included in a pair of connection electrodes.

The quartz crystal element 11 has an upper surface 11A and a lower surface 11B that face each other. The upper surface 11A is located on a side facing the top wall portion 41 of the lid member 40. The lower surface 11B is located on a side facing the base member 30. The upper surface 11A and the lower surface 11B correspond to a pair of main surfaces of the quartz crystal element 11.

The quartz crystal element 11 is, for example, an AT-cut quartz crystal. The AT-cut quartz crystal is formed such that the XZ' plane is the main surface and the thickness is in a direction parallel to the Y' axis. As an example, when the upper surface 11A is viewed in plan view in the thickness direction (hereinafter, simply referred to as a "plan view"), a shape of the quartz crystal element 11 (hereinafter, referred to as a "planar shape") is a square shape having a pair of extending sides in the Z' axis direction and a pair of sides extending in the X axis direction. Further, the quartz crystal element 11 has a thickness in the Y' axis direction. As an example, the shape of the quartz crystal element 11 is a flat plate shape having a uniform thickness.

The planar shape of the quartz crystal element is not limited to the shape described above. For example, the planar shape of the quartz crystal element may be a rectangular shape having a long side extending in the Z' axis direction and a short side extending in the X axis direction, and may be a rectangular shape having a short side extending in the Z' axis direction and a long side extending in the X axis direction. The planar shape of the quartz crystal element may be a polygonal shape, a circular shape, an elliptical shape, or a shape obtained by combining these shapes. Further, the quartz crystal element is not limited to a flat plate shape. The quartz crystal element may have a mesa type structure or an inverted mesa type structure having unevenness on at least one of the upper surface 11A or the lower surface 11B. The quartz crystal element may have a convex type structure in which an amount of a change in the thickness changes continuously, or may have a bevel type structure in which an amount of a change in the thickness changes discontinuously.

The AT-cut quartz crystal element 11 is obtained by being cut out using the XZ' plane as a main surface when axes obtained by respectively rotating the Y axis and the Z axis, among the X axis, the Y axis, and the Z axis which are crystallographic axes of a synthetic quartz crystal, by 35° 15'±1' 30" around the X axis in the direction from the Y axis to the Z axis are set as the Y' axis and the Z' axis.

The quartz crystal resonator 10 using the AT-cut quartz crystal element 11 has high frequency stability in a wide temperature range. Further, the AT-cut quartz crystal resonator also has excellent aging characteristics, and can be manufactured at low cost. Further, the AT-cut quartz crystal resonator uses a thickness shear vibration mode as a main vibration.

The cut-angles of the quartz crystal element are not limited to the angles described above. The rotation angles of the Y' axis and the Z' axis in the AT-cut quartz crystal element 11 may be tilted in a range of −5° to +15° from 35° 15'. In addition, as the cut-angles of the quartz crystal element, a different cut other than the AT cut, for example, a BT cut, a GT cut, an SC cut, or the like may be applied.

The first excitation electrode 14*a* and the second excitation electrode 14*b* apply an alternating voltage to the quartz crystal element 11 to excite the quartz crystal element 11. The first excitation electrode 14*a* and the second excitation electrode 14*b* are provided at the center portion of the quartz crystal element 11 in plan view. The first excitation electrode 14*a* is provided on the upper surface 11A, and the second excitation electrode 14*b* is provided on the lower surface 11B. The first excitation electrode 14*a* and the second excitation electrode 14*b* face each other in the Y' axis direction with the quartz crystal element 11 interposed therebetween. The first excitation electrode 14*a* corresponds to an example of an "excitation electrode".

A planar shape of the first excitation electrode 14 is a rectangular shape having a short side extending in the Z' axis direction and a long side extending in the X axis direction. Further, the first excitation electrode 14*a* has a thickness in the Y' axis direction. The second excitation electrode 14*b* also has the same shape.

The planar shapes of the first excitation electrode and the second excitation electrode are not limited to the shape described above. The planar shapes of the first excitation electrode and the second excitation electrode may be a rectangular shape having a short side extending in the X axis direction. In addition, the planar shapes of the first excitation electrode and the second excitation electrode may be a square shape, a polygonal shape, a circular shape, an elliptical shape, or a combination thereof.

The first extended electrode 15*a* electrically couples the first excitation electrode 14*a* and the first connection electrode 16*a*, and the second extended electrode 15*b* electrically couples the second excitation electrode 14*b* and the second connection electrode 16*b*. The first extended electrode 15*a* is provided from the upper surface 11A to the lower surface 11B of the quartz crystal element 11, and the second extended electrode 15*b* is provided on the lower surface 11B of the quartz crystal element 11.

The first connection electrode 16*a* and the second connection electrode 16*b* electrically couple the quartz crystal resonator 10 to the base member 30. The first connection electrode 16*a* and the second connection electrode 16*b* are provided on the lower surface 11B of the quartz crystal element 11.

The first excitation electrode 14*a*, the first extended electrode 15*a*, and the first connection electrode 16*a* are integrally provided. The same applies to the second excitation electrode 14*b*, the second extended electrode 15*b*, and the second connection electrode 16*b*. The electrodes of the quartz crystal resonator 10 have, for example, a multi-layer structure provided by laminating a base layer and a surface layer in this order. For example, the base layer is a chromium (Cr) layer having good adhesion to the quartz crystal element 11, and the surface layer is a gold (Au) layer having good chemical stability. The electrode of the quartz crystal resonator 10 may contain silver (Ag), copper (Cu), palladium (Pd), platinum (Pt), titanium (Ti), nickel (Ni), aluminum (Al), molybdenum (Mo), tungsten (W), or an alloy containing at least one of the materials. The electrodes of the quartz crystal resonator 10 may have a single layer structure.

The base member 30 holds the quartz crystal resonator 10 such that the quartz crystal resonator 10 can be excited. The base member 30 includes a base 31, connection electrodes 33*a* and 33*b*, extended electrodes 34*a* and 34*b*, outer electrodes 35*a*, 35*b*, 35*c*, and 35*d*, and conductive holding members 36*a* and 36*b*.

The base 31 is a plate-shaped insulator having an upper surface 31A and a lower surface 31B that face each other in the thickness direction. The upper surface 31A and the lower surface 31B correspond to a pair of main surfaces of the base 31. The upper surface 31A is located on a side facing the quartz crystal resonator 10 and the lid member 40, and corresponds to a mounting surface on which the quartz crystal resonator 10 is mounted. From the viewpoint of preventing a thermal stress acting on the quartz crystal resonator 10 from the base 31 due to thermal history such as reflow, preferably, the base 31 is formed of a heat-resistant material. From the same viewpoint, the base 31 may be formed of a material having a thermal expansion coefficient close to that of the quartz crystal element 11. The base 31 is formed of, for example, a ceramic substrate, a glass substrate, or a quartz crystal substrate.

A corner portion of the base 31 has a notched side surface of which a part is formed in a cylindrically curved surface shape (also referred to as a castellation shape). The shape of the corner portion of the base 31 is not limited thereto. The corner portion of the base may have a notched side surface formed in a prism shape, or may be a substantially-right-angled corner portion without a notch.

The connection electrodes 33*a* and 33*b* are electrically coupled to the quartz crystal resonator 10. The connection electrode 33*a* is electrically coupled to the connection electrode 16*a* of the quartz crystal resonator 10, and the connection electrode 33*b* is electrically coupled to the connection electrode 16*b* of the quartz crystal resonator 10.

The extended electrode 34*a* electrically couples the connection electrode 33*a* and the outer electrode 35*a*, and the extended electrode 34*b* electrically couples the connection electrode 33*b* and the outer electrode 35*b*. The extended electrodes 34*a* and 34*b* are provided on the upper surface 31A of the base 31.

The outer electrodes 35*a* and 35*b* are outer terminals for electrically coupling the quartz crystal resonator 10 to an outer substrate. The outer electrode 35*a* electrically couples the first excitation electrode 14*a* of the quartz crystal resonator 10 to the mounting substrate 130, and the outer electrode 35*b* electrically couples the second excitation electrode 14*b* of the quartz crystal resonator 10 to the mounting substrate 130. One electrode of the outer electrodes 35*c* and 35*d* is a ground electrode that grounds the lid member 40, and the other electrode of the outer electrodes 35*c* and 35*d* is a dummy electrode that is not electrically coupled to the quartz crystal resonator 10 and the lid member 40. Each of the outer electrodes 35*a*, 35*b*, 35*c*, and 35*d* is continuously provided from the notched side surfaces provided at the four corner portions of the base 31 to the lower surface 31B. In the example illustrated in FIG. 2, the outer electrode 35*a* and the outer electrode 35*b* are located at a diagonal angle on the upper surface 31A of the base 31, and the outer electrode 35*c* and the outer electrode 35*d* are located at another diagonal angle on the upper surface 31A of the base 31. Here, the outer electrodes 35*a*, 35*b*, 35*c*, and 35*d* are not limited thereto. Both the outer electrodes 35*c* and 35*d* may be ground electrodes, or may be dummy electrodes. The outer electrodes 35*c* and 35*d* may be omitted. The outer electrode 35*c* may be electrically coupled to one of the outer electrodes 35*a* and 35*b*, and the outer electrode 35*d* may be electrically coupled to the other of the outer electrodes 35*a* and 35*b*.

The conductive holding members 36*a* and 36*b* electrically couple the base member 30 and the quartz crystal resonator 10, and mechanically hold the quartz crystal resonator 10. The conductive holding member 36*a* electrically couples the first connection electrode 16*a* of the quartz crystal resonator 10 to the connection electrode 33*a* of the base member 30. The conductive holding member 36*b* electrically couples the second connection electrode 16*b* of the quartz crystal resonator 10 to the connection electrode 33*b* of the base member 30. The conductive holding members 36*a* and 36*b* are cured products of a conductive adhesive including a thermosetting resin, a photocurable resin, or the like. The main component of the conductive holding members 36*a* and 36*b* is, for example, a silicone resin. The conductive holding members 36*a* and 36*b* include conductive particles, and as the conductive particles, for example, metal particles including silver (Ag) are used.

The main component of the conductive holding members 36*a* and 36*b* is not limited to a silicone resin, and may be, for example, an epoxy resin or an acrylic resin. In addition, the conductive particles included in the conductive holding members 36*a* and 36*b* are not limited to silver particles, and may be formed of other metals, conductive ceramics, conductive organic materials, and the like. The conductive holding members 36*a* and 36*b* may include a conductive polymer.

The lid member 40 forms an internal space 20 in which the quartz crystal resonator 10 is accommodated between the lid member 40 and the base member 30. The lid member 40 includes a top wall portion 41, side wall portions 42 that extend from an outer edge portion of the top wall portion 41 toward the base member 30, and flange portions 43 that extend from the tip of the mounting substrate 130 to outer side portions. The top wall portion 41 faces the base member 30 with the quartz crystal resonator 10 interposed therebetween in the Y' axis direction. The side wall portions 42 surround the quartz crystal resonator 10 at an interval in the XZ' plane direction. The flange portions 43 are provided in a frame shape in plan view, and are provided to be closest to the base member 30 among the portions of the lid member 40. A material of the lid member 40 is desirably a conductive material, and more desirably a metal material having high airtightness. Since the lid member 40 is formed of a conductive material, the lid member 40 has an electromagnetic shield function of reducing electromagnetic waves entering and exiting the internal space 20. From the viewpoint of preventing generation of a thermal stress, desirably, the material of the lid member 40 is a material having a thermal expansion coefficient close to that of the base member 30, and is, for example, an Fe—Ni—Co alloy of which the thermal expansion coefficient near the room temperature matches that of glass or ceramic over a wide temperature range. The lid member 40 is electrically coupled to at least one of the outer electrodes 35*c* and 35*d* by a ground member (not illustrated).

The bonding portion 50 bonds the base member 30 and the lid member 40 to seal the internal space 20. The bonding portion 50 is provided in a frame shape along the entire periphery of the flange portion 43 on the base member 30, and is sandwiched between the lower surface of the flange portion 43 of the lid member 40 and the upper surface 31A of the base member 30. The bonding portion 50 is formed of an insulating material. The bonding portion 50 is formed of, for example, an organic adhesive including an epoxy-based resin, a vinyl-based resin, an acrylic-based resin, a urethane-based resin, or a silicone resin. The material of the bonding portion 50 is not limited to an organic adhesive, and the bonding portion 50 may be formed of an inorganic adhesive such as a silicon-based adhesive including water glass or a calcium-based adhesive including cement. The material of the bonding portion 50 may be glass having a low melting point (for example, lead-boric-acid-based glass, tin-phosphate-based glass, or the like).

Figure 4:
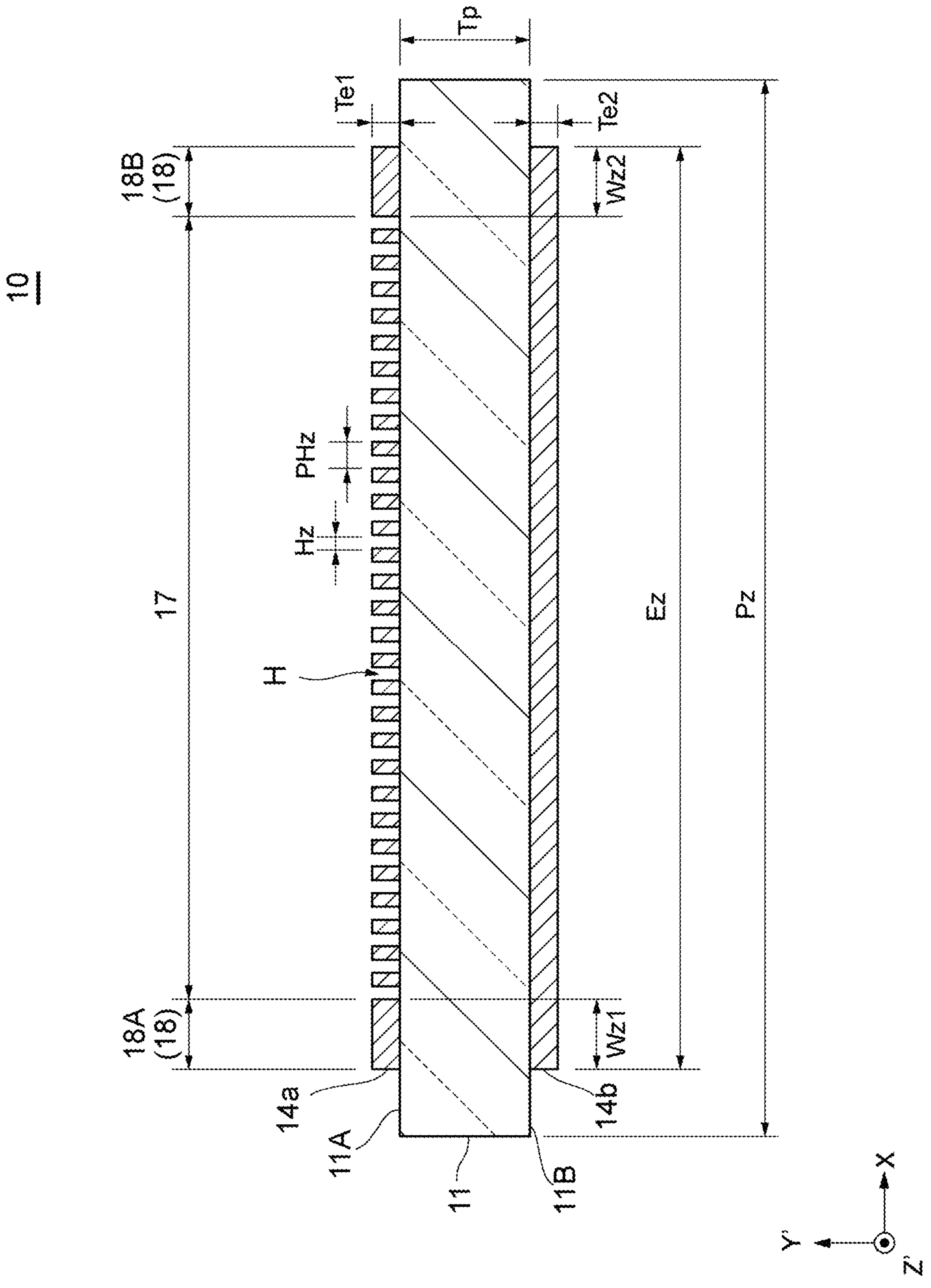
FIG. 4 is a cross-sectional view of a quartz crystal resonator according to the first embodiment.
Figure 5:
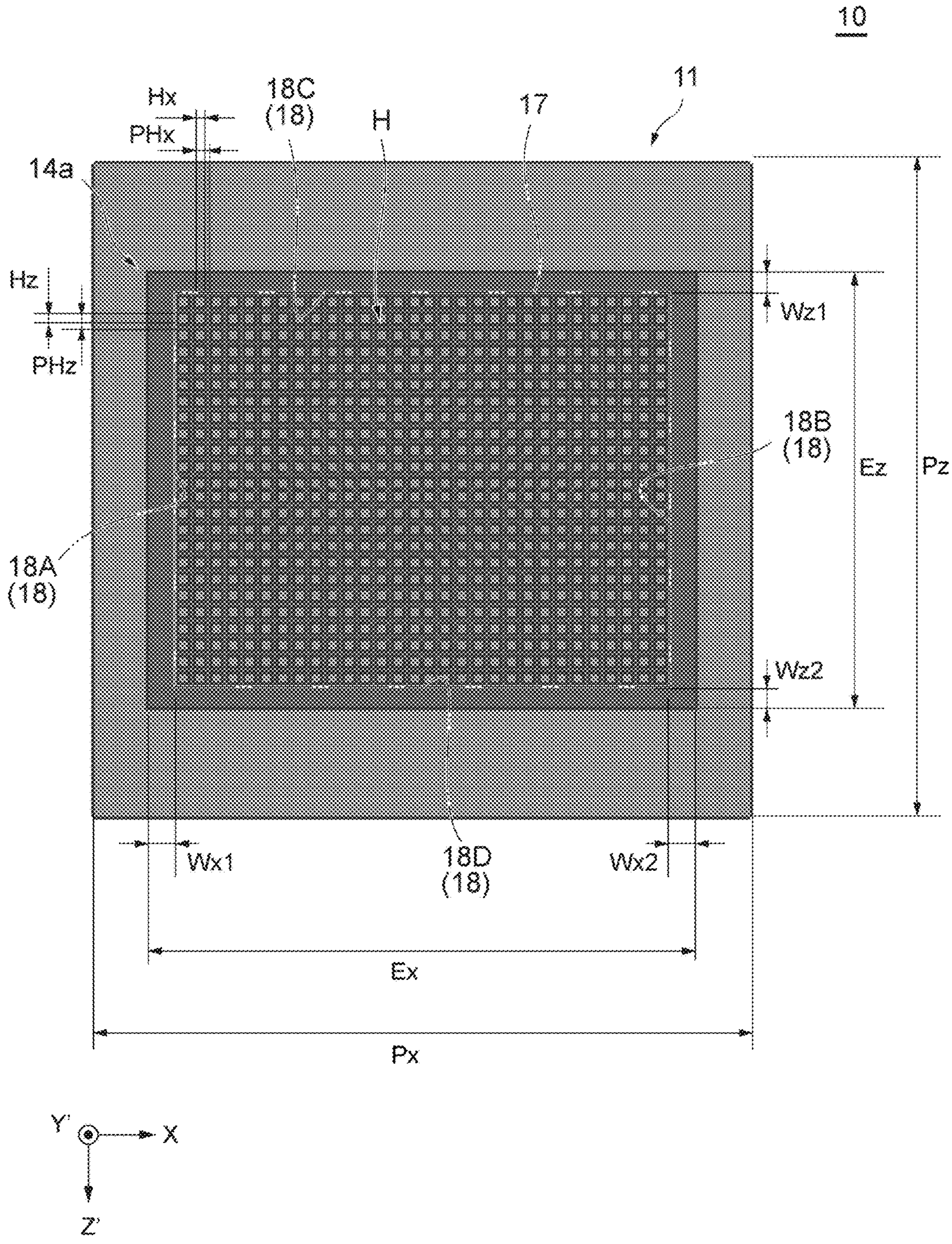
FIG. 5 is a plan view of the quartz crystal resonator according to the first embodiment.

Next, the configuration of the quartz crystal resonator 10 according to the first embodiment will be described with reference to FIG. 4 and FIG. 5. FIG. 4 is a cross-sectional view of the quartz crystal resonator 10 according to the first embodiment. FIG. 5 is a plan view of the quartz crystal resonator 10 according to the first embodiment. For simplification of the description, in FIG. 4 and FIG. 5, the first extended electrode 15*a*, the second extended electrode 15*b*, the first connection electrode 16*a*, and the second connection electrode 16*b* are omitted.

The quartz crystal resonator 10 has a high acoustic velocity region 17 and low acoustic velocity regions 18 in a region overlapping the first excitation electrode 14*a* in plan view. The high acoustic velocity region 17 is a region having a high acoustic velocity in an excited region in which the quartz crystal element 11 is excited by the first excitation electrode 14*a* and the second excitation electrode 14*b*. The low acoustic velocity region 18 is a region having a low acoustic velocity in the excited region. That is, the acoustic velocity of the low acoustic velocity region 18 is lower than the acoustic velocity of the high acoustic velocity region 17.

As illustrated in FIG. 4, the thickness of the quartz crystal element 11 in the high acoustic velocity region 17 is the same as the thickness of the quartz crystal element 11 in the low acoustic velocity region 18. In addition, the thickness of the second excitation electrode 14*b* in the high acoustic velocity region 17 is the same as the thickness of the second excitation electrode 14*b* in the low acoustic velocity region 18. That is, mass per unit area of the quartz crystal element 11 and the second excitation electrode 14*b* in the high acoustic velocity region 17 (hereinafter, simply referred to as "mass") is the same as mass of the quartz crystal element 11 and the second excitation electrode 14*b* in the low acoustic velocity region 18.

A plurality of holes H are formed on the first excitation electrode 14*a* in the high acoustic velocity region 17. The hole His a through hole that penetrates the first excitation electrode 14*a* in the Y' axis direction. Here, the hole is not limited to the through hole, and the hole may be a groove shape with a bottom that is open in the Y' axis direction. The plurality of holes H are provided such that the mass of the high acoustic velocity region 17 is smaller than the mass of the low acoustic velocity region 18. The acoustic velocity in the high acoustic velocity region 17 is higher than the acoustic velocity in the low acoustic velocity region 18 due to the mass difference caused by the plurality of holes H.

As illustrated in FIG. 5, the high acoustic velocity region 17 is provided in a region that overlaps the center portion of the first excitation electrode 14*a* in plan view. The planar shape of the high acoustic velocity region 17 is a rectangular shape having a long side extending along the X axis direction and a short side extending along the Z' axis direction.

The planar shape of the high acoustic velocity region is not limited to the shape described above. The planar shape of the high acoustic velocity region may be a rectangular shape having a short side extending along the X axis direction and a long side extending along the Z' axis direction. Further, the planar shape of the high acoustic velocity region may be a square shape, a polygonal shape, a circular shape, an elliptical shape, or a combination thereof.

As illustrated in FIG. 5, the low acoustic velocity region 18 is provided in a region that overlaps the end portion of the first excitation electrode 14*a* in plan view. The low acoustic velocity region 18 is provided in a rectangular frame shape that is continuous in the circumferential direction surrounding the center portion of the first excitation electrode 14*a*.

The planar shape of the low acoustic velocity region is not limited to a rectangular frame shape that is continuous in the circumferential direction. The planar shape of the low acoustic velocity region may be a frame shape extending along an outline of a polygonal shape, a circular shape, an elliptical shape, or a shape obtained by combining these shapes. Further, the low acoustic velocity region may have a frame shape that is discontinuous in the circumferential direction. For example, the low acoustic velocity region may have a rail shape, a horseshoe shape, or the like.

The low acoustic velocity regions 18 include a first low acoustic velocity region 18A, a second low acoustic velocity region 18B, a third low acoustic velocity region 18C, and a fourth low acoustic velocity region 18D.

The first low acoustic velocity region 18A is adjacent to the high acoustic velocity region 17 in the negative X axis direction, and extends along the Z' axis direction. The second low acoustic velocity region 18B is adjacent to the high acoustic velocity region 17 in the positive X axis direction, and extends along the Z' axis direction. The third low acoustic velocity region 18C is adjacent to the high acoustic velocity region 17 in the negative Z' axis direction, and extends along the X axis direction. The fourth low acoustic velocity region 18D is adjacent to the high acoustic velocity region 17 in the positive Z' axis direction, and extends along the X axis direction. An end portion of the first low acoustic velocity region 18A in the negative Z' axis direction is connected to an end portion of the third low acoustic velocity region 18C in the negative X axis direction, and an end portion of the first low acoustic velocity region 18A in the positive Z' axis direction is connected to an end portion of the fourth low acoustic velocity region 18D in the negative X axis direction. An end portion of the second low acoustic velocity region 18B in the negative Z' axis direction is connected to an end portion of the third low acoustic velocity region 18C in the positive X axis direction, and an end portion of the second low acoustic velocity region 18B in the positive Z' axis direction is connected to an end portion of the fourth low acoustic velocity region 18D in the positive X axis direction.

In plan view, the end portion of the first low acoustic velocity region 18A in the negative Z' axis direction overlaps the end portion of the third low acoustic velocity region 18C in the negative X axis direction, and the end portion of the first low acoustic velocity region 18A in the positive Z' axis direction overlaps the end portion of the fourth low acoustic velocity region 18D in the negative X axis direction. The end portion of the second low acoustic velocity region 18B in the negative Z' axis direction overlaps the end portion of the third low acoustic velocity region 18C in the positive X axis direction, and the end portion of the second low acoustic velocity region 18B in the positive Z' axis direction overlaps the end portion of the fourth low acoustic velocity region 18D in the positive X axis direction.

The configuration of the low acoustic velocity region is not limited to the configuration described above. The third low acoustic velocity region and the fourth low acoustic velocity region may be omitted. That is, the high acoustic velocity region, the first low acoustic velocity region, and the second low acoustic velocity region may extend in parallel along the Z' axis direction, and may be provided in a band shape in plan view from the end portion of the first excitation electrode in the negative Z' axis direction to the end portion of the first excitation electrode in the positive Z' axis direction. Further, the first low acoustic velocity region and the second low acoustic velocity region may be omitted. That is, the high acoustic velocity region, the third low acoustic velocity region, and the fourth low acoustic velocity region may extend in parallel along the X axis direction, and may be provided in a band shape in plan view from the end portion of the first excitation electrode in the negative X axis direction to the end portion of the first excitation electrode in the positive X axis direction. Further, the end portion of the first low acoustic velocity region in the negative Z' axis direction may be separated from the third low acoustic velocity region, and the end portion of the first low acoustic velocity region in the positive Z' axis direction may be separated from the fourth low acoustic velocity region. The end portion of the second low acoustic velocity region in the negative Z' axis direction may be separated from the third low acoustic velocity region, and the end portion of the second low acoustic velocity region in the positive Z' axis direction may be separated from the fourth low acoustic velocity region.

As illustrated in FIG. 4 and FIG. 5, a dimension of the quartz crystal element 11 along the Y' axis direction is defined as a thickness Tp. A dimension of the first excitation electrode 14*a* along the Y' axis direction in the high acoustic velocity region 17 is defined as a thickness Te1. A dimension of the second excitation electrode 14*b* along the Y' axis direction is defined as a thickness Te2. A dimension of the quartz crystal element 11 along the X axis direction is defined as a length Px, and a dimension of the quartz crystal element 11 along the Z' axis direction is defined as a length Pz. A dimension of the first excitation electrode 14*a* along the X axis direction is defined as a length Ex, and a dimension of the first excitation electrode 14*a* along the Z' axis direction is defined as a length Ez. A dimension of the first low acoustic velocity region 18A along the X axis direction is defined as a length Wx1. A dimension of the second low acoustic velocity region 18B along the X axis direction is defined as a length Wx2. A dimension of the third low acoustic velocity region 18C along the Z' axis direction is defined as a length Wz1. A dimension of the fourth low acoustic velocity region 18D along the Z' axis direction is defined as a length Wz2.

As illustrated in FIG. 5, in a case where the first low acoustic velocity region 18A has a pair of end portions parallel to the Z' axis direction in plan view, the length Wx1 is specified by measuring a distance in the X axis direction between the pair of end portions of the first low acoustic velocity region 18A parallel to the Z' axis direction. In the pair of end portions of the first low acoustic velocity region 18A parallel to the Z' axis direction, one end portion is a boundary portion between the high acoustic velocity region 17 and the first low acoustic velocity region 18A, and the other end portion is an outer edge portion of the first excitation electrode 14*a* in the negative X axis direction.

Similarly, the length Wx2 is specified by measuring a distance in the X axis direction between the pair of end portions of the second low acoustic velocity region 18B parallel to the Z' axis direction. In the pair of end portions of the second low acoustic velocity region 18B parallel to the Z' axis direction, one end portion is a boundary portion between the high acoustic velocity region 17 and the second low acoustic velocity region 18B, and the other end portion is an outer edge portion of the first excitation electrode 14*a* in the positive X axis direction.

Similarly, the length Wz1 is specified by measuring a distance in the Z' axis direction between the pair of end portions of the third low acoustic velocity region 18C parallel to the X axis direction. In the pair of end portions of the third low acoustic velocity region 18C parallel to the X axis direction, one end portion is a boundary portion between the high acoustic velocity region 17 and the third low acoustic velocity region 18C, and the other end portion is an outer edge portion of the first excitation electrode 14*a* in the negative Z' axis direction.

Similarly, the length Wz2 is specified by measuring a distance in the Z' axis direction between the pair of end portions of the fourth low acoustic velocity region 18D parallel to the X axis direction. In the pair of end portions of the fourth low acoustic velocity region 18D parallel to the X axis direction, one end portion is a boundary portion between the high acoustic velocity region 17 and the fourth low acoustic velocity region 18D, and the other end portion is an outer edge portion of the first excitation electrode 14*a* in the positive Z' axis direction.

Here, in a case where the planar shape of the high acoustic velocity region 17 is a polygonal shape, a circular shape, an elliptical shape, or a combination thereof, or in a case where the planar shape of the first excitation electrode 14*a* is a polygonal shape, a circular shape, an elliptical shape, or a combination thereof, when the first low acoustic velocity region 18A does not have a pair of end portions parallel to the Z' axis direction in plan view, the length Wx1 is specified by a method other than the method described above. For example, the length Wx1 may be specified by dividing an area of the first low acoustic velocity region 18A in plan view by the dimension of the first low acoustic velocity region 18A in the Z' axis direction. In addition, the length Wx1 may be specified by measuring a plurality of dimensions of the first low acoustic velocity region 18A in the X axis direction at a plurality of positions in the Z' axis direction and calculating an average value of the plurality of dimensions. In a case of measuring a plurality of dimensions in the X axis direction, the measurement positions of the dimensions in the X axis direction may be determined, for example, at equal intervals in the Z' axis direction, or may be arbitrarily determined. In addition, the number of the measurement positions of the dimensions in the X axis direction may be arbitrarily determined. When calculating the average value of the plurality of dimensions in the X axis direction, an average value of the remaining dimensions in a case where it is assumed that at least one of a maximum value or a minimum value is excluded may be calculated. The lengths Wx2, Wz1, and Wz2 may be specified in the same manner as the length Wx1.

As described above, the thickness Tp of the quartz crystal element 11 is the same in the high acoustic velocity region 17 and the low acoustic velocity region 18. Similarly, the thickness Te2 of the second excitation electrode 14*b* is the same in the high acoustic velocity region 17 and the low acoustic velocity region 18. The thickness Te1 of the first excitation electrode 14*a* is the same in the high acoustic velocity region 17 and the low acoustic velocity region 18. In other words, the thickness Te1 of the first excitation electrode 14*a* in the low acoustic velocity region 18 is the same as the thickness Te1 of the first excitation electrode 14*a* in the high acoustic velocity region 17 in a case where it is assumed that the plurality of holes H are excluded. The thickness Te1 is a minimum value, a minimum value, or an average value of the thickness of the first excitation electrode 14*a*. The thickness of the first excitation electrode 14*a* in the low acoustic velocity region 18 is a minimum value, a minimum value, or an average value of the thickness of the first excitation electrode 14*a* in the low acoustic velocity region 18. The thickness of the first excitation electrode 14*a* in the high acoustic velocity region 17 in a case where it is assumed that the plurality of holes H are excluded is a minimum value, a minimum value, or an average value of the thickness of the first excitation electrode 14*a* in the high acoustic velocity region 17 in a case where it is assumed that the plurality of holes H are excluded. Similarly, the thickness Tp is a minimum value, a minimum value, or an average value of the thickness of the quartz crystal element 11, and the thickness Te2 is a minimum value, a minimum value, or an average value of the thickness of the second excitation electrode 14*b*.

The thickness of the first excitation electrode may be different between the high acoustic velocity region and the low acoustic velocity region. For example, the thickness of the first excitation electrode in the low acoustic velocity region may be thicker than the thickness of the first excitation electrode in the high acoustic velocity region. In this case, the thickness of the first excitation electrode may be discontinuously changed in a stepwise manner at a boundary between the high acoustic velocity region and the low acoustic velocity region. That is, the first excitation electrode may have an inverted mesa type structure. In addition, the first excitation electrode may have a bevel type structure or a convex type structure in which the thickness continuously changes at a boundary between the high acoustic velocity region and the low acoustic velocity region. The second excitation electrode is not limited to having a flat plate shape having a uniform thickness, and may have a mesa type structure, a bevel type structure, or a convex type structure.

In a case where sub holes to be described later are provided on the first excitation electrode in the low acoustic velocity region, the thickness of the first excitation electrode in the low acoustic velocity region is a minimum value, a minimum value, or an average value of the thickness of the first excitation electrode in the low acoustic velocity region in a case where it is assumed that a plurality of sub holes are excluded.

In the example illustrated in FIG. 5, the length Wx1 of the first low acoustic velocity region 18A in the X axis direction is substantially equal to the length Wx2 of the second low acoustic velocity region 18B in the X axis direction ($Wx1 \approx Wx2$). A sum of the length Wx1 and the length Wx2 is smaller than a length $Ex-(Wx1+Wx2)$ of the high acoustic velocity region 17 in the X axis direction ($Wx1+Wx2<Ex-(Wx1+Wx2)$). That is, for the sum of the length Wx1 and the length Wx2, a relationship of $(Wx1+Wx2)/Ex<0.5$ is established. Desirably, a relationship of $(Wx1+Wx2)/Ex \le 0.29$ is established.

In addition, for each of the length Wx1 and the length Wx2, a relationship of $2 \times Wx1<Ex-(Wx1+Wx2)$ and $2 \times Wx2<Ex-(Wx1+Wx2)$ is established. Desirably, a relationship of $0<Wx1/Ex \le 0.10$ and $0<Wx2/Ex \le 0.10$ is established. More desirably, a relationship of $0<Wx1/Ex \le 0.07$ and $0<Wx2/Ex \le 0.07$ is established.

In a case where the above-described relationship is established, a relationship is not limited to a case where a relationship of $Wx1=Wx2$ is established, and a relationship of $Wx1 \neq Wx2$ may be established. Here, in order to achieve a good balance between a mechanical strength, a vibration distribution, and the like, desirably, a relationship of $Wx1=Wx2$ is established.

Similarly, the length Wz1 of the third low acoustic velocity region 18C in the Z' axis direction is substantially equal to the length Wz2 of the fourth low acoustic velocity region 18D in the Z' axis direction ($Wz1 \approx Wz2$). A sum of the length Wz1 and the length Wz2 is smaller than a length $Ez-(Wz1+Wz2)$ of the high acoustic velocity region 17 in the Z' axis direction ($Wz1+Wz2<Ez-(Wz1+Wz2)$). That is, for the sum of the length Wz1 and the length Wz2, a relationship of $(Wz1+Wz2)/Ez<0.5$ is established. Desirably, a relationship of $(Wx1+Wx2)/Ez \le 0.29$ is established.

In addition, for each of the length Wz1 and the length Wz2, a relationship of $2 \times Wz1<Ez-(Wz1+Wz2)$ and $2 \times Wz2<Ez-(Wz1+Wz2)$ is established. Desirably, a relationship of $0<Wz1/Ez \le 0.10$ and $0<Wz2/Ez \le 0.10$ is established. More desirably, a relationship of $0<Wz1/Ez \le 0.08$ and $0<Wz2/Ez \le 0.08$ is established.

In a case where the above-described relationship is established, the relationship is not limited to a case where a relationship of $Wz1=Wz2$ is established, and a relationship of $Wz1+Wz2$ may be established. Here, in order to achieve a good balance between a mechanical strength, a vibration distribution, and the like, desirably, a relationship of $Wz1=Wz2$ is established.

An area of the low acoustic velocity region 18 is defined as S18, and an area of the high acoustic velocity region 17 is defined as S17. In the example illustrated in FIG. 5, the area S18 is calculated by the following equation $S18=Ex \times Ez-[\{Ex-(Wx1+Wx2)\} \times \{Ez-(Wz1+Wz2)\}]$, and the area S17 is calculated by the following equation $S17=\{Ex-(Wx1+Wx2)\} \times \{Ez-(Wz1+Wz2)\}$. The area S18 of the low acoustic velocity region 18 is smaller than the area S17 of the high acoustic velocity region 17 ($S18<S17$). Desirably, the area S18 of the low acoustic velocity region 18 is smaller than 75% of the area S17 of the high acoustic velocity region 17 (S18<S17×0.75), more desirably, is smaller than 50% of the area S17 of the high acoustic velocity region 17 (S18<S17×0.50), and still more desirably, is smaller than 25% of the area S17 of the high acoustic velocity region 17 (S18<S17×0.25).

In the example illustrated in FIG. 5, the length of the first low acoustic velocity region 18A in the Z' axis direction and the length of the second low acoustic velocity region 18B in the Z' axis direction are substantially equal to the length Ez of the first excitation electrode 14*a* in the Z' axis direction. In addition, the length of the third low acoustic velocity region 18C in the X axis direction and the length of the fourth low acoustic velocity region 18D in the X axis direction are substantially equal to the length Ex of the first excitation electrode 14*a* in the X axis direction.

In a case where the low acoustic velocity region sufficiently functions, the length of the first low acoustic velocity region in the Z' axis direction and the length of the second low acoustic velocity region in the Z' axis direction may be smaller than the length Ez. In addition, the length of the third low acoustic velocity region in the X axis direction and the length of the fourth low acoustic velocity region in the X axis direction may be smaller than the length Ex. That is, in plan view, the first low acoustic velocity region and the second low acoustic velocity region may be separated from the end portions of the first excitation electrode in at least one of the positive Z' axis direction or the negative Z' axis direction. In addition, the third low acoustic velocity region and the fourth low acoustic velocity region may be separated from the end portions of the first excitation electrode in at least one of the positive X axis direction or the negative X axis direction. Here, in order to prevent the vibration form from being disrupted and the waveform from being divided by the first low acoustic velocity region and the second low acoustic velocity region, desirably, both the length of the first low acoustic velocity region in the Z' axis direction and the length of the second low acoustic velocity region in the Z' axis direction are 80% or more of the length Ez. In addition, desirably, both the length of the third low acoustic velocity region in the X axis direction and the length of the fourth low acoustic velocity region in the X axis direction are 80% or more of the length Ex.

As illustrated in FIG. 5, a dimension of the hole H in the Z' axis direction is defined as Hz, and a dimension of the hole H in the X axis direction is defined as Hx. A planar shape of the hole His a square shape having a side extending along the Z' axis direction and a side extending along the X axis direction. That is, Hz=Hx.

Figure 47:
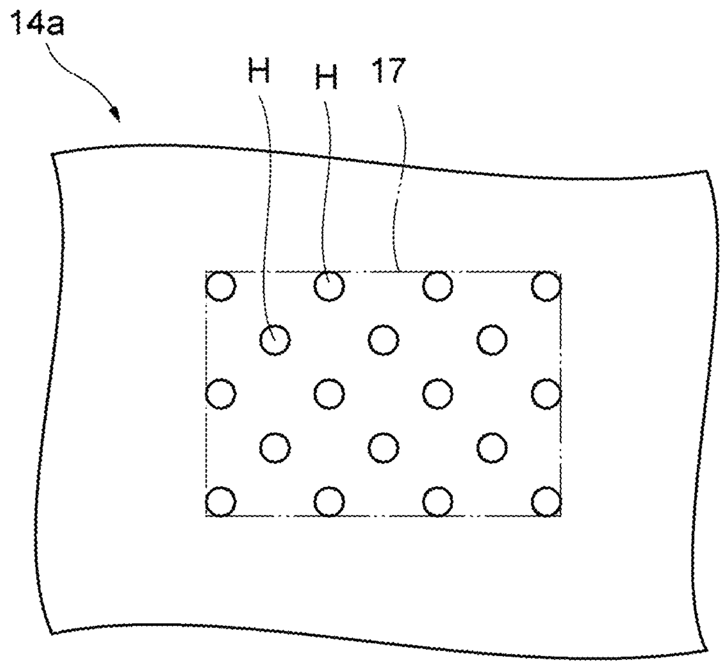
FIG. 47 is a plan view of a modification example of a high acoustic velocity region.
Figure 48:
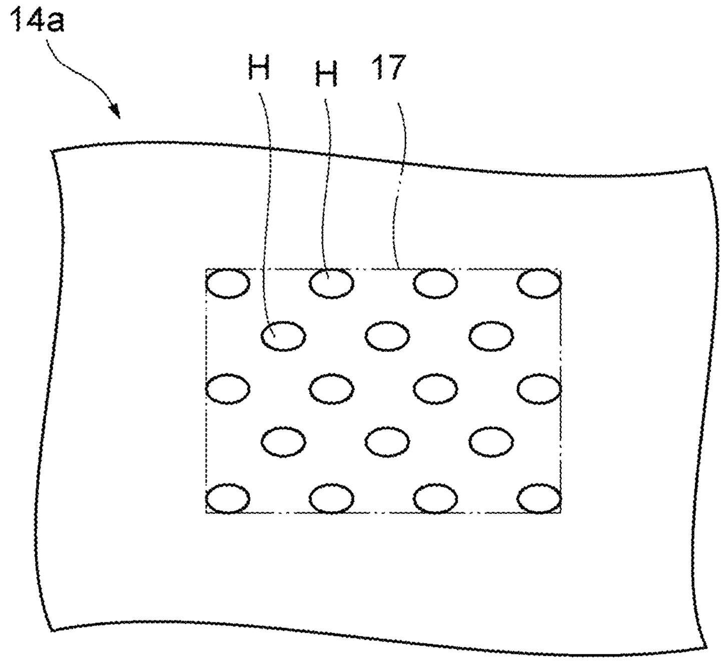
FIG. 48 is a plan view of a modification example of a high acoustic velocity region.
Figure 49:
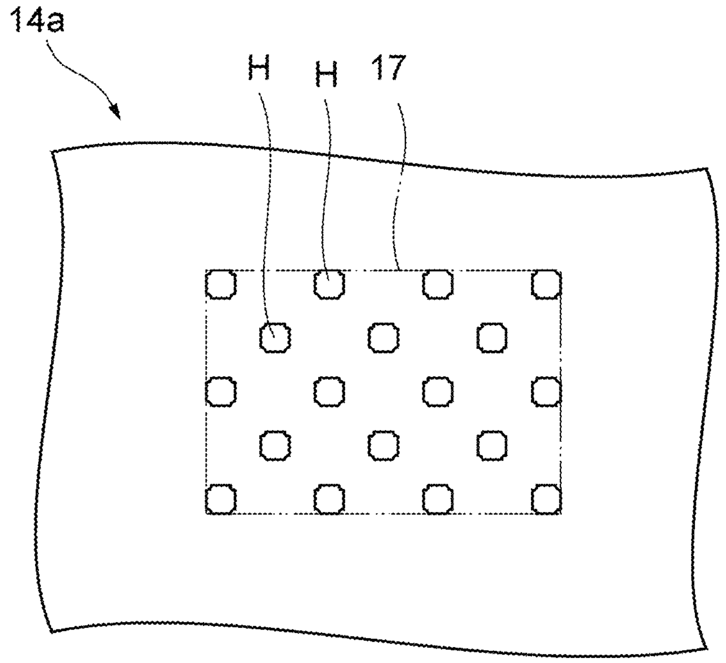
FIG. 49 is a plan view of a modification example of a high acoustic velocity region.

The planar shape of the hole H is not limited to a square shape having sides extending in the X axis direction and the Z' axis direction. For example, the planar shape of the hole H may be a square shape having sides extending in a direction that intersects with the X axis direction and the Z' axis direction, and may be a rectangular shape satisfying Hz<Hx or Hx<Hz. As illustrated in FIG. 47, the planar shape of the hole H may be a circular shape. As illustrated in FIG. 48, the planar shape of the hole H may be an elliptical shape. As illustrated in FIG. 49, the planar shape of the hole H may be a shape in which the four corners of a square shape are arced. As described above, the planar shape of the hole H may be a polygonal shape, a circular shape, an elliptical shape, or a combination thereof.

As illustrated in FIG. 5, the plurality of holes H are disposed in a matrix shape in the X axis direction and the X' axis direction. A pitch of the plurality of holes H in the Z' axis direction, that is, a distance between the end portions of two holes H, which are adjacent to each other in the Z' axis direction and are on the negative Z' axis direction side, is defined as PHz. A pitch of the holes H in the X axis direction, that is, a distance between the end portions of two holes H, which are adjacent to each other in the X axis direction and are on the negative X axis direction side, is defined as PHx. The plurality of holes H are disposed at equal intervals in each of the Z' axis direction and the X axis direction. That is, PHz=PHx.

Figure 50:
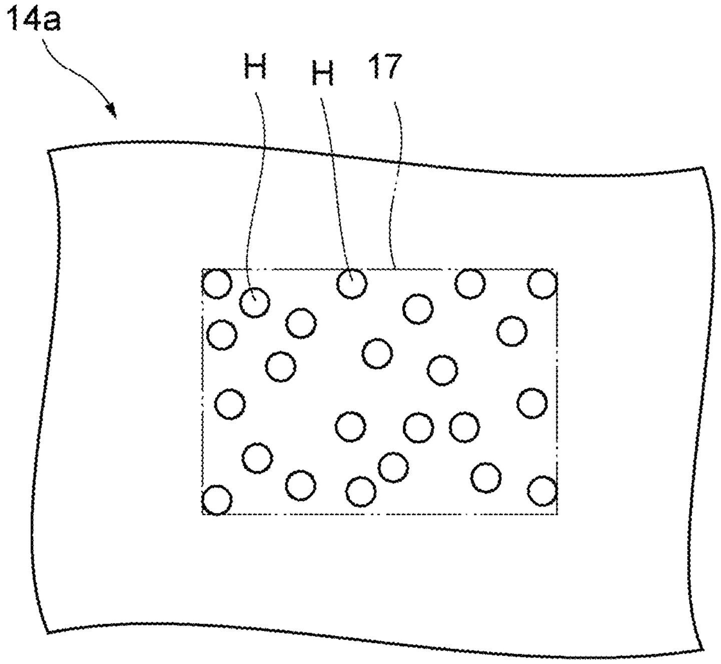
FIG. 50 is a plan view of a modification example of a high acoustic velocity region.

The pitch of the plurality of holes H is not limited to the pitch described above, and may be PHz<PHx or PHx<PHz. Further, the form in which the plurality of holes H are disposed is not limited to the form described above. The plurality of holes H may be disposed in a direction that intersects with the Z' axis direction and the X axis direction. As illustrated in FIG. 46 to FIG. 49, the plurality of holes H may be disposed in a zigzag shape. As illustrated in FIG. 50, the plurality of holes H may be randomly disposed.

Next, simulation results of an example based on the first embodiment will be described with reference to FIG. 6 to FIG. 20. FIG. 15 to FIG. 20 are diagrams showing simulation results based on a second comparative example.

Figure 6:
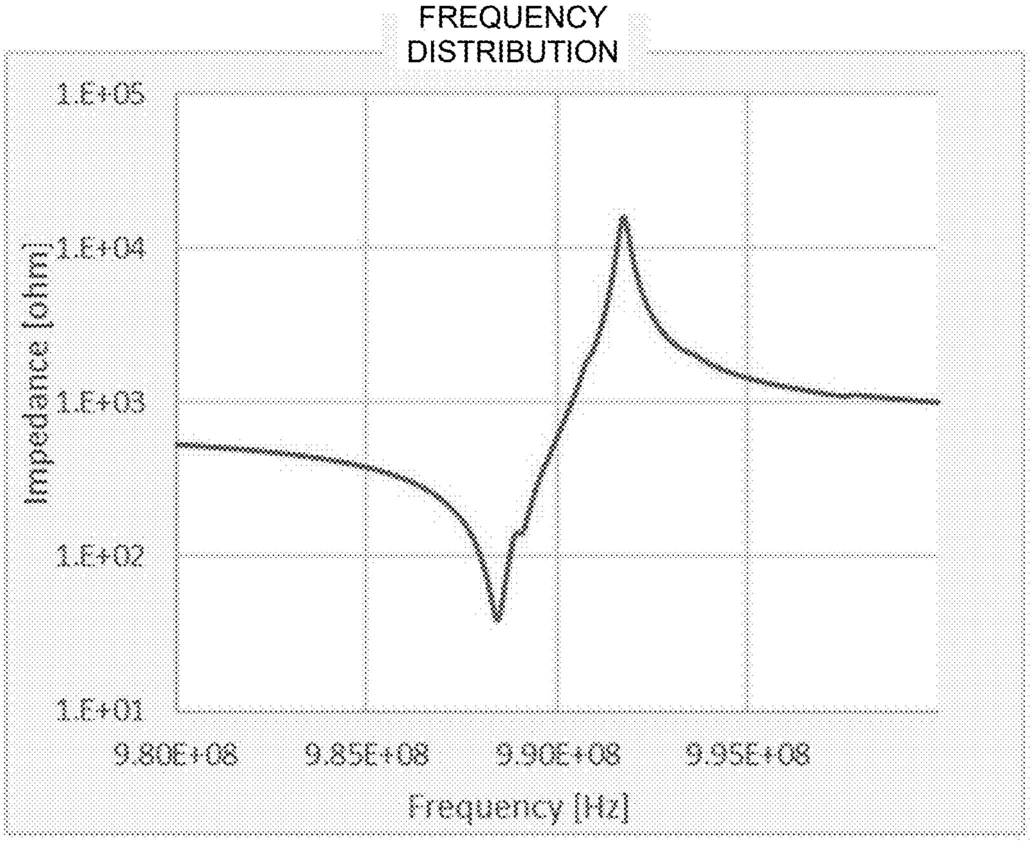
FIG. 6 is a diagram showing simulation results based on an example.
Figure 7:
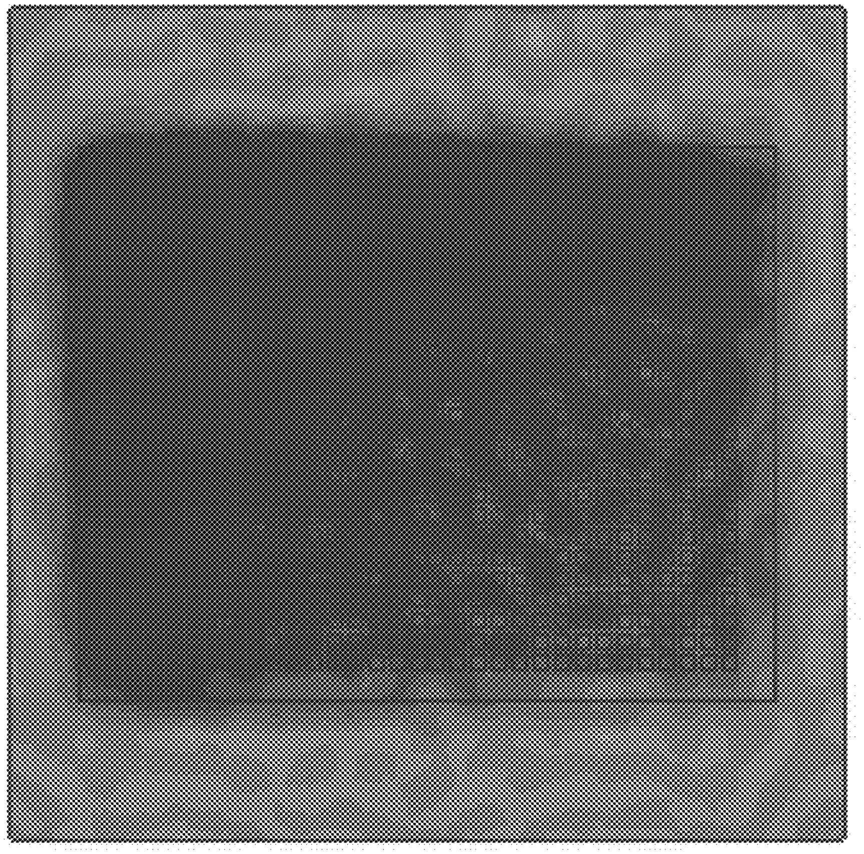
FIG. 7 is a diagram showing simulation results based on the example.
Figure 8:
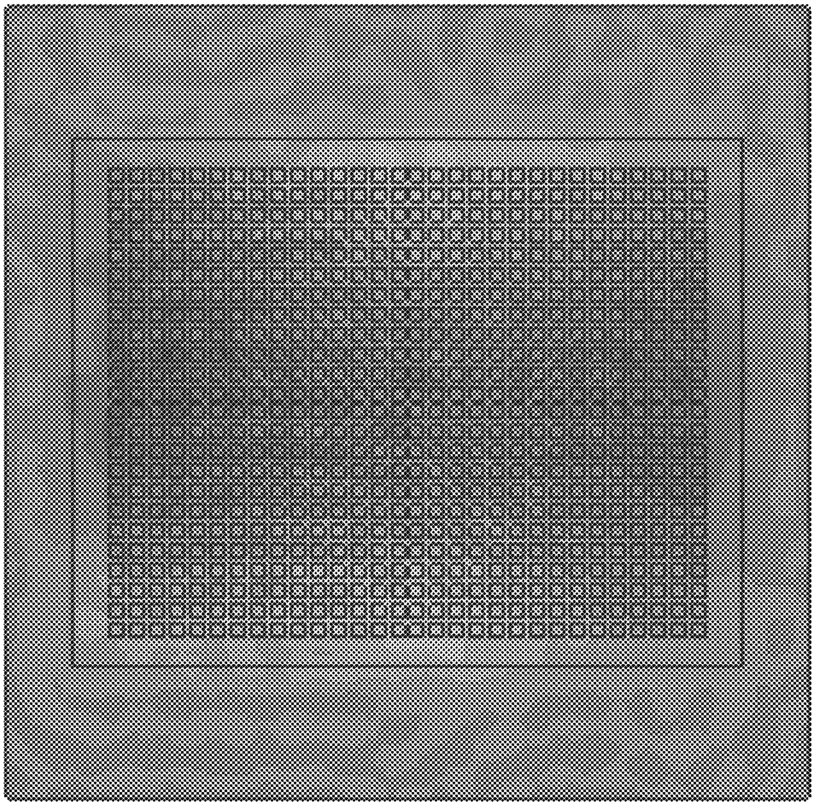
FIG. 8 is a diagram showing simulation results based on the example.
Figure 9:
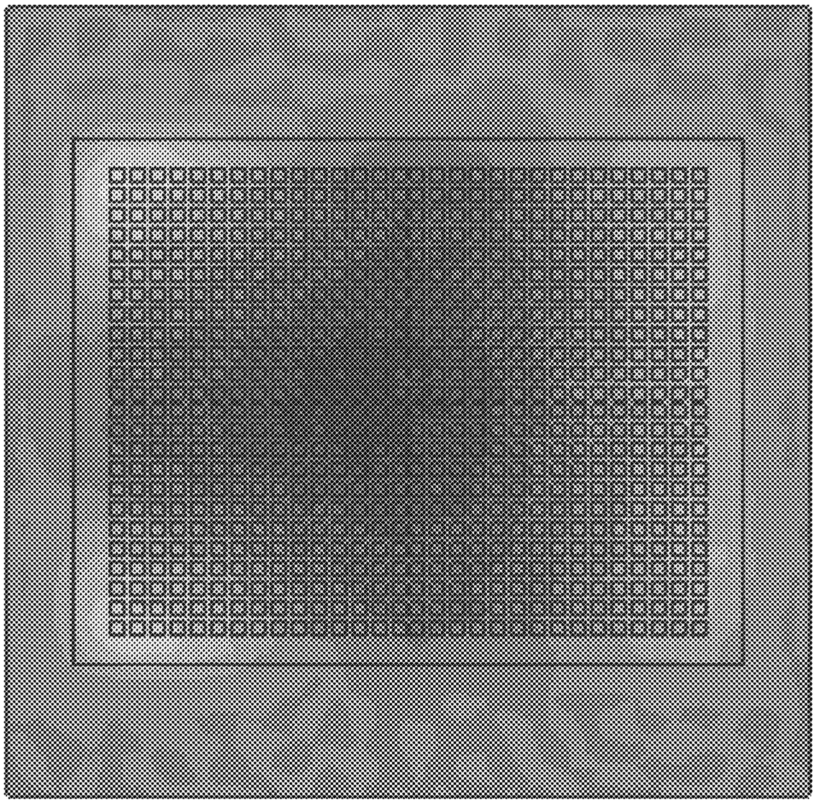
FIG. 9 is a diagram showing simulation results based on the example.

FIG. 6 to FIG. 9 are diagrams showing simulation results based on the example. FIG. 6 is a graph showing a frequency distribution in the example. A horizontal axis of FIG. 6 indicates a frequency [Hz], and a vertical axis of FIG. 6 indicates an impedance [ohm]. FIG. 7 shows a vibration distribution of a main S0 mode in the example. FIG. 8 shows a vibration distribution of an S1Z mode in the example that is one type of an inharmonic spurious mode. FIG. 9 shows a vibration distribution of an S1X mode in the example that is one type of an inharmonic spurious mode.

Figure 10:
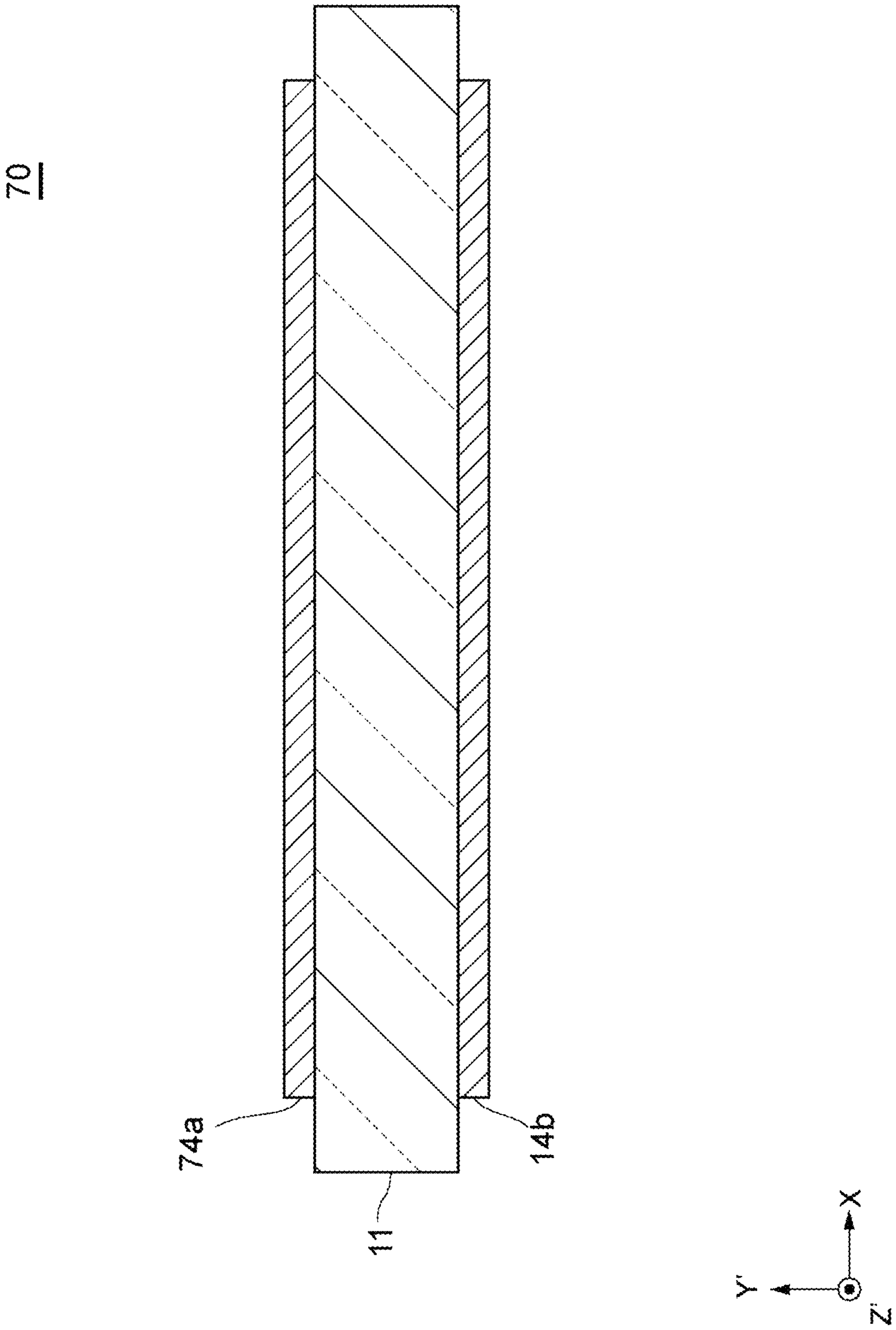
FIG. 10 is a cross-sectional view of a quartz crystal resonator according to a first comparative example.
Figure 11:
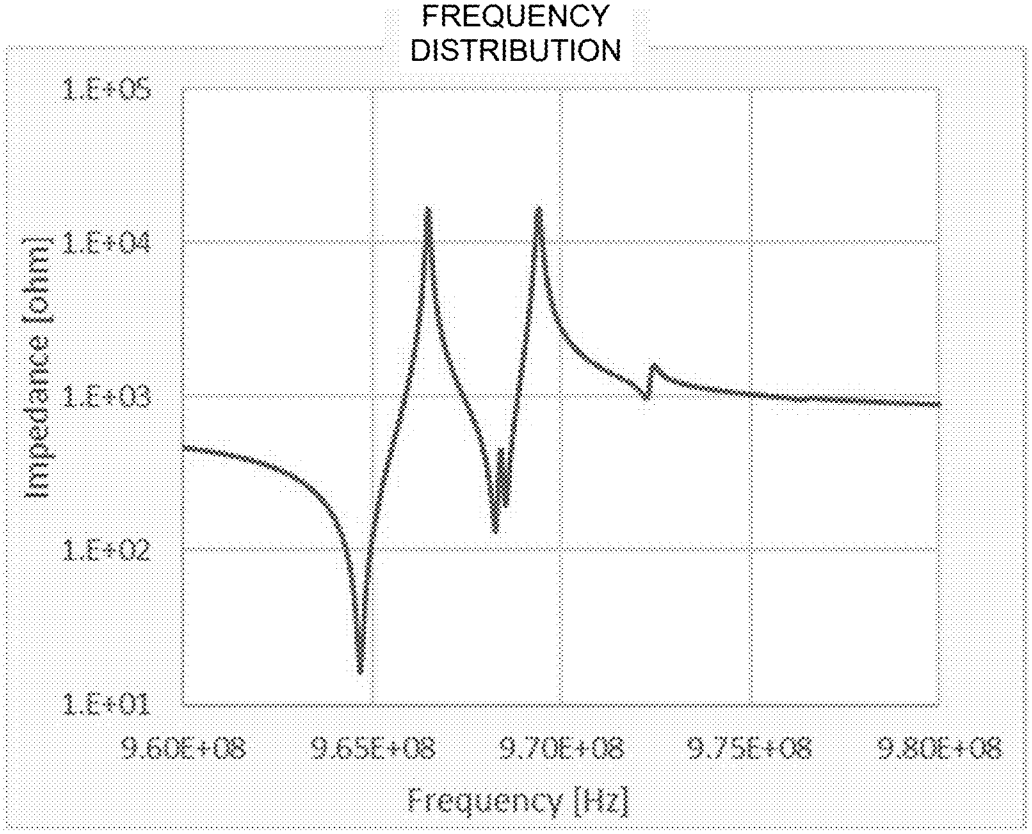
FIG. 11 is a diagram showing simulation results based on the first comparative example.
Figure 12:
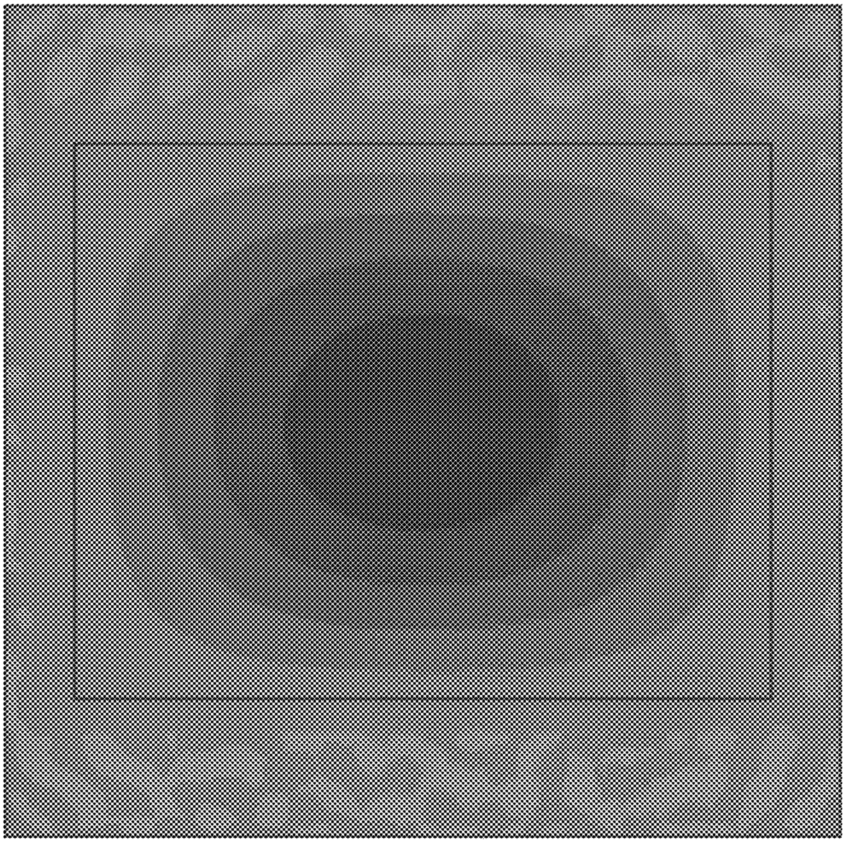
FIG. 12 is a diagram showing simulation results based on the first comparative example.
Figure 13:
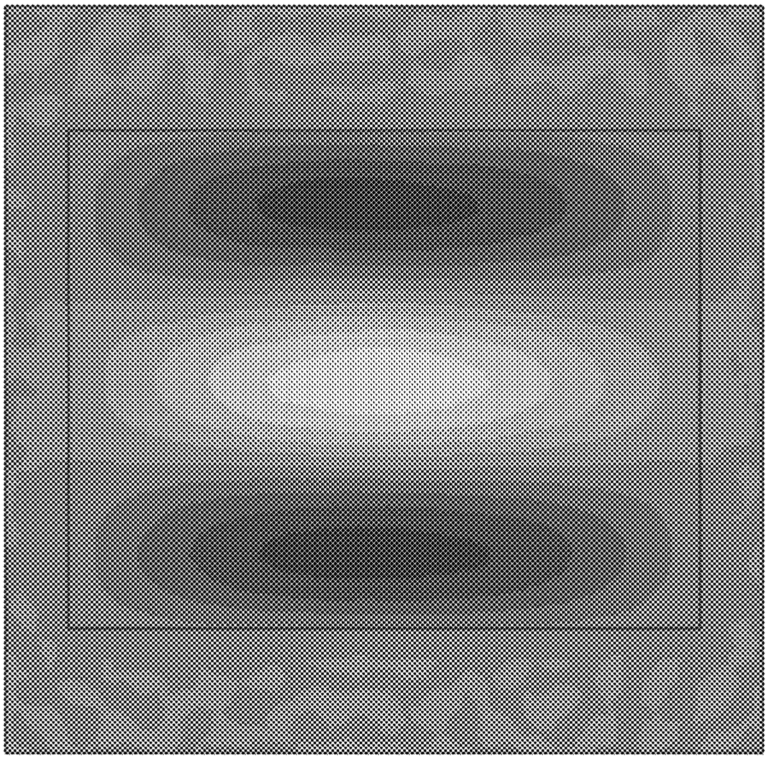
FIG. 13 is a diagram showing simulation results based on the first comparative example.
Figure 14:
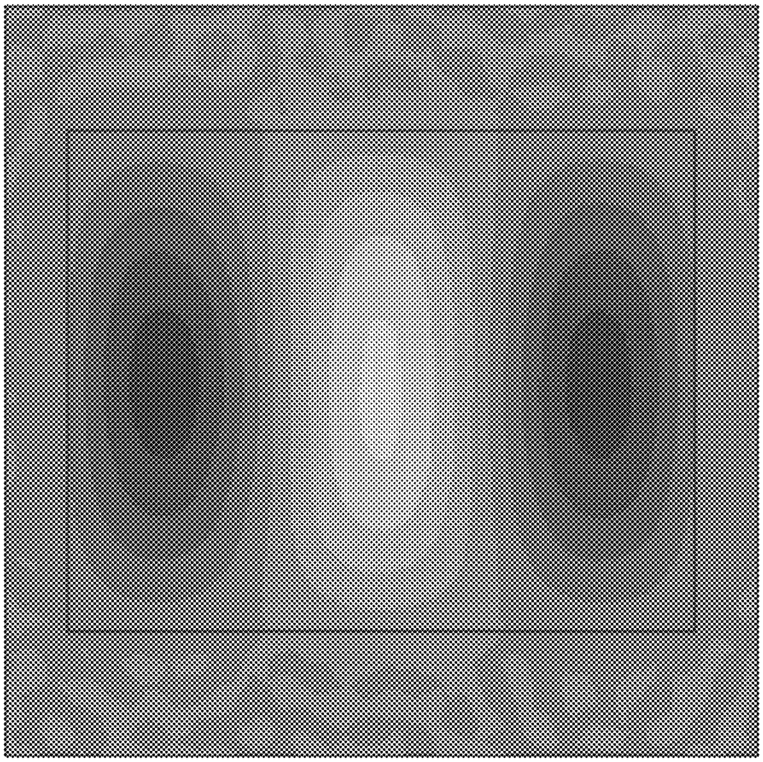
FIG. 14 is a diagram showing simulation results based on the first comparative example.

FIG. 10 is a cross-sectional view of the quartz crystal resonator 70 according to a first comparative example. The first excitation electrode 74*a* of the quartz crystal resonator 70 has a flat plate shape similar to the shape of the second excitation electrode 14*b*, and a region that overlaps the first excitation electrode 74*a* in plan view has substantially the same acoustic velocity in the entire region. That is, the high acoustic velocity region and the low acoustic velocity region are not formed in the quartz crystal resonator 70. FIG. 11 to FIG. 14 are diagrams showing simulation results based on the first comparative example. FIG. 11 is a graph showing a frequency distribution in the first comparative example. A horizontal axis and a vertical axis of the graph in FIG. 11 are the same as the horizontal axis and the vertical axis of the graph in FIG. 6. FIG. 12 shows a vibration distribution of a main S0 mode in the first comparative example. FIG. 13 shows a vibration distribution of an S1Z mode in the first comparative example that is one type of an inharmonic spurious mode. FIG. 14 shows a vibration distribution of an S1X mode in the first comparative example that is one type of an inharmonic spurious mode.

Figure 15:
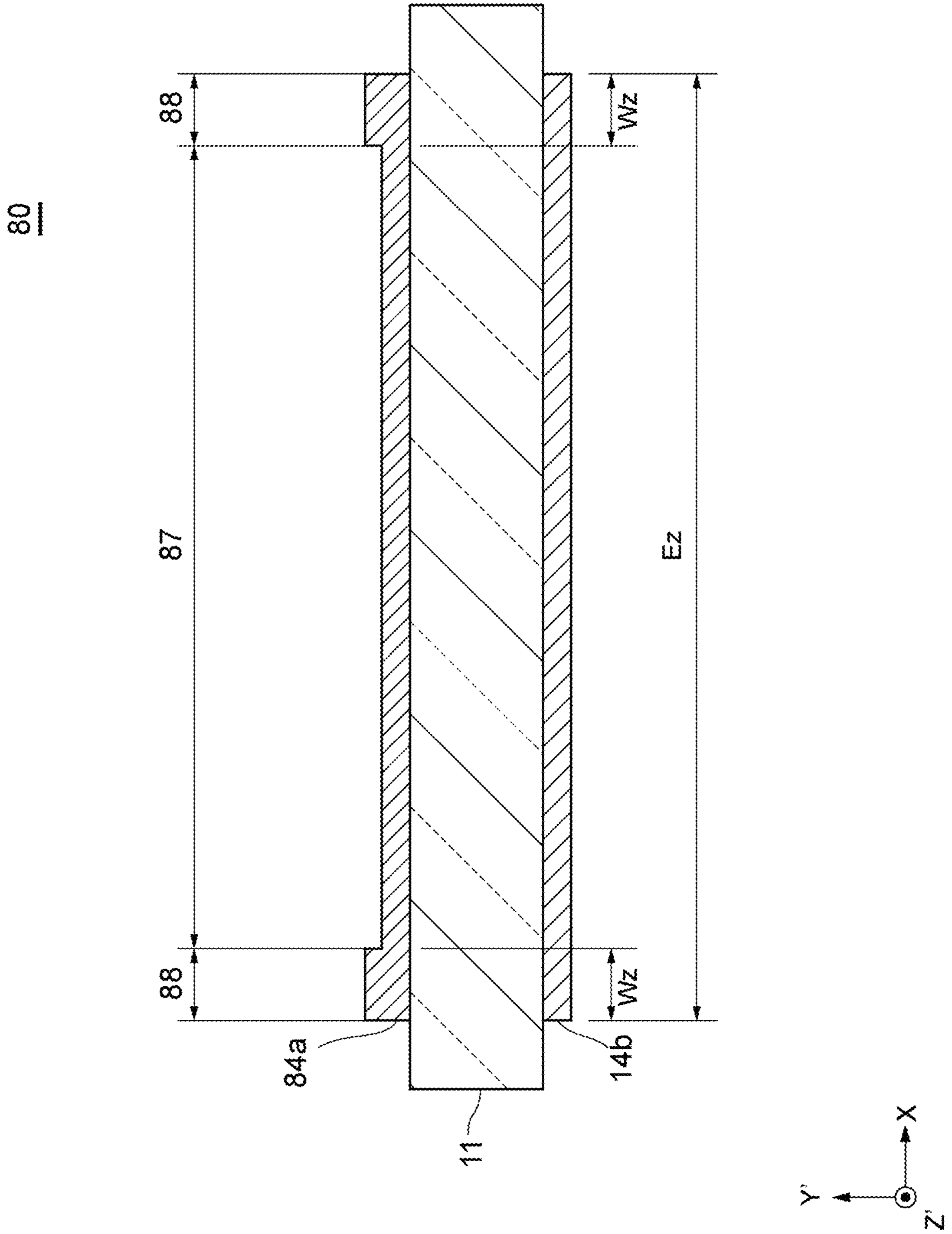
FIG. 15 is a cross-sectional view of a quartz crystal resonator according to a second comparative example.
Figure 16:
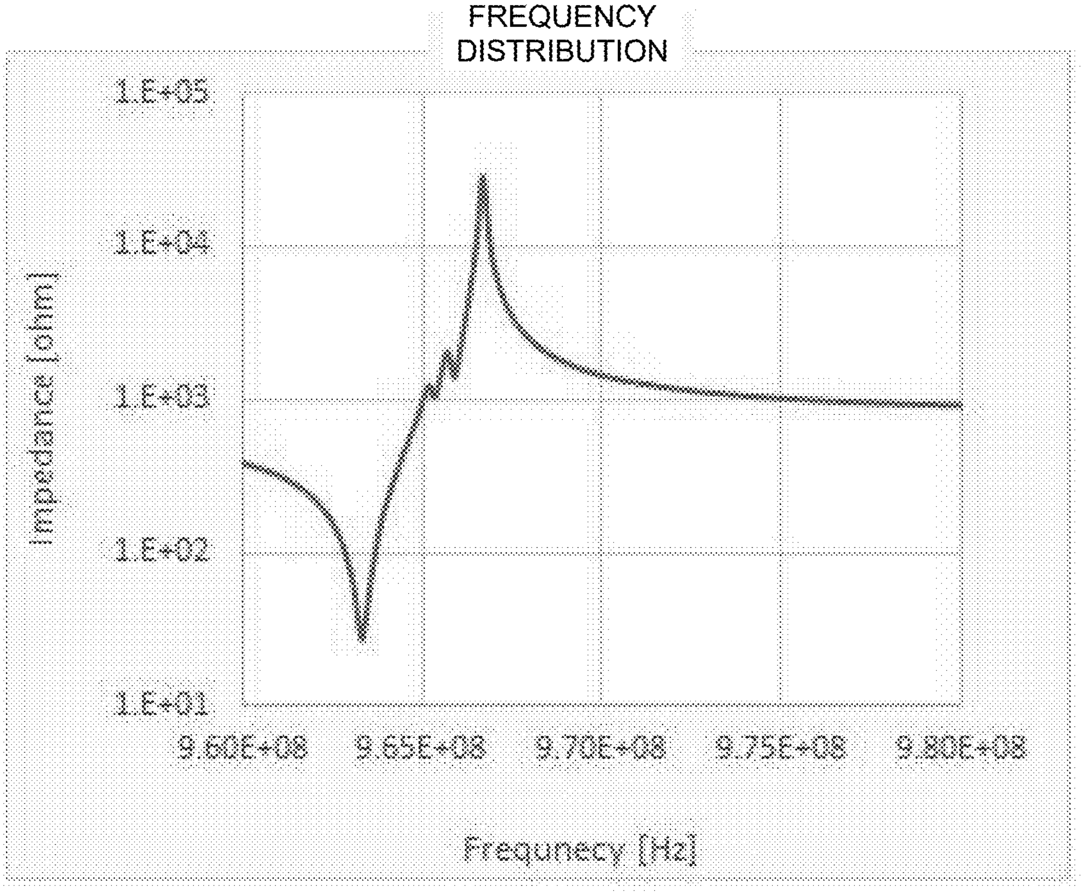
FIG. 16 is a diagram showing simulation results based on the second comparative example.
Figure 17:
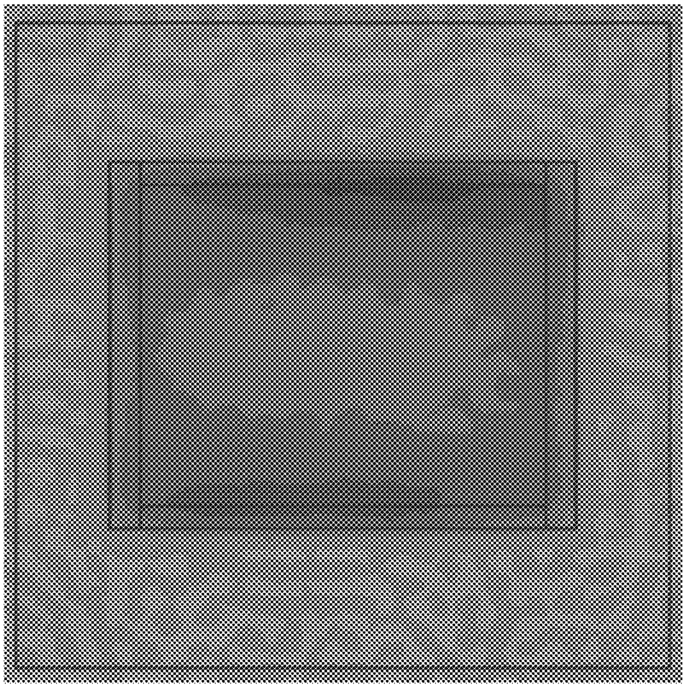
FIG. 17 is a diagram showing simulation results based on the second comparative example.
Figure 18:
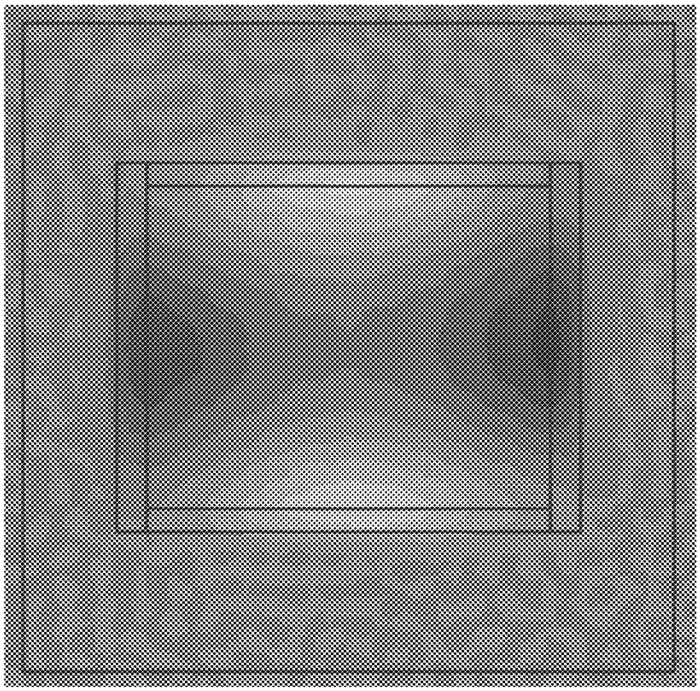
FIG. 18 is a diagram showing simulation results based on the second comparative example.
Figure 19:
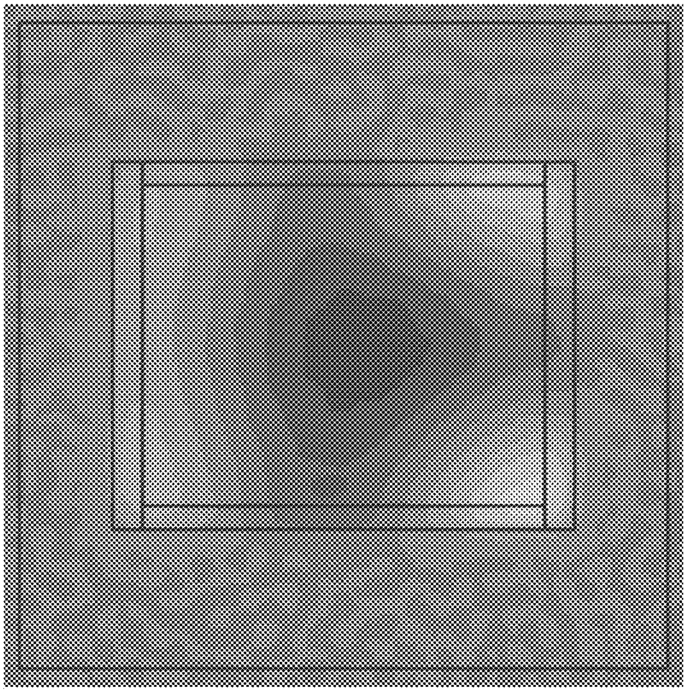
FIG. 19 is a diagram showing simulation results based on the second comparative example.
Figure 20:
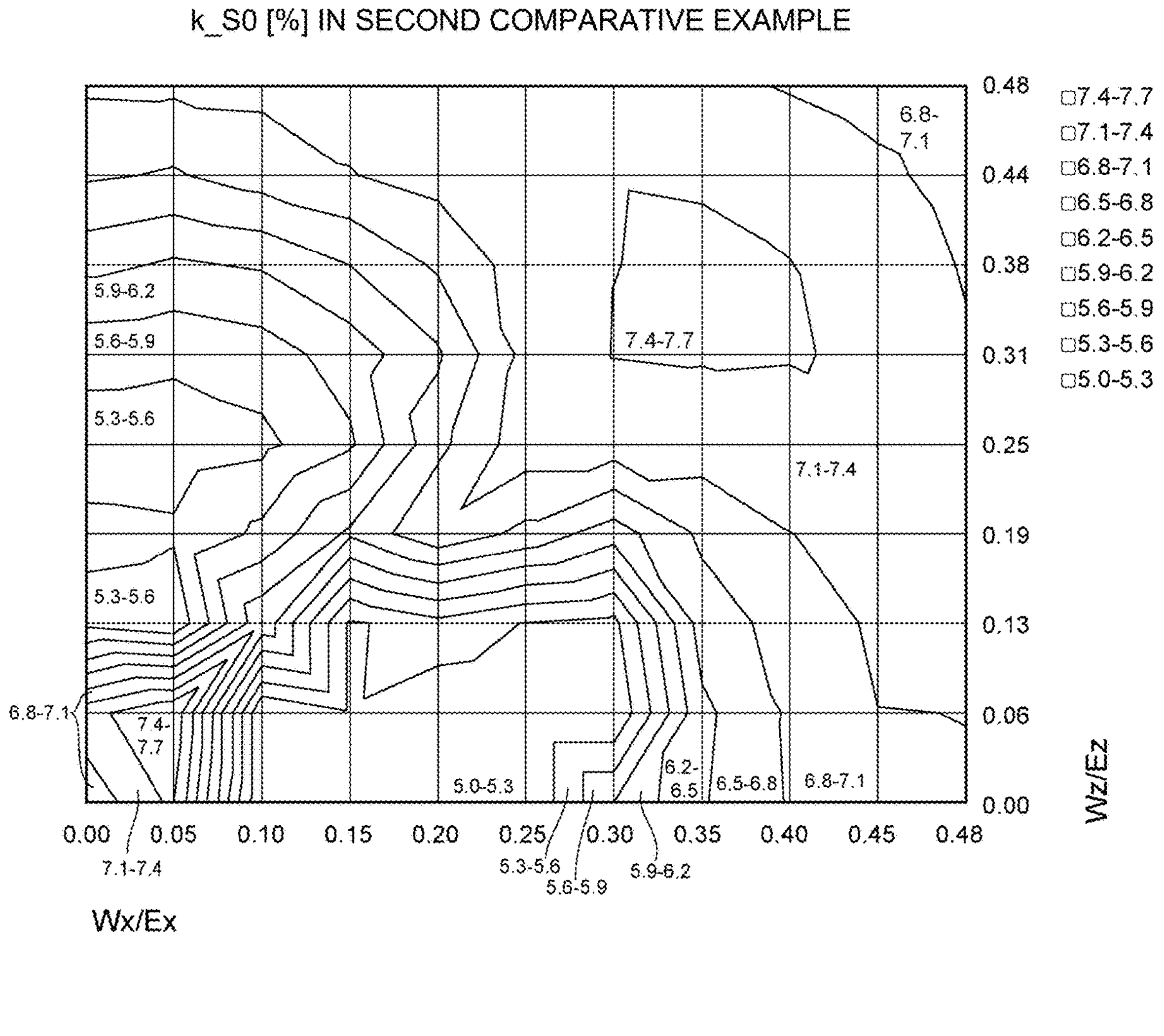
FIG. 20 is a diagram showing simulation results based on the second comparative example.

FIG. 15 is a cross-sectional view of the quartz crystal resonator 80 according to a second comparative example. The first excitation electrode 84*a* of the quartz crystal resonator 80 has an inverted mesa type structure, and the thickness of the first excitation electrode 84*a* in the low acoustic velocity region 88 is thicker than the thickness of the first excitation electrode in the high acoustic velocity region 87. The shape of the first excitation electrode 84*a* in the low acoustic velocity region 88 is a flat plate shape having a uniform thickness, and the shape of the first excitation electrode 84*a* in the low acoustic velocity region 88 is a flat plate shape having a uniform thickness. FIG. 16 to FIG. 20 are diagrams showing simulation results based on the second comparative example. FIG. 16 is a graph showing a frequency distribution in the second comparative example. A horizontal axis and a vertical axis of the graph in FIG. 16 are the same as the horizontal axis and the vertical axis of the graph in FIG. 6. FIG. 17 shows a vibration distribution of a main S0 mode in the second comparative example. FIG. 18 shows a vibration distribution of an S1Z mode in the second comparative example that is one type of an inharmonic spurious mode. FIG. 19 shows a vibration distribution of an S1X mode in the first comparative example that is one type of an inharmonic spurious mode. FIG. 20 is a graph showing a distribution of an electromechanical coupling coefficient k (hereinafter, also simply referred to as "k_S0") of the S0 mode of the second comparative example in a case where the horizontal axis is defined as Wx/Ex and the vertical axis is defined as Wz/Ez. In the following description, in the same manner as k_S0, the electromechanical coupling coefficient k in the S1Z mode is also simply referred to as "k_S1Z", and the electromechanical coupling coefficient k in the SIX mode is also simply referred to as "k_S1X".

The configurations of the example, the first comparative example, and the second comparative example are as follows.

EXAMPLE

Tp=1.52 μm
Te1=Te2=0.08 μm
Px=Pz=140 μm
Ex=100 μm
Ez=80 μm
Wx1=Wx2=Wx=6.5 μm
Wz1=Wz2=Wz=5.5 μm
PHx=PHz=3 μm
Hx=Hz=2 μm
The number of H: 30×24=720

First Comparative Example

Tp=1.52 μm
Te1=Te2=0.08 μm
Px=Pz=140 μm
Ex=100 μm
Ez=80 μm
Wx1=Wx2=Wx=0 μm
Wz1=Wz2=Wz=0 μm

Second Comparative Example

Tp=1.52 μm
Thickness of first excitation electrode in high acoustic velocity region=0.08 μm
Thickness of first excitation electrode in low acoustic velocity region=0.08+0.032 μm
Te2=0.08 μm
Px=Pz=140 μm
Ex=100 μm
Ez=80 μm
Wx1=Wx2=Wx=6.5 μm
Wz1=Wz2=Wz=5.5 μm As shown in FIG. 11, the frequency of the S0 mode in the first comparative example is approximately 965 MHz. As shown in FIG. 6, the frequency of the S0 mode in the example is approximately 988 MHz. A reason why the resonant frequency in the example is higher than the resonant frequency in the comparative example is that the mass of the first excitation electrode is decreased by forming the plurality of holes in the first excitation electrode in the high acoustic velocity region. That is, the example in which the mass of the high acoustic velocity region is decreased to realize a difference in acoustic velocity between the high acoustic velocity region and the low acoustic velocity region is advantageous in making the frequency of the quartz crystal resonator higher, as compared with the second comparative example in which the mass of the low acoustic velocity region is increased to realize a difference in acoustic velocity between the high acoustic velocity region and the low acoustic velocity region.

As shown in FIG. 12, the vibration of the S mode in the first comparative example is increased from the end portion of the first excitation electrode toward the center portion of the first excitation electrode. As shown in FIG. 17, the vibration of the S0 mode in the second comparative example is spread over the entire region of the first excitation electrode, as compared with the amplitude of the S0 mode in the first comparative example. As shown in FIG. 7, the vibration of the S0 mode in the example is increased over the entire region of the first excitation electrode than in the second comparative example. In the first comparative example, k_S0=6.87%, in the second comparative example, k_S0=7.99%, and in the example, k_S0=8.46%. The electromechanical coupling coefficient of the S0 mode in the second comparative example is larger than the electromechanical coupling coefficient of the S0 mode in the first comparative example, but the electromechanical coupling coefficient of the S0 mode in the example is further larger.

As shown in FIG. 13, in the S1Z mode in the first comparative example, the vibrations having opposite phases are arranged in the Z' axis direction. As shown in FIG. 18, in the S1Z mode in the second comparative example, a part of the vibrations having the opposite phases is offset. As shown in FIG. 8, in the S1Z mode in the example, the vibrations having the opposite phases are further offset, and the vibration decreases over the entire region of the first excitation electrode. In the first comparative example, k_S1Z=2.44%, in the second comparative example, k_S1Z=0.47%, and in the example, k_S1Z=0.00%. The electromechanical coupling coefficient of the S1Z mode in the second comparative example is smaller than the electromechanical coupling coefficient of the S1Z mode in the first comparative example, but the electromechanical coupling coefficient of the S1Z mode in the example is further smaller.

As shown in FIG. 14, in the S1X mode in the first comparative example, the vibrations having opposite phases are arranged in the X axis direction. As shown in FIG. 19, in the S1X mode in the second comparative example, a part of the vibrations having the opposite phases is offset. As shown in FIG. 9, in the S1X mode in the example, the vibrations having the opposite phases are further offset, and the vibration decreases over the entire region of the first excitation electrode. In the first comparative example, k_S1X=2.17%, in the second comparative example, k_S1X=1.32%, and in the example, k_S1X=0.46%. The electromechanical coupling coefficient of the S1X mode in the second comparative example is smaller than the electromechanical coupling coefficient of the S1X mode in the first comparative example, but the electromechanical coupling coefficient of the S1X mode in the example is further smaller.

As shown in FIG. 20, in the second comparative example, k_S0 indicates a peak in a case where Wx/Ex and Wz/Ez are within a range of $0<Wx/Ex\leq 0.10$ and $0<Wz/Ez\leq 0.10$, Wx/Ex and Wz/Ez being ratios of the widths of the low acoustic velocity regions 88 with respect to the width of the first excitation electrode 84a. That is, in the configuration in which the width of the low acoustic velocity region 88 is narrower than the width of the high acoustic velocity region 87, Wx/Ex and Wz/Ez are present in a case where k_S0 indicates the peak. A tendency of the electromechanical coupling coefficient k_S0 of the S0 mode with respect to the ratios Wx/Ex and Wz/Ez of the widths of the low acoustic velocity regions is also confirmed in the example.

Next, an influence of the dimension of the low acoustic velocity region 18 on the electromechanical coupling coefficient will be described with reference to FIG. 21 to FIG. 26. FIG. 21 to FIG. 26 are graphs showing an influence of the dimension of the low acoustic velocity region 18 in the first embodiment.

Figure 21:
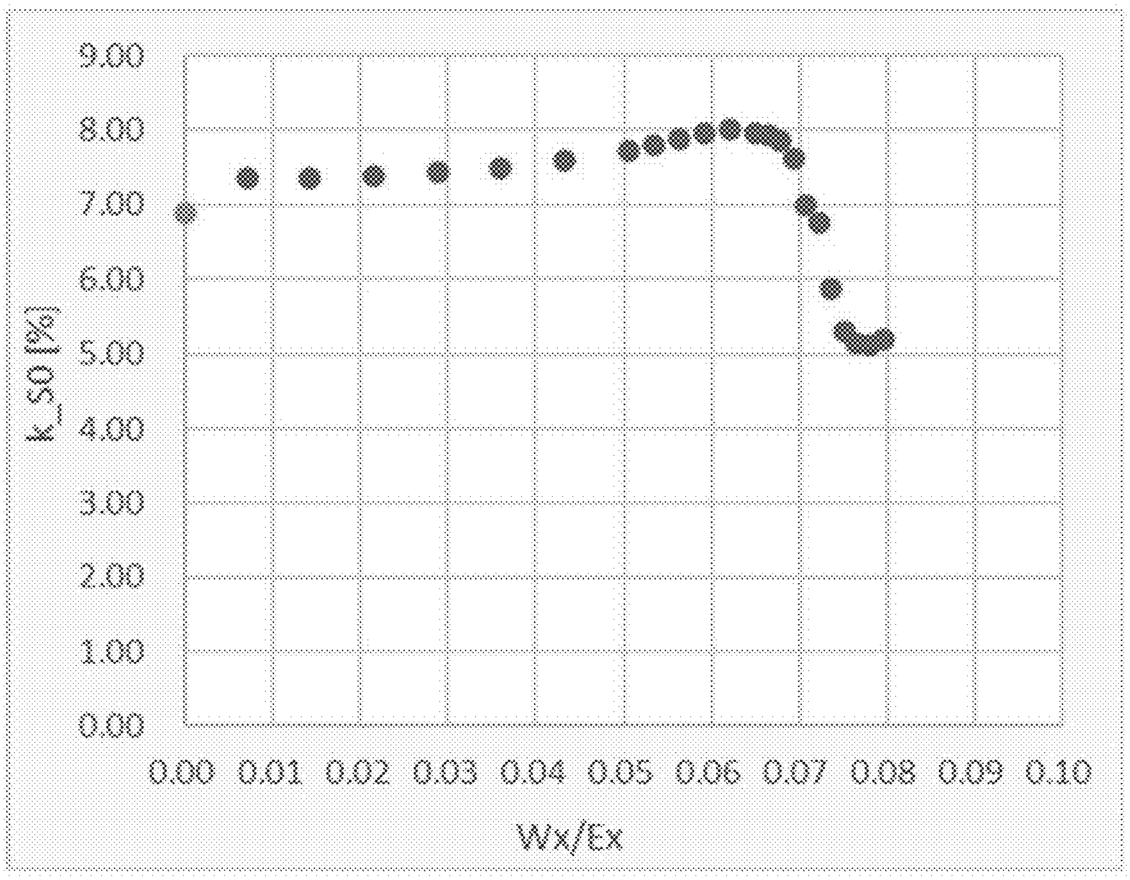
FIG. 21 is a graph showing an influence of a dimension of a low acoustic velocity region in the first embodiment.
Figure 22:
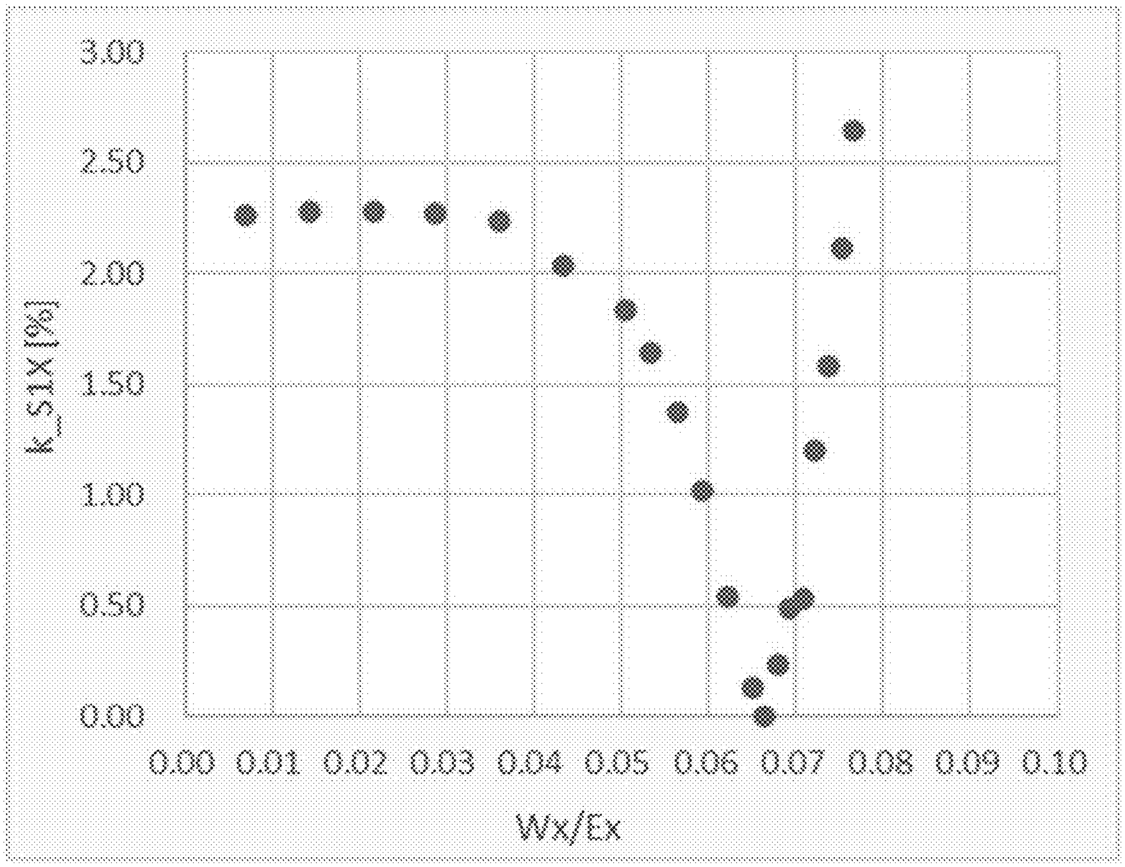
FIG. 22 is a graph showing an influence of a dimension of a low acoustic velocity region in the first embodiment.
Figure 23:
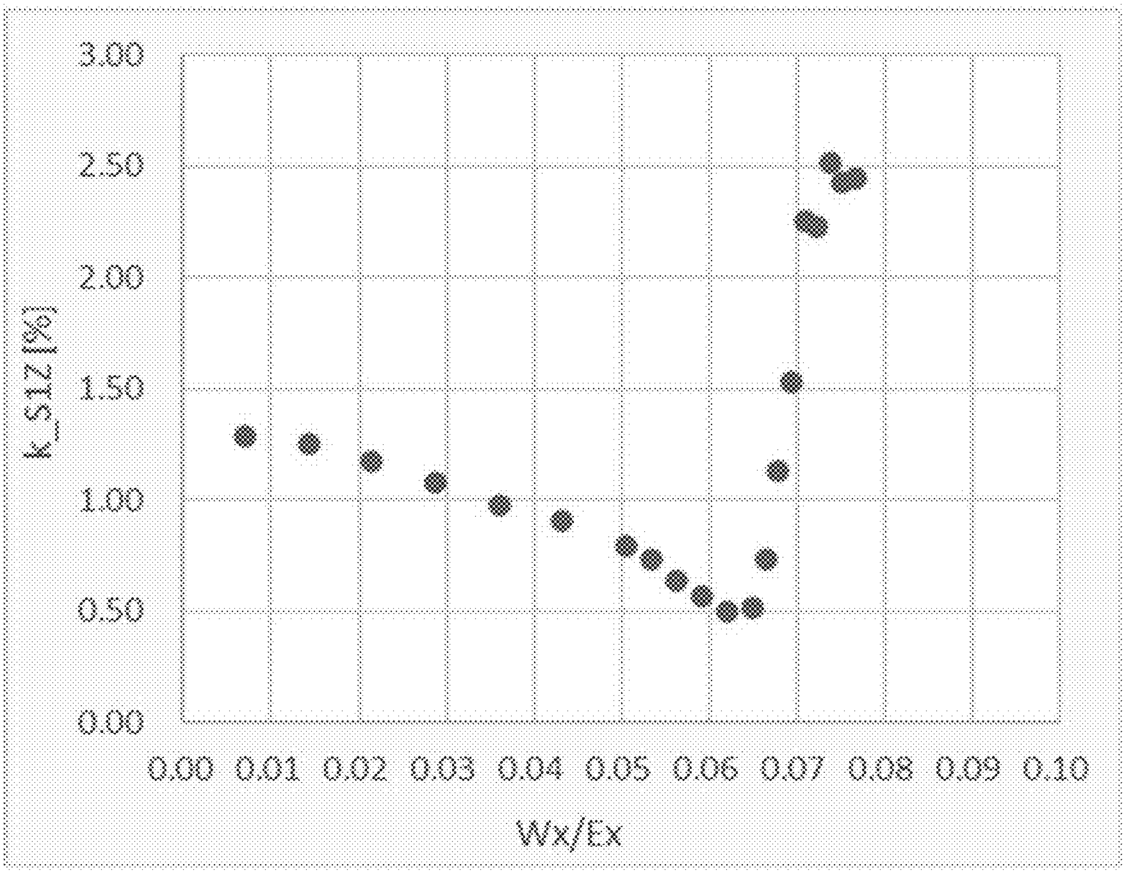
FIG. 23 is a graph showing an influence of a dimension of a low acoustic velocity region in the first embodiment.

FIG. 21 to FIG. 23 are graphs showing changes in the electromechanical coupling coefficient in a case where Wx1/Ex=Wx2/Ex=Wx/Ex is defined as a variable and Wz1/Ez=Wz2/Ez=Wz/Ez=0.070 (constant) is defined in the example described above. A horizontal axis in the graphs of FIG. 21 to FIG. 23 indicates Wx/Ex. A vertical axis in the graph of FIG. 21 indicates k_S0, a vertical axis in the graph of FIG. 22 indicates k_S1X, and a vertical axis in the graph of FIG. 23 indicates k_S1Z.

A plot of Wx/Ex=0 in the graph of FIG. 21 is obtained by plotting, as a comparison target, k_S0=6.87% when Wx/Ex=0 and Wz/Ez=0 (the first comparative example described above) instead of Wx/Ex=0 and Wz/Ez=0.070. Although not shown in FIG. 22, for k_S1X, k_S1X=2.17% when Wx/Ex=0 and Wz/Ez=0 (the first comparative example described above) is used as a comparison target. In addition, although not shown in FIG. 23, for k_S1Z, k_S1Z=2.44% when Wx/Ex=0 and Wz/Ez=0 (the first comparative example described above) is used as a comparison target.

As shown in FIG. 21, in a case where a relationship of 0<Wx/Ex≤0.070 is established, k_S0 increases, and 6.87%<k_S0 is satisfied. In order to further increase k_S0, desirably, a relationship of 0.050≤Wx/Ex≤0.070 is established. As shown in FIG. 22, in a case where a relationship of 0.040≤Wx/Ex≤0.075 is established, k_S1X decreases, and k_S1X<2.17% is satisfied. In order to further decrease k_S1X, desirably, a relationship of 0.050≤Wx/Ex≤0.074 is established, and more desirably, a relationship of 0.060≤Wx/Ex≤0.072 is established. As shown in FIG. 23, in a case where a relationship of 0<Wx/Ex≤0.070 is established, k_S1Z decreases, and k_S1Z<2.44% is satisfied. In order to further decrease k_S1Z, desirably, a relationship of 0.030≤Wx/Ex≤0.068 is established, and more desirably, a relationship of 0.050≤Wx/Ex≤0.066 is established.

Even in a case where a relationship of Wx1+Wx2 is established, k_S0 increases as long as a relationship of 0<Wx1/Ex≤0.07 and 0<Wx2/Ex≤0.07 is established. In a case where a relationship of 0.050≤Wx1/Ex≤0.070 and 0.050≤Wx2/Ex≤0.070 is established, k_S0 further increases. Similarly, even in a case where a relationship of Wx1+Wx2 is established, k_S1X decreases as long as a relationship of 0.040≤Wx1/Ex≤0.075 and 0.040≤Wx2/Ex≤0.075 is established. In a case where a relationship of 0.050≤Wx1/Ex≤0.074 and 0.050≤Wx2/Ex≤0.074 is established, k_S1X further decreases. In a case where a relationship of 0.060≤Wx1/Ex≤0.072 and 0.060≤Wx2/Ex≤0.072 is established, k_S1X further decreases. Similarly, even in a case where a relationship of Wx1 #Wx2 is established, k_S1Z decreases as long as a relationship of 0<Wx1/Ex≤0.070 and 0<Wx2/Ex≤0.070 is established. In a case where a relationship of 0.30≤Wx1/Ex≤0.068 and 0.30≤Wx2/Ex≤0.068 is established, k_S1Z further decreases. In a case where a relationship of 0.50≤Wx1/Ex≤0.066 and 0.50≤Wx2/Ex≤0.066 is established, k_S1Z further decreases.

In a case where a relationship of Wx/Ex=0.062±0.006 is established, k_S0 further increases, and k_S1X and k_S1Z further decrease. In particular, k_S0 is maximized in a case where a relationship of Wx/Ex=0.062 is established, k_S1X is minimized in a case where a relationship of Wx/Ex=0.066 is established, and k_S1Z is minimized in a case where a relationship of Wx/Ex=0.062 is established.

Even in a case where a relationship of Wx1+Wx2 is established, as long as a relationship of Wx1/Ex=0.062±0.006 and Wx2/Ex=0.062±0.006 is established, k_S0 further increases and k_S1X and k_S1Z further decrease.

Figure 24:
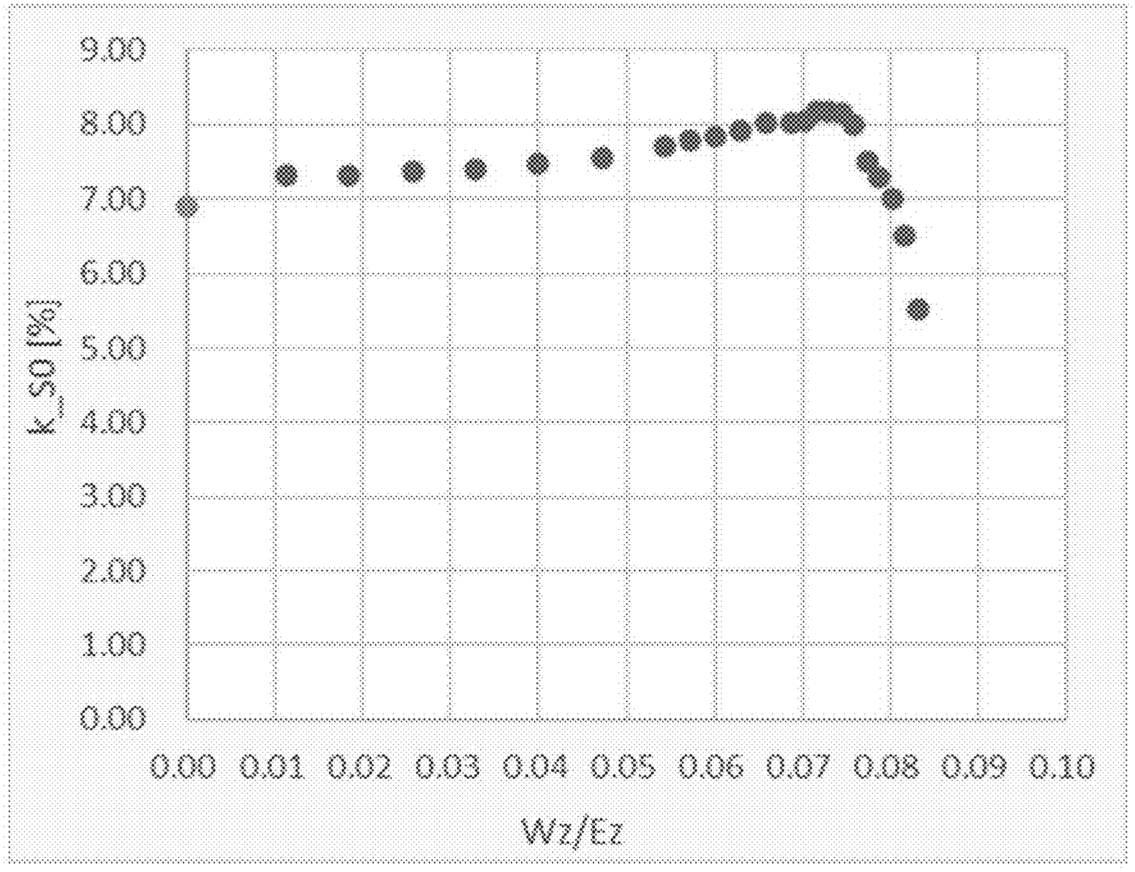
FIG. 24 is a graph showing an influence of a dimension of a low acoustic velocity region in the first embodiment.
Figure 25:
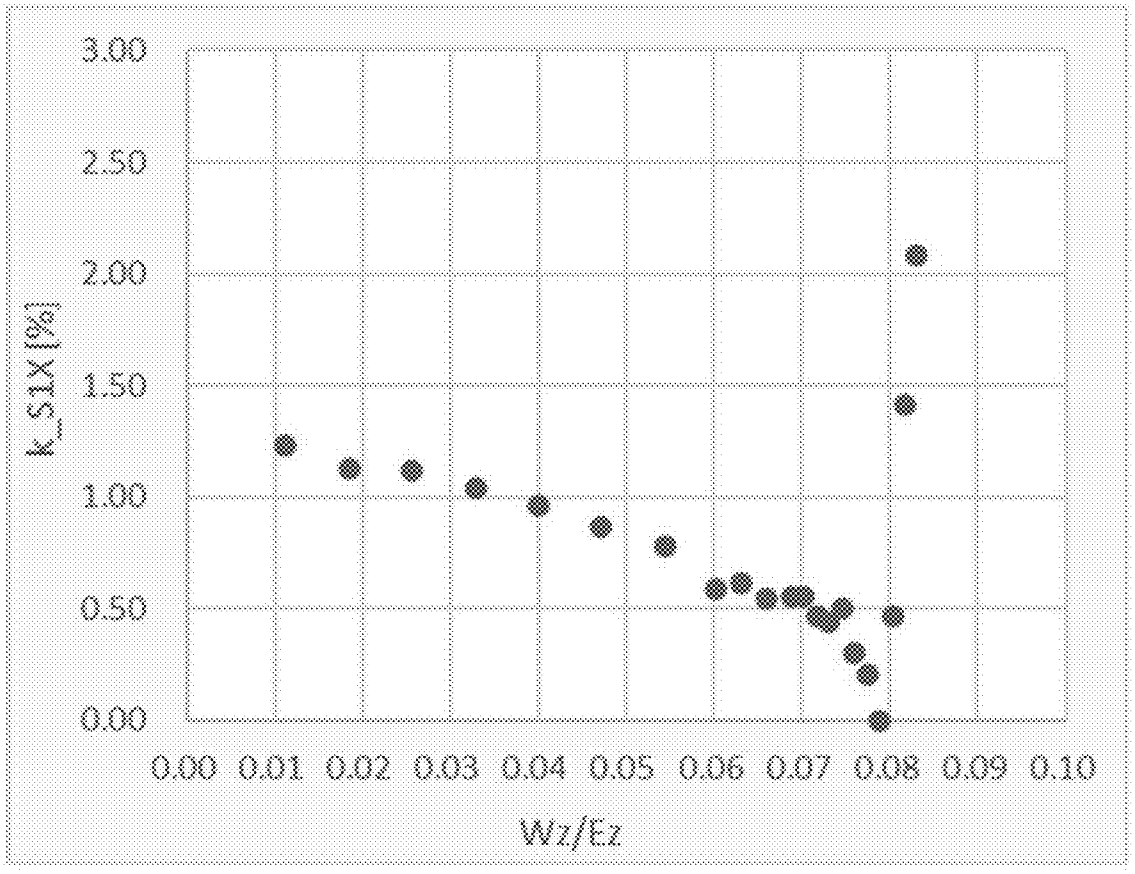
FIG. 25 is a graph showing an influence of a dimension of a low acoustic velocity region in the first embodiment.
Figure 26:
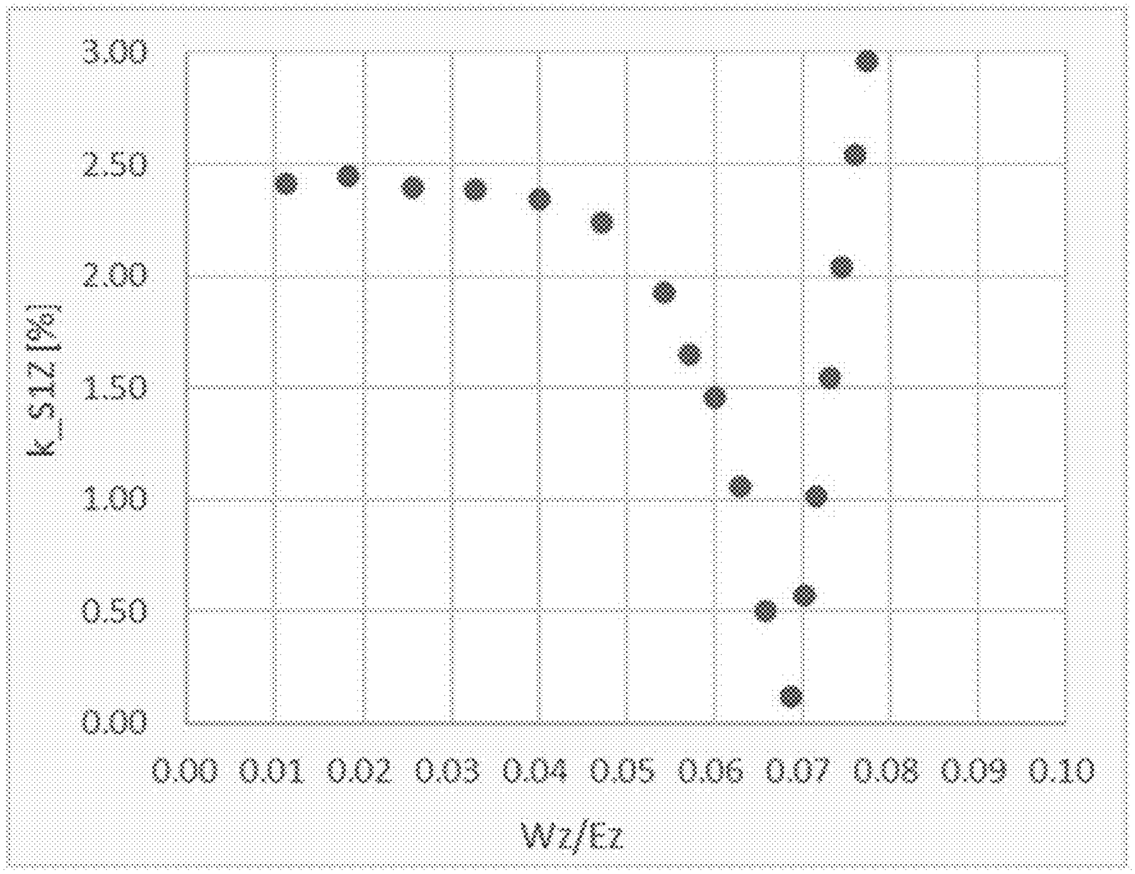
FIG. 26 is a graph showing an influence of a dimension of a low acoustic velocity region in the first embodiment.

FIG. 24 to FIG. 26 are graphs showing changes in the electromechanical coupling coefficient in a case where Wx1/Ex=Wx2/Ex=Wx/Ex=0.062 (constant) is set and Wz1/Ez=Wz2/Ez=Wz/Ez is set as a variable. A horizontal axis in the graphs of FIG. 24 to FIG. 26 indicates Wz/Ez. A vertical axis in the graph of FIG. 24 indicates k_S0, a vertical axis in the graph of FIG. 25 indicates k_S1X, and a vertical axis in the graph of FIG. 26 indicates k_S1Z.

A plot of Wz/Ez=0 in the graph of FIG. 24 is obtained by plotting, as a comparison target, k_S0=6.87% when Wx/Ex=0 and Wz/Ez=0 (the first comparative example described above) instead of Wx/Ex=0.062 and Wz/Ez=0. Although not shown in FIG. 25, for k_S1X, k_S1X=2.17% when Wx/Ex=0 and Wz/Ez=0 (the first comparative example described above) is used as a comparison target. In addition, although not shown in FIG. 26, for k_S1Z, k_S1Z=2.44% when Wx/Ex=0 and Wz/Ez=0 (the first comparative example described above) is used as a comparison target.

As shown in FIG. 24, in a case where a relationship of 0<Wz/Ez≤0.080 is established, k_S0 increases, and 6.87%<k_S0 is satisfied. In order to further increase k_S0, desirably, a relationship of 0.060≤Wz/Ez≤0.075 is established. As shown in FIG. 25, in a case where a relationship of 0≤Wz/Ez≤0.082 is established, k_S1X decreases, and k_S1X<2.17% is satisfied. In order to further decrease k_S1X, desirably, a relationship of 0.035≤Wz/Ez≤0.080 is established, and more desirably, a relationship of 0.065≤Wz/Ez≤0.080 is established. As shown in FIG. 26, in a case where a relationship of 0.04≤Wz/Ez≤0.076 is established, k_S1Z decreases, and k_S1Z<2.44% is satisfied. In order to further decrease k_S1Z, desirably, a relationship of 0.052≤Wz/Ez≤0.074 is established, and more desirably, a relationship of 0.062≤Wz/Ez≤0.072 is established.

Even in a case where a relationship of Wz1+Wz2 is established, k_S0 increases as long as a relationship of 0<Wz1/Ez≤0.080 and 0<Wz2/Ez≤0.080 is established. In a case where a relationship of 0.060≤Wz1/Ez≤0.075 and 0.060≤Wz2/Ez≤0.075 is established, k_S0 further increases. Similarly, even in a case where a relationship of Wz1+Wz2 is established, k_S1X decreases as long as a relationship of 0<Wz1/Ez≤0.082 and 0<Wz2/Ez≤0.082 is established. In a case where a relationship of 0.035≤Wz1/Ez≤0.080 and 0.0352≤Wz/Ez≤0.080 is established, k_S1X further decreases. In a case where a relationship of 0.065≤Wz1/Ez≤0.080 and 0.065≤Wz2/Ez≤0.080 is established, k_S1X further decreases. Similarly, even in a case where a relationship of Wz1+Wz2 is established, k_S1Z decreases as long as a relationship of 0.04≤Wz1/Ez≤0.076 and 0.04<Wz2/Ez≤0.076 is established. In a case where a relationship of 0.052≤Wz1/Ez≤0.074 and 0.052≤Wz2/Ez≤0.074 is established, k_S1Z further decreases. In a case where a relationship of 0.062≤Wz1/Ez≤0.072 and 0.062≤Wz2/Ez≤0.072 is established, k_S1Z further decreases.

In a case where a relationship of Wz/Ez=0.070±0.006 is established, k_S0 further increases, and k_S1X and k_S1Z further decrease. In particular, k_S0 is maximized in a case where a relationship of Wz/Ez=0.072 is established, k_S1X is minimized in a case where a relationship of Wz/Ez=0.079 is established, and k_S1Z is minimized in a case where a relationship of Wz/Ez=0.069 is established.

Even in a case where a relationship of Wz1+Wz2 is established, as long as a relationship of Wz1/Ez=0.070±0.006 and Wz2/Ez=0.070±0.006 is established, k_S0 further increases and k_S1X and k_S1Z further decrease.

Figure 27:
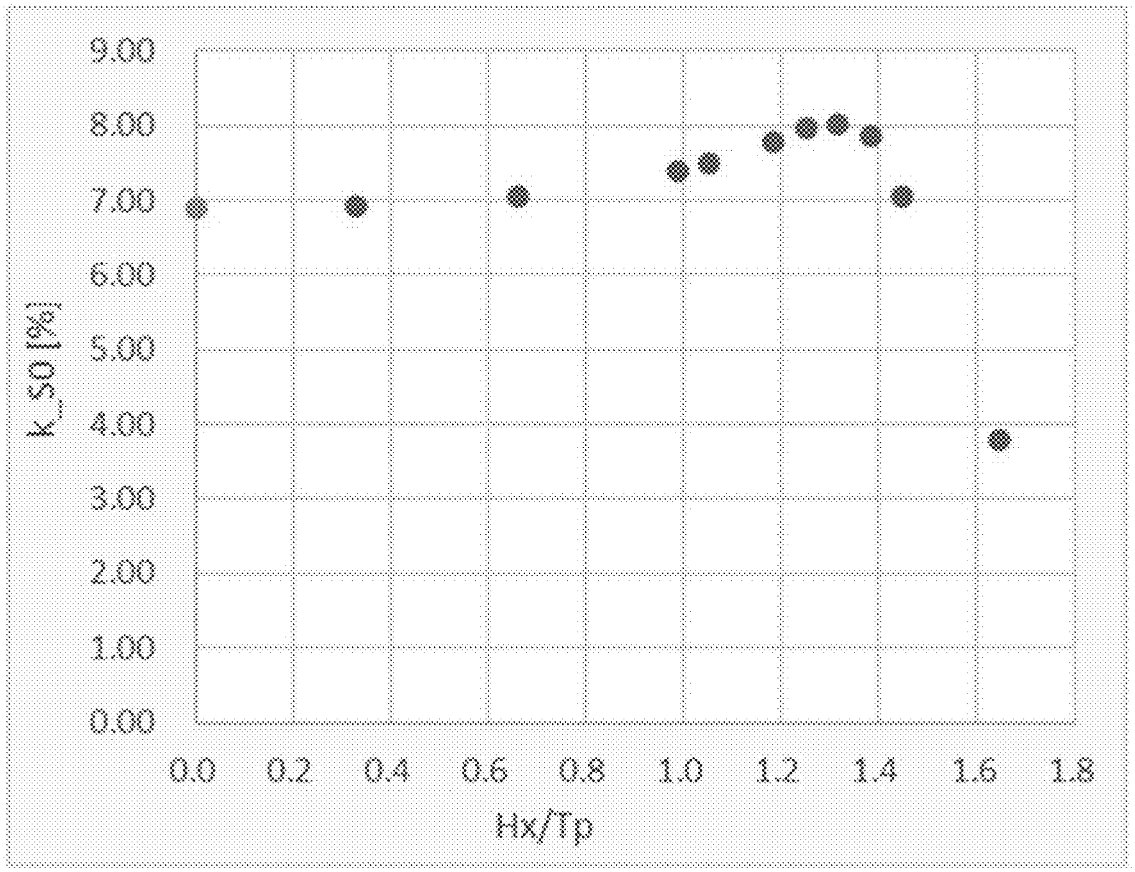
FIG. 27 is a graph showing an influence of a planar dimension of a hole in the first embodiment.
Figure 28:
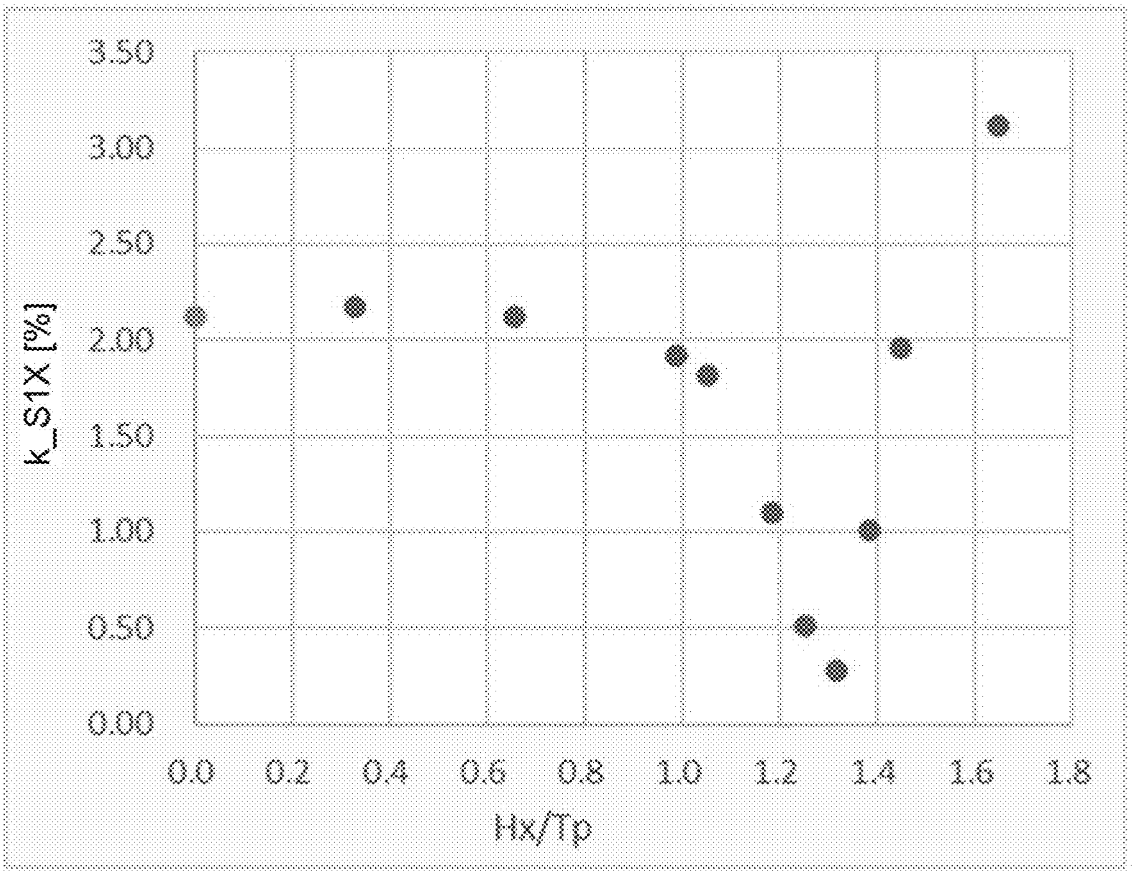
FIG. 28 is a graph showing an influence of a planar dimension of a hole in the first embodiment.
Figure 29:
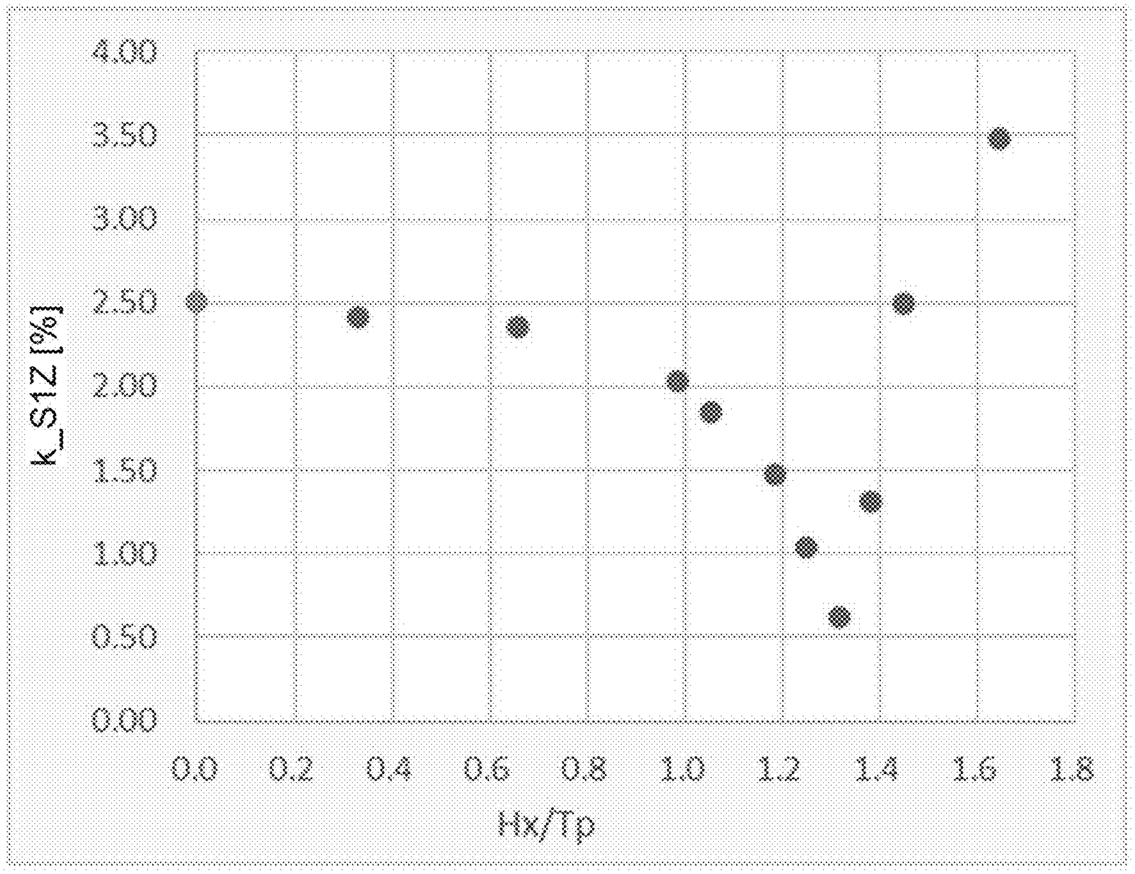
FIG. 29 is a graph showing an influence of a planar dimension of a hole in the first embodiment.

Next, an influence of the dimension of the hole H on the electromechanical coupling coefficient will be described with reference to FIG. 27 to FIG. 29. FIG. 27 to FIG. 29 are graphs showing an influence of the planar dimension of the hole H in the first embodiment. FIG. 27 to FIG. 29 are graphs showing changes in the electromechanical coupling coefficient in the example in a case where Hx/Tp=Hz/Tp=Hr/Tp is used as a variable. In Hx/Tp, Hx/Tp is changed by fixing Tp and changing Hx. A horizontal axis in FIG. 27 to FIG. 29 indicates Hx/Tp (=Hr/Tp). A vertical axis in the graph of FIG. 27 indicates k_S0, a vertical axis in the graph of FIG. 28 indicates k_S1X, and a vertical axis in the graph of FIG. 29 indicates k_S1Z. In a case where the shape of the hole His a square shape, Hr is a length of one side of the square shape, and in a case where the shape of the hole His a shape other than a square shape, Hr is a length of one side of a shape obtained by converting the shape of the hole H into a square shape while keeping the area constant.

In a case where a relationship of 0<Hr/Tp≤2.0 is established, a decrease rate of the electrostatic capacity due to the influence of the hole His suppressed to 1% or less. Therefore, the first excitation electrode 14*a* in the high acoustic velocity region 17 can be sufficiently functioned as the excitation electrode. Desirably, a relationship of 0<Hr/Tp≤1.5 is established, and more desirably, a relationship of 0<Hr/Tp≤1.0 is established. When 0<Hr/Tp≤1.5, the decrease rate of the electrostatic capacity can be suppressed to 0.5% or less, and when 0<Hr/Tp≤1.0, the decrease rate of the electrostatic capacity can be suppressed to 0.1% or less. In order to form the hole H with sufficient processing accuracy, desirably, 0.1≤Hr/Tp is established, and more desirably, 0.5≤Hr/Tp is established.

As shown in FIG. 27, in a case where a relationship of 0<Hx/Tp≤1.45 is established, k_S0 is larger than k_S0=6.87% when Hx/Tp=0. That is, 6.87%<k_S0 is satisfied. In order to further increase k_S0, desirably, a relationship of 1.00≤Hx/Tp≤1.43 is established, and more desirably, a relationship of 1.20≤Hx/Tp≤1.41 is established. As shown in FIG. 28, in a case where a relationship of 0.8≤Hx/Tp≤1.45 is established, k_S1X is smaller than k_S1X=2.17% when Hx/Tp=0. That is, k_S1X<2.17% is satisfied. In order to further decrease k_S1X, desirably, a relationship of 1.10≤Hx/Tp≤1.40 is established, and more desirably, a relationship of 1.20≤Hx/Tp≤1.38 is established. As shown in FIG. 29, in a case where a relationship of 0≤Hx/Tp≤1.45 is established, k_S1Z is smaller than k_S1Z=2.44% when Hx/Tp=0. That is, k_S1Z<2.44% is satisfied. In order to further decrease k_S1Z, desirably, a relationship of 1.00≤Hx/Tp≤1.42 is established, and more desirably, a relationship of 1.20≤Hx/Tp≤1.40 is established.

In a case where a relationship of Hx/Tp=1.3±0.1 is established, k_S0 further increases, and k_S1X and k_S1Z further decrease. In particular, k_S0 is maximized in a case where a relationship of Hx/Tp=1.3 is established, and k_S1X and k_S1Z are minimized in a case where a relationship of Hx/Tp=1.3 is established.

Figure 30:
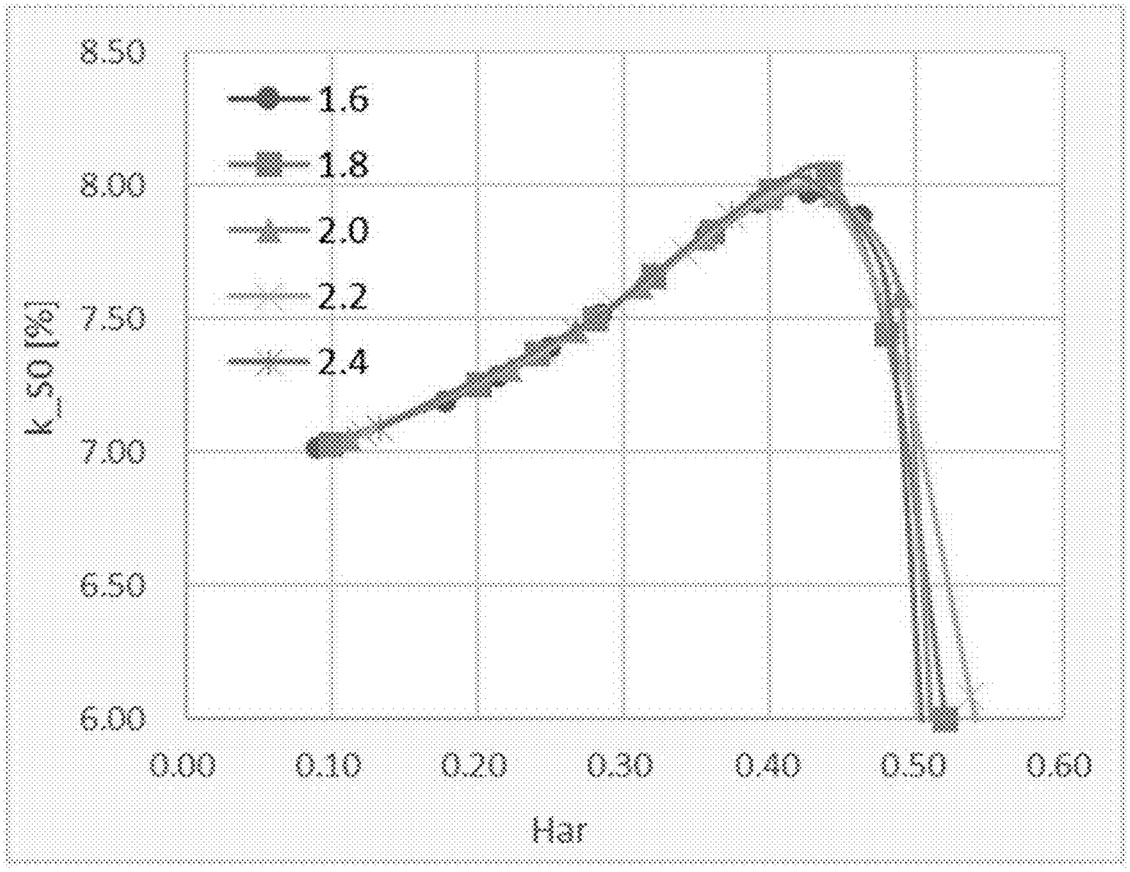
FIG. 30 is a graph showing an influence of an opening ratio of holes in the first embodiment.
Figure 31:
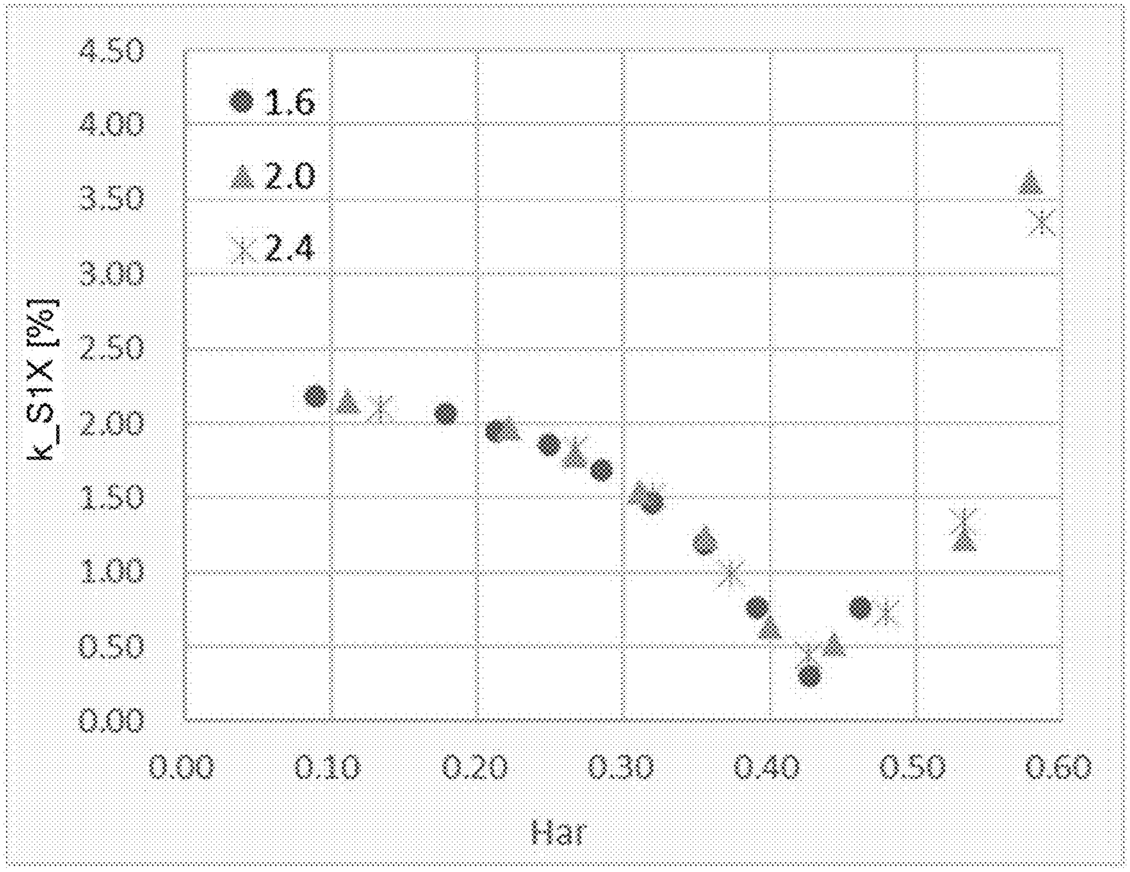
FIG. 31 is a graph showing an influence of an opening ratio of holes in the first embodiment.
Figure 32:
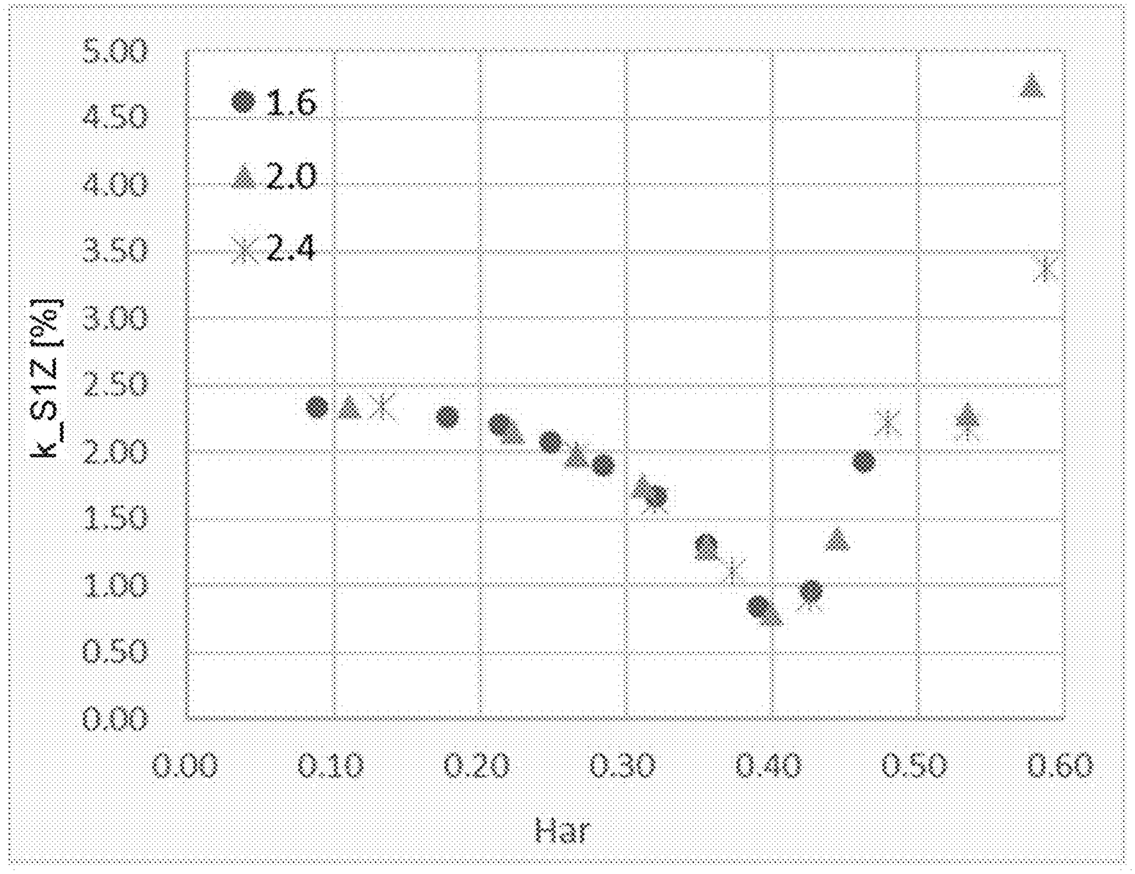
FIG. 32 is a graph showing an influence of an opening ratio of holes in the first embodiment.

Next, an influence of an opening ratio Har of the holes H on the electromechanical coupling coefficient will be described with reference to FIG. 30 to FIG. 32. FIG. 30 to FIG. 32 are graphs showing an influence of the opening ratio Har of the holes H in the first embodiment. FIG. 30 to FIG. 32 are graphs showing changes in the electromechanical coupling coefficient in the example in a case where Hx #Hz is set and the opening ratio Har represented by the following expression is set as a variable.

$$Har = (Hx/PHx) \times (Hz/PHz)$$

Hx=1.6 μm, 1.8 μm, 2.0 μm, 2.2 μm, and 2.4 μm

A horizontal axis in the graphs of FIG. 30 to FIG. 32 indicates Har. A vertical axis in the graph of FIG. 30 indicates k_S0, a vertical axis in the graph of FIG. 31 indicates k_S1X, and a vertical axis in the graph of FIG. 32 indicates k_S1Z. In the plot of the graph of FIG. 30, Har is changed by changing Hz at each of Hx=1.6 μm, 1.8 μm, 2.0 μm, 2.2 μm, and 2.4 μm. In the plots of the graphs in FIG. 31 and FIG. 32, Har is changed by changing Hz at each of Hx=1.6 μm, 2.0 μm, and 2.4 μm.

As shown in FIG. 30, in a case where a relationship of 0<Har≤0.50 is established, k_S0 increases, and 6.87%<k_S0 is satisfied. In order to further increase k_S0, desirably, a relationship of 0.10≤Har≤0.48 is established, more desirably, a relationship of 0.28≤Har≤0.46 is established, and still more desirably, a relationship of 0.28≤Har≤0.46 is established. As shown in FIG. 31, in a case where a relationship of 0<Har≤0.55 is established, k_S1X decreases, and k_S1X<2.17% is satisfied. In order to further decrease k_S1X, desirably, a relationship of 0.10≤Har≤0.53 is established, more desirably, a relationship of 0.32≤Har≤0.53 is established, and still more desirably, a relationship of 0.36≤Har≤0.50 is established. As shown in FIG. 32, in a case where a relationship of 0<Har≤0.50 is established, k_S1Z decreases, and k_S1Z<2.44% is satisfied. In order to further decrease k_S1Z, desirably, a relationship of 0.10≤Har≤0.46 is established, more desirably, a relationship of 0.33≤Har≤0.46 is established, and still more desirably, a relationship of 0.36≤Har≤0.43 is established.

In a case where a relationship of Har=0.40±0.06 is established, k_S0 further increases, and k_S1X and k_S1Z further decrease. In particular, k_S0 is maximized at Har=0.42, k_S1X is minimized at Har=0.42, and k_S1Z is minimized at Har=0.40.

As described above, according to the present embodiment, in the first low acoustic velocity region 18A and the second low acoustic velocity region 18B that are adjacent to the high acoustic velocity region 17 in the X axis direction among the low acoustic velocity regions 18, the dimension Wx1+Wx2 in the X axis direction is smaller than the dimension Ex−(Wx1+Wx2) of the high acoustic velocity region 17 in the X axis direction. In addition, in the third low acoustic velocity region 18C and the fourth low acoustic velocity region 18D that are adjacent to the high acoustic velocity region 17 in the Z' axis direction among the low acoustic velocity regions 18, the dimension Wz1+Wz2 in the Z' axis direction is smaller than the dimension Ez−(Wz1+Wz2) of the high acoustic velocity region 17 in the Z' axis direction. In addition, in plan view, the area S18 of the low acoustic velocity regions 18 is smaller than the area S17 of the high acoustic velocity region 17.

According to the configuration, it is possible to decrease the electromechanical coupling coefficients k_S1X and k_S1Z of the inharmonic spurious mode and increase the electromechanical coupling coefficient k_S0 of the main mode. Therefore, it is possible to provide the quartz crystal resonator 10 capable of improving the electromechanical coupling coefficients.

In addition, the high acoustic velocity region 17 and the low acoustic velocity regions 18 can be formed by the first excitation electrode 14*a* having a single layer structure. In a case of a configuration in which a first metal film having a uniform thickness is provided in a high acoustic velocity region and a low acoustic velocity region and then a second metal film is provided to form a low acoustic velocity region, a configuration in which a low acoustic velocity region is formed by providing a mass addition film made of an insulator, or the like, k_S0 may decrease due to manufacturing variations caused by misregistration of the second metal film or the mass addition film. On the other hand, according to the present embodiment, the first excitation electrode 14*a* can be provided with higher manufacturing accuracy than the first excitation electrode having a multi-layer structure. In addition, the influence of the misregistration of the plurality of holes H on k_S0 is smaller than the influence of the misregistration of the second metal film or the mass addition film on k_S0. Therefore, it is possible to provide the quartz crystal resonator 10 that is less affected by manufacturing variations.

In addition, since the plurality of holes H are formed, the mass of the first excitation electrode 14*a* can be decreased as compared with a case where the plurality of holes H are not formed. Therefore, the resonant frequency of the quartz crystal resonator 10 can be higher by an amount of the decrease in the mass of the first excitation electrode 14*a*.

In one aspect of the present embodiment, a relationship of $0<Wx1/Ex\leq 0.07$, $0<Wx2/Ex\leq 0.07$, $0<Wz1/Ez\leq 0.08$, and $0<Wz2/Ez\leq 0.08$ is established.

According to the configuration, it is possible to further decrease the electromechanical coupling coefficients k_S1X and k_S1Z of the inharmonic spurious mode and further increase the electromechanical coupling coefficient k_S0 of the main mode.

In one aspect of the present embodiment, a relationship of $Wx1/Ex=0.062\pm 0.006$, $Wx2/Ex=0.062\pm 0.006$, $Wz1/Ez=0.070\pm 0.006$, and $Wz2/Ez=0.070\pm 0.006$ is established.

According to the configuration, it is possible to further decrease the electromechanical coupling coefficients k_S1X and k_S1Z of the inharmonic spurious mode and further increase the electromechanical coupling coefficient k_S0 of the main mode.

In one aspect of the present embodiment, a relationship of $0<Hr/Tp\leq 2.0$ is established.

According to the configuration, the decrease rate of the electrostatic capacity due to the influence of the hole H can be suppressed to 1% or less, and the first excitation electrode 14*a* in the high acoustic velocity region 17 can be sufficiently functioned as the excitation electrode.

In one aspect of the present embodiment, a relationship of $0<Hr/Tp\leq 1.45$ is established.

According to the configuration, it is possible to further decrease the electromechanical coupling coefficients k_S1X and k_S1Z of the inharmonic spurious mode and further increase the electromechanical coupling coefficient k_S0 of the main mode.

In one aspect of the present embodiment, a relationship of $Hr/Tp=1.3\pm 0.1$ is established.

According to the configuration, it is possible to further decrease the electromechanical coupling coefficients k_S1X and k_S1Z of the inharmonic spurious mode and further increase the electromechanical coupling coefficient k_S0 of the main mode.

In one aspect of the present embodiment, a relationship of $0<Har\leq 0.5$ is established.

According to the configuration, it is possible to further decrease the electromechanical coupling coefficients k_S1X and k_S1Z of the inharmonic spurious mode and further increase the electromechanical coupling coefficient k_S0 of the main mode.

In one aspect of the present embodiment, a relationship of $Har=0.4\pm 0.06$ is established.

According to the configuration, it is possible to further decrease the electromechanical coupling coefficients k_S1X and k_S1Z of the inharmonic spurious mode and further increase the electromechanical coupling coefficient k_S0 of the main mode.

Hereinafter, other embodiments will be described. The same or similar configurations as the configurations described in the first embodiment are denoted by the same or similar reference numerals, and descriptions thereof are appropriately omitted. Further, the same operation and effect according to the same configuration will not be sequentially mentioned.

Second Embodiment

Figure 33:
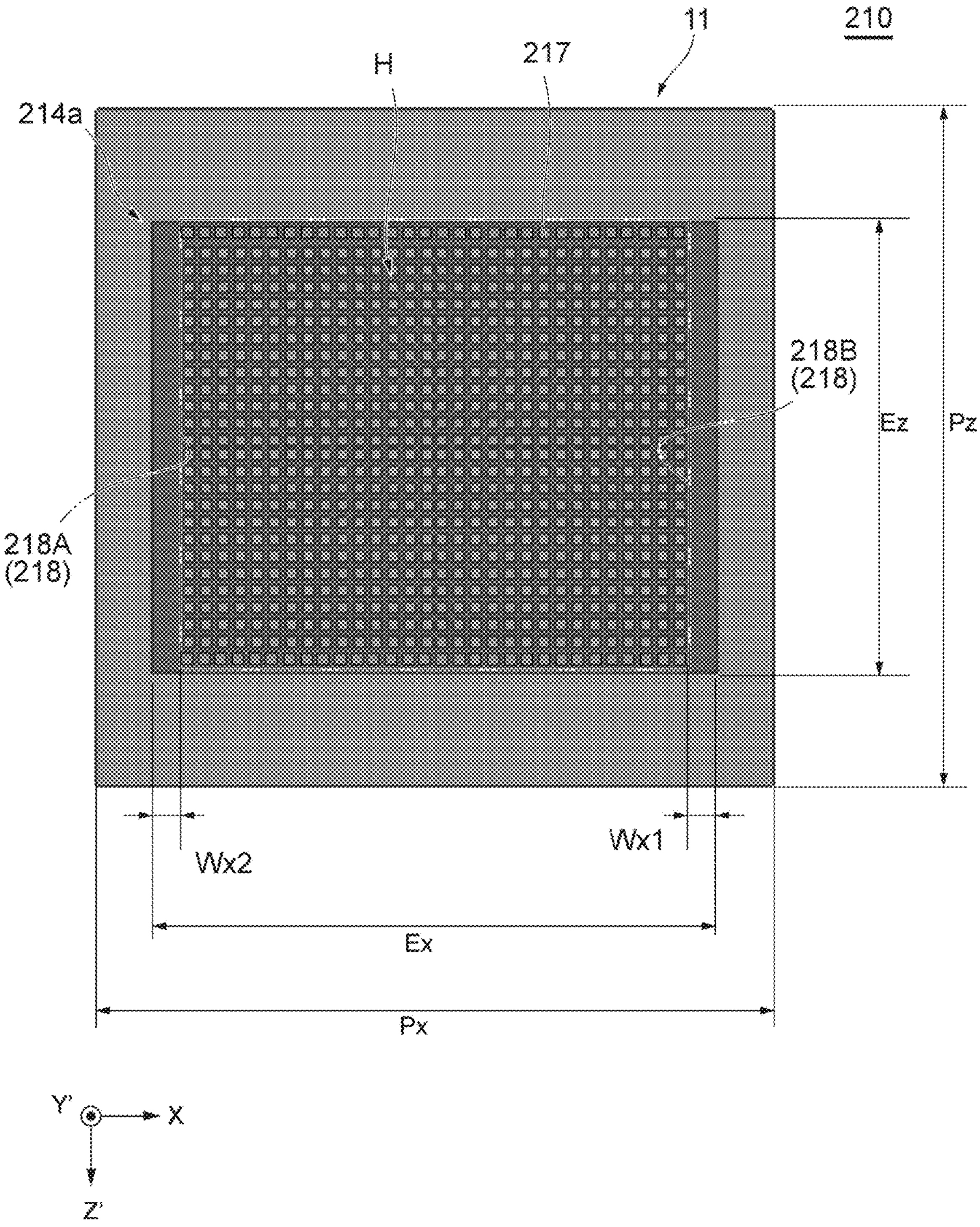
FIG. 33 is a plan view of a quartz crystal resonator according to a second embodiment.

Next, a configuration of the quartz crystal resonator 210 according to a second embodiment will be described with reference to FIG. 33. FIG. 33 is a cross-sectional view of the quartz crystal resonator 210 according to the second embodiment.

As illustrated in FIG. 33, the quartz crystal resonator 210 includes a high acoustic velocity region 217, a first low acoustic velocity region 218A, and a second low acoustic velocity region 218B. In plan view, the high acoustic velocity region 217 is provided in a band-shaped region that is the center portion of the first excitation electrode 214*a* in the X axis direction and extends in the Z' axis direction. The first low acoustic velocity region 218A is provided in a band-shaped region that is adjacent to the high acoustic velocity region 217 in the negative X axis direction and extends in the Z' axis direction. The second low acoustic velocity region 218B is provided in a band-shaped region that is adjacent to the high acoustic velocity region 217 in the positive X axis direction and extends in the Z' axis direction. In plan view, the high acoustic velocity region 217, the first low acoustic velocity region 218A, and the second low acoustic velocity region 218B are provided across the entire width of the first excitation electrode 214*a* from the end portion of the first excitation electrode 214*a* in the negative Z' axis direction to the end portion of the first excitation electrode 214*a* in the positive Z' axis direction.

Figure 34:
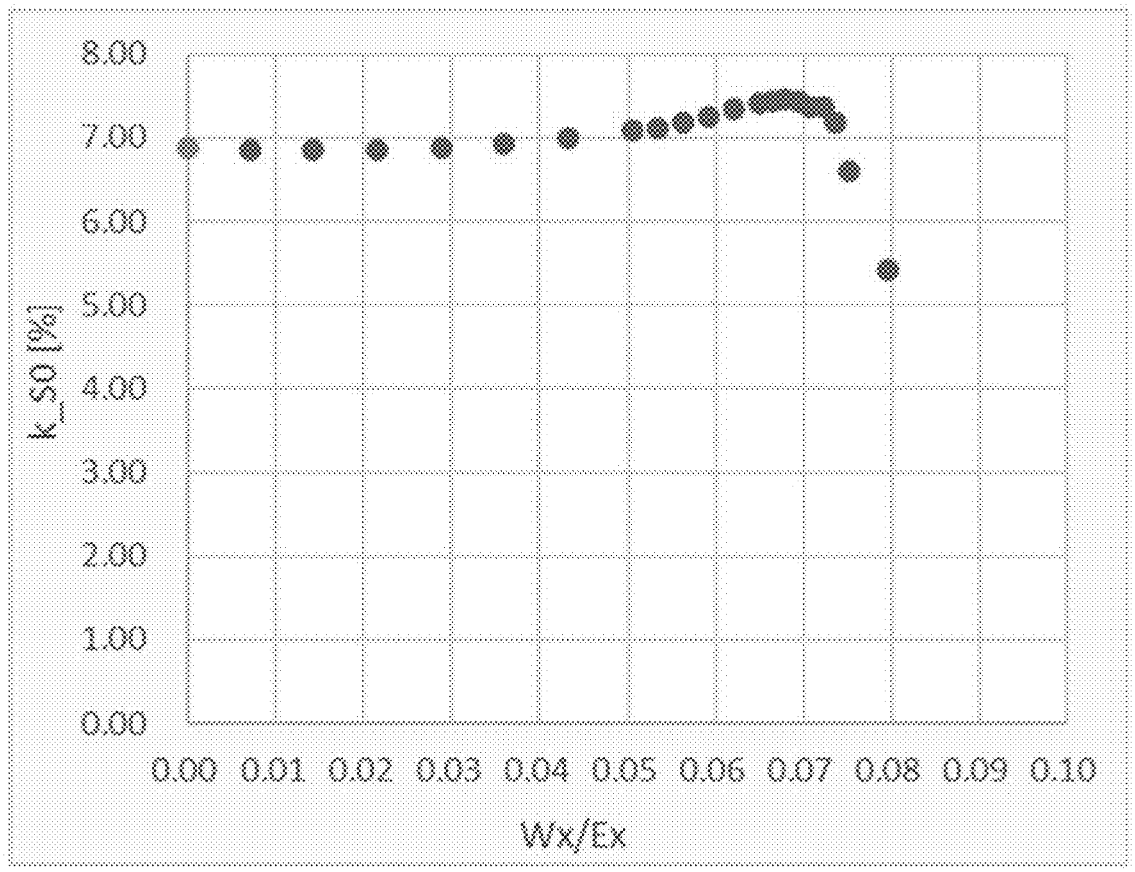
FIG. 34 is a graph showing an influence of a dimension of a low acoustic velocity region in the second embodiment.
Figure 35:
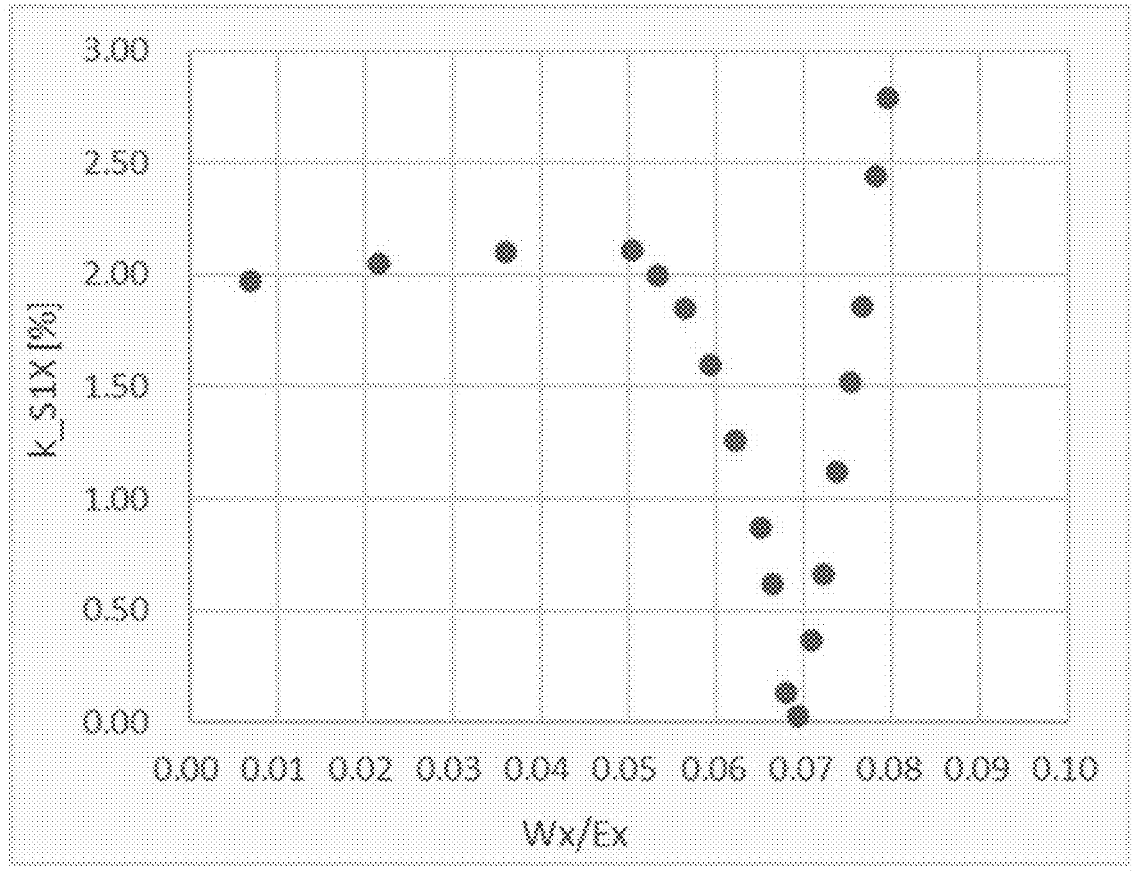
FIG. 35 is a graph showing an influence of a dimension of a low acoustic velocity region in the second embodiment.
Figure 36:
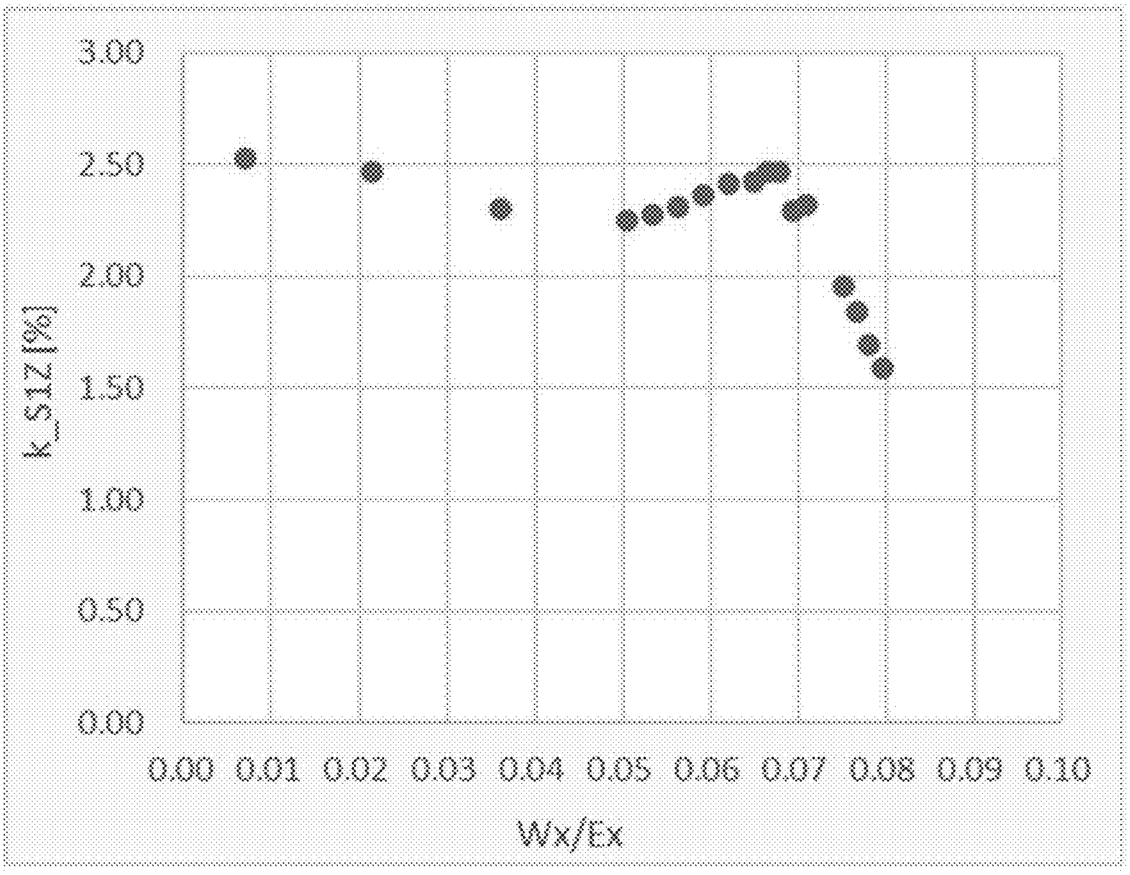
FIG. 36 is a graph showing an influence of a dimension of a low acoustic velocity region in the second embodiment.

Next, an influence of the dimension of the low acoustic velocity region 218 on the electromechanical coupling coefficient will be described with reference to FIG. 34 to FIG. 36. FIG. 34 to FIG. 36 are graphs showing an influence of the dimension of the low acoustic velocity region 218 in the second embodiment.

FIG. 34 to FIG. 36 are graphs showing changes in the electromechanical coupling coefficient in a case where $Wx1/Ex=Wx2/Ex=Wx/Ex$ is defined as a variable and $Wz1/Ez=Wz2/Ez=Wz/Ez=0$ (constant) is defined in the example according to the first embodiment. A horizontal axis in the graphs of FIG. 34 to FIG. 36 indicates Wx/Ex. A vertical axis in the graph of FIG. 34 indicates k_S0, a vertical axis in the graph of FIG. 35 indicates k_S1X, and a vertical axis in the graph of FIG. 36 indicates k_S1Z.

As shown in FIG. 34, in a case where a relationship of $0<Wx/Ex\leq 0.074$ is established, k_S0 increases, and $6.87\%<$k_S0 is satisfied. In order to further increase k_S0, desirably, a relationship of $0.040\leq Wx/Ex\leq 0.074$ is established. As shown in FIG. 35, in a case where a relationship of $0<Wx/Ex\leq 0.076$ is established, k_S1X decreases, and k_S1X$<2.17\%$ is satisfied. In order to further decrease k_S1X, desirably, a relationship of $0.052\leq Wx/Ex\leq 0.076$ is established, and more desirably, a relationship of $0.064\leq Wx/Ex\leq 0.073$ is established. As shown in FIG. 36, in a case where a relationship of $0.030\leq Wx/Ex\leq 0.060$ or $0.070\leq Wx/Ex\leq 0.080$ is established, k_S1Z decreases, and k_S1Z$<2.44\%$ is satisfied.

Even in a case where a relationship of Wx1+Wx2 is established, k_S0 increases as long as a relationship of $0<Wx1/Ex\leq 0.074$ and $0<Wx2/Ex\leq 0.074$ is established. In a case where a relationship of $0.04\leq Wx1/Ex\leq 0.074$ and $0.04\leq Wx2/Ex\leq 0.074$ is established, k_S0 further increases. Similarly, even in a case where a relationship of Wx1/Wx2 is established, k_S1X decreases as long as a relationship of $0.00<Wx1/Ex\leq 0.076$ and $0.00<Wx2/Ex\leq 0.076$ is established. In a case where a relationship of $0.052\leq Wx1/Ex\leq 0.076$ and $0.052\leq Wx2/Ex\leq 0.076$ is established, k_S1X further decreases. In a case where a relationship of $0.064\leq Wx1/Ex\leq 0.073$ and $0.064\leq Wx2/Ex\leq 0.073$ is established, k_S1X further decreases. Similarly, even in a case where a relationship of Wx1+Wx2 is established, k_S1Z decreases in a case where a relationship of $0.030\leq Wx1/Ex\leq 0.060$ and $0.030\leq Wx2/Ex\leq 0.060$ is established, in a case where a relationship of $0.030\leq Wx1/Ex\leq 0.060$ and $0.070\leq Wx2/Ex\leq 0.080$ is established, in a case where a relationship of $0.070\leq Wx1/Ex\leq 0.080$ and $0.030\leq Wx2/Ex\leq 0.060$ is established, or in a case where a relationship of $0.070\leq Wx1/Ex\leq 0.080$ and $0.070\leq Wx2/Ex\leq 0.080$ is established.

In a case where a relationship of $Wx/Ex=0.066\pm 0.006$ is established, k_S0 further increases, and k_S1X further decreases. In particular, k_S0 is maximized at $Wx/Ex=0.068$, and k_S1X is minimized at $Wx/Ex=0.07$.

Even in a case where a relationship of Wx1+Wx2 is established, as long as a relationship of $Wx1/Ex=0.066\pm 0.006$ and $Wx2/Ex=0.066\pm 0.006$ is established, k_S0 further increases and k_S1X and k_S1Z further decrease.

As described above, according to the present embodiment, a relationship of $Wz1=Wz2=0$ and $0<Wx1/Ex\leq 0.074$ and $0<Wx2/Ex\leq 0.074$ is established.

According to the configuration, it is possible to decrease the electromechanical coupling coefficient k_S1X of the inharmonic spurious mode and increase the electromechanical coupling coefficient k_S0 of the main mode.

In one aspect of the present embodiment, a relationship of $Wx1/Ex=0.066\pm 0.006$ and $Wx2/Ex=0.066\pm 0.006$ is established.

According to the configuration, it is possible to further decrease the electromechanical coupling coefficient k_S1X of the inharmonic spurious mode and further increase the electromechanical coupling coefficient k_S0 of the main mode.

Third Embodiment

Figure 37:
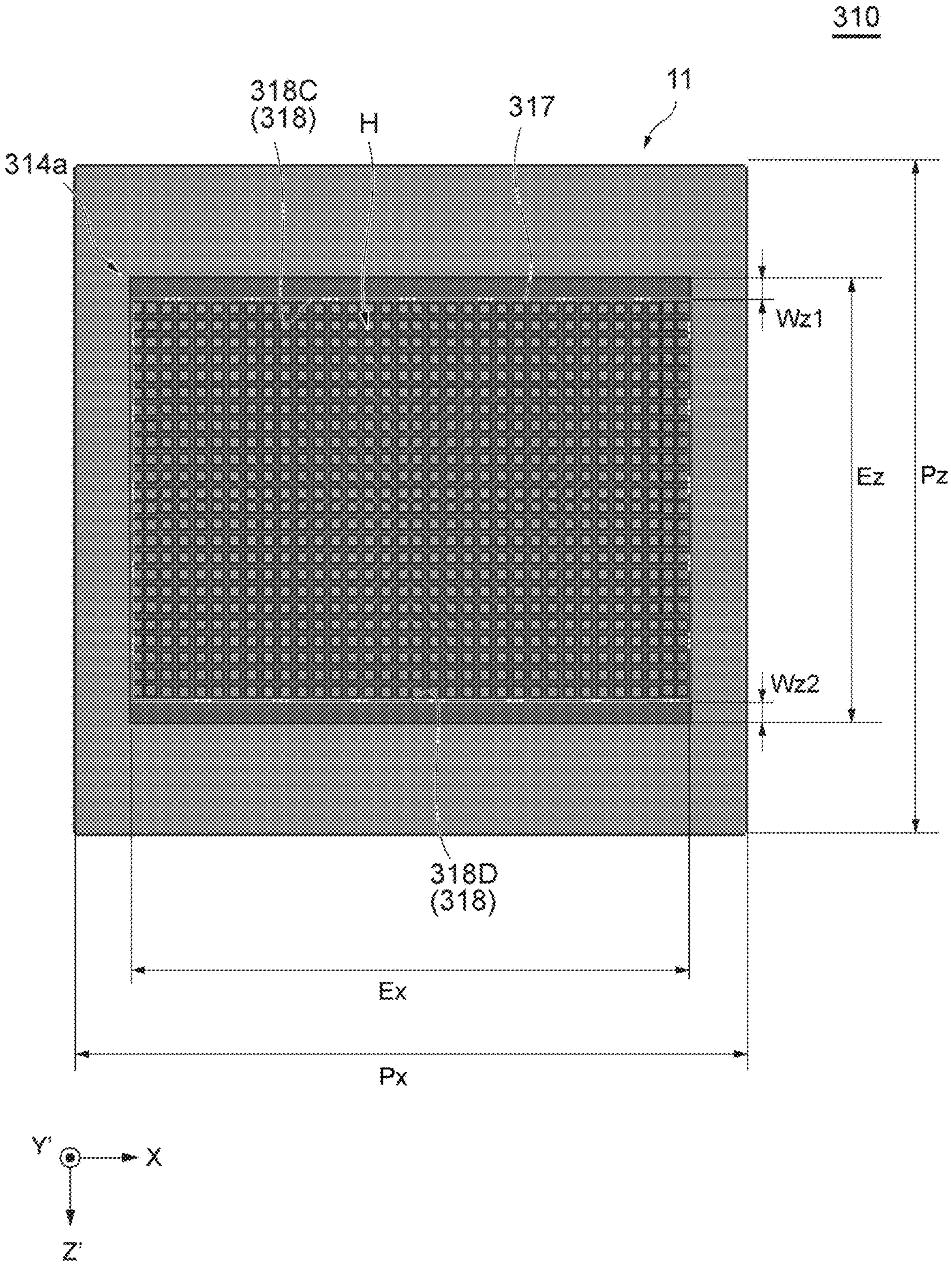
FIG. 37 is a plan view of a quartz crystal resonator according to a third embodiment.

Next, a configuration of the quartz crystal resonator 310 according to a third embodiment will be described with reference to FIG. 37. FIG. 37 is a cross-sectional view of the quartz crystal resonator 310 according to the third embodiment.

As illustrated in FIG. 37, the quartz crystal resonator 310 includes a high acoustic velocity region 317, a third low acoustic velocity region 318C, and a fourth low acoustic velocity region 318D. In plan view, the high acoustic velocity region 317 is provided in a band-shaped region that is the center portion of the first excitation electrode 314*a* in the Z' axis direction and extends in the X axis direction. The third low acoustic velocity region 318C is provided in a band-shaped region that is adjacent to the high acoustic velocity region 317 in the negative Z' axis direction and extends in the X axis direction. The fourth low acoustic velocity region 318D is provided in a band-shaped region that is adjacent to the high acoustic velocity region 317 in the positive X axis direction and extends in the X axis direction. In plan view, the high acoustic velocity region 317, the third low acoustic velocity region 318C, and the fourth low acoustic velocity region 318D are provided across the entire width of the first excitation electrode 314*a* from the end portion of the first excitation electrode 314*a* in the negative X axis direction to the end portion of the first excitation electrode 314*a* in the positive X axis direction.

Figure 38:
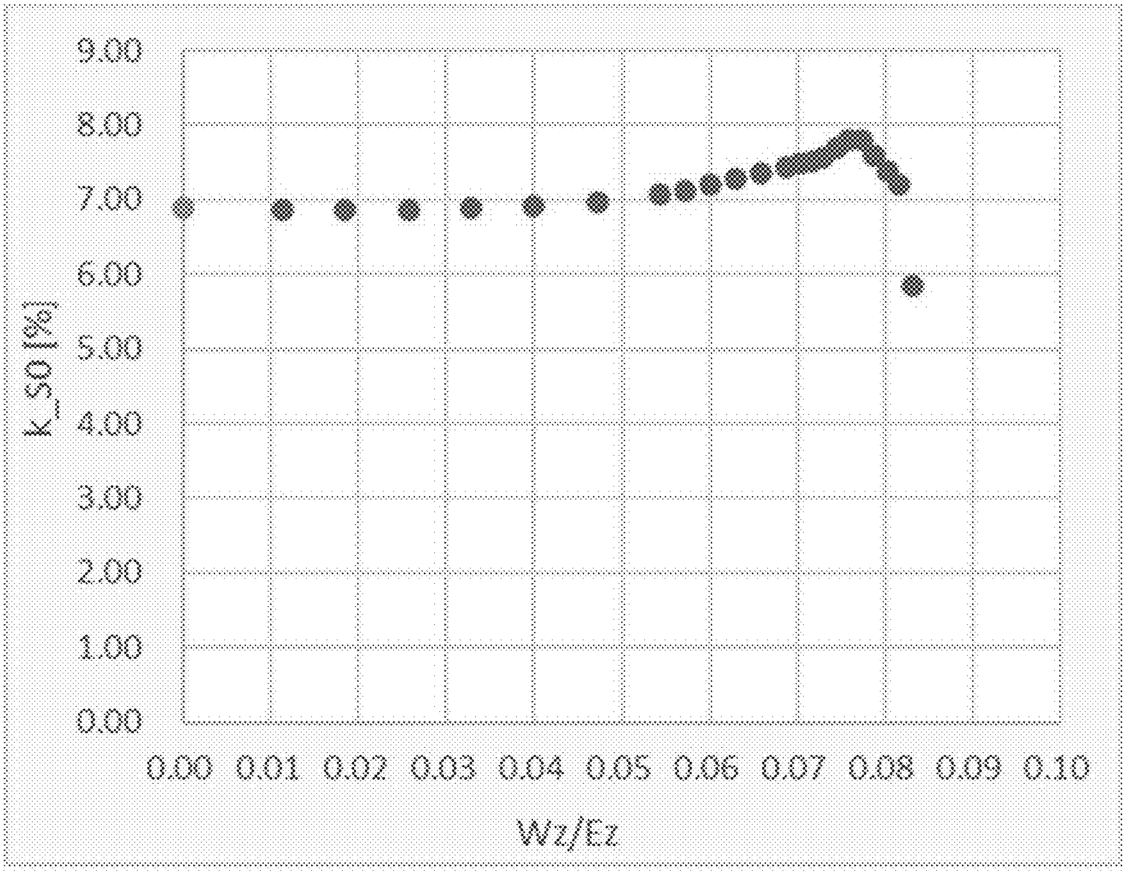
FIG. 38 is a graph showing an influence of a dimension of a low acoustic velocity region in the third embodiment.
Figure 39:
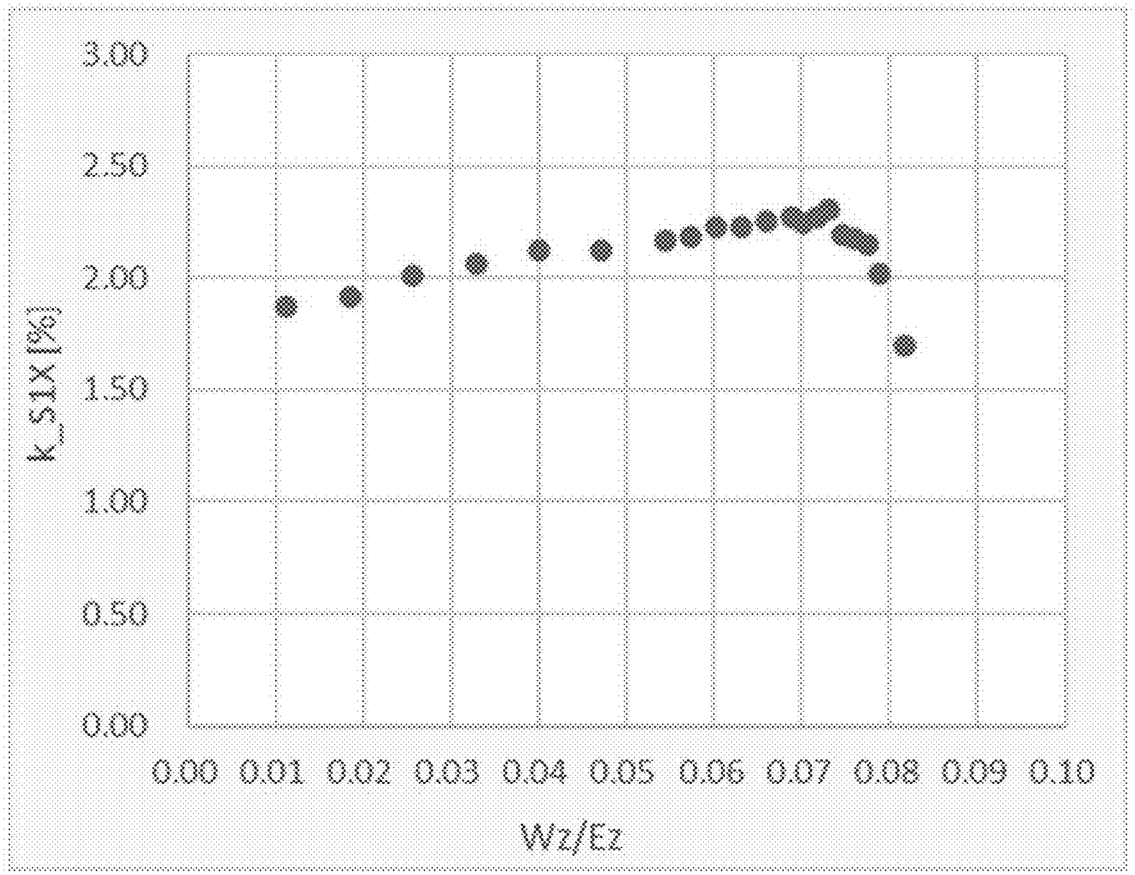
FIG. 39 is a graph showing an influence of a dimension of a low acoustic velocity region in the third embodiment.
Figure 40:
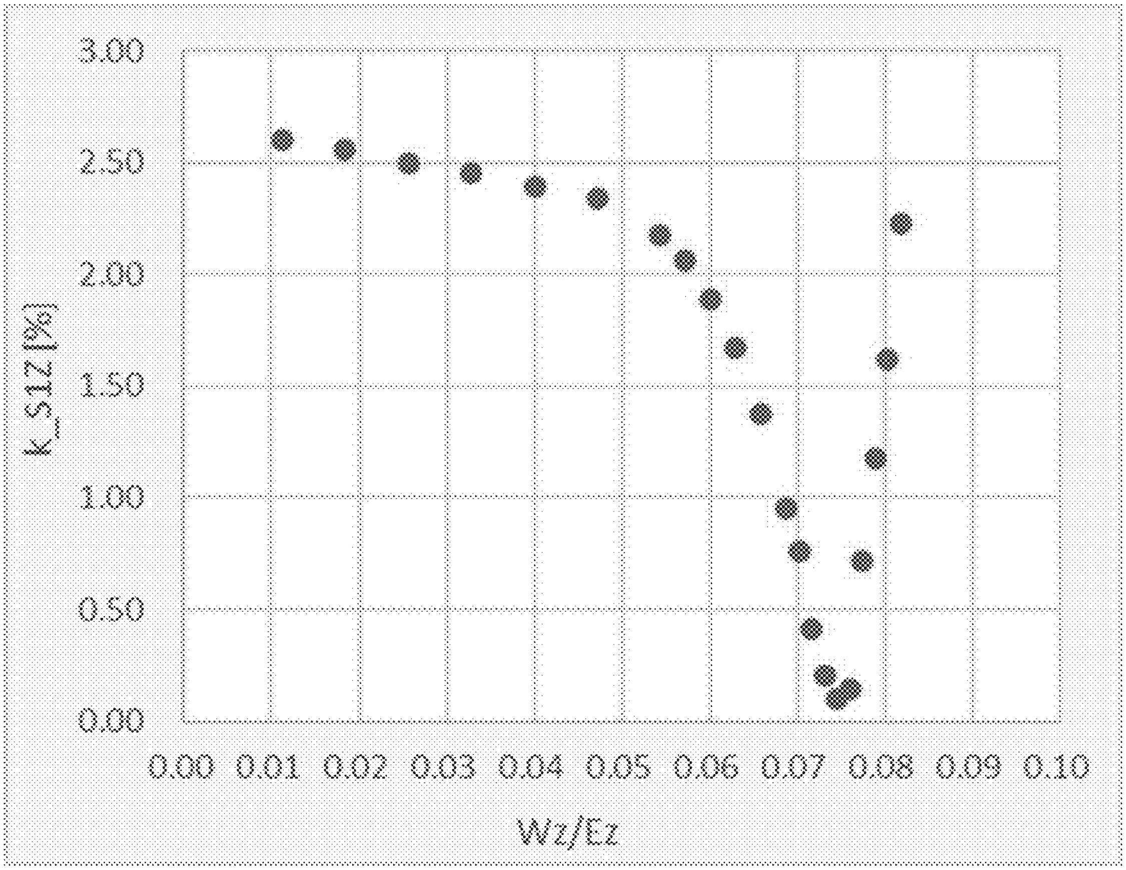
FIG. 40 is a graph showing an influence of a dimension of a low acoustic velocity region in the third embodiment.

Next, an influence of the dimension of the low acoustic velocity region 318 on the electromechanical coupling coefficient will be described with reference to FIG. 38 to FIG. 40. FIG. 38 to FIG. 40 are graphs showing an influence of the dimension of the low acoustic velocity region 318 in the third embodiment.

FIG. 38 to FIG. 40 are graphs showing changes in the electromechanical coupling coefficient in a case where $Wx1/Ex=Wx2/Ex=Wx/Ex=0$ (constant) is defined and $Wz1/Ez=Wz2/Ez=Wz/Ez$ is defined as a variable in the example according to the first embodiment. A horizontal axis in the graphs of FIG. 38 to FIG. 40 indicates Wz/Ez. A vertical axis in the graph of FIG. 38 indicates k_S0, a vertical axis in the graph of FIG. 39 indicates k_S1X, and a vertical axis in the graph of FIG. 40 indicates k_S1Z.

As shown in FIG. 38, in a case where a relationship of $0<Wz/Ez\leq 0.082$ is established, k_S0 increases, and $6.87\%<$k_S0 is satisfied. In order to further increase k_S0, desirably, a relationship of $0.050\leq Wz/Ez\leq 0.082$ is established. As shown in FIG. 39, in a case where a relationship of $0<Wz/Ez\leq 0.050$ or $0.078\leq Wz/Ez\leq 0.82$ is established, k_S1X decreases, and k_S1X$<2.17\%$ is satisfied. As shown in FIG. 40, in a case where a relationship of $0.040\leq Wz/Ez\leq 0.082$ is established, k_S1Z decreases, and k_S1Z$<2.44\%$ is satisfied. In order to further decrease k_S1Z, desirably, a relationship of $0.06\leq Wz/Ez\leq 0.08$ is established, and more desirably, a relationship of $0.068\leq Wz/Ez\leq 0.078$ is established.

Even in a case where a relationship of Wz1/Wz2 is established, k_S0 increases as long as a relationship of $0<Wz1/Ez\leq 0.082$ and $0<Wz2/Ez\leq 0.082$ is established. In a case where a relationship of $0.050\leq Wz1/Ez\leq 0.082$ and $0.050\leq Wz2/Ez\leq 0.082$ is established, k_S0 further increases. Similarly, even in a case where a relationship of Wz1+Wz2 is established, k_S1X decreases in a case where a relationship of $0<Wz1/Ez\leq 0.050$ and $0<Wz2/Ez\leq 0.050$ is established, in a case where a relationship of $0<Wz1/Ez\leq 0.050$ and $0.078\leq Wz2/Ez\leq 0.82$ is established, in a case where a relationship of $0.078\leq Wz1/Ez\leq 0.82$ and $0<Wz2/Ez\leq 0.050$ is established, or in a case where a relationship of $0.078\leq Wz1/Ez\leq 0.82$ and $0.078\leq Wz2/Ez\leq 0.82$ is established. Similarly, even in a case where a relationship of $Wx1\neq Wx2$ is established, k_S1Z decreases as long as a relationship of $0.040 \leq Wz1/Ez \leq 0.082$ and $0.040 < Wz2/Ez \leq 0.082$ is established. In a case where a relationship of $0.060 \leq Wz1/Ez \leq 0.080$ and $0.060 \leq Wz2/Ez \leq 0.080$ is established, k_S1Z further decreases.

In a case where a relationship of $Wz/Ez = 0.074 \pm 0.006$ is established, k_S0 further increases, and k_S1Z further decreases. In particular, k_S0 is maximized at $Wz/Ez = 0.076$, and k_S1Z is minimized at $Wz/Ez = 0.075$.

Even in a case where a relationship of Wz1+Wz2 is established, as long as a relationship of $Wx1/Ex = 0.074 \pm 0.006$ and $Wx2/Ex = 0.074 \pm 0.006$ is established, k_S0 further increases and k_S1Z further decreases.

As described above, according to the present embodiment, a relationship of $Wx1 = Wx2 = 0$, $0 < Wx1/Ex \leq 0.082$, and $0 < Wx2/Ex \leq 0.082$ is established.

According to the configuration, it is possible to decrease the electromechanical coupling coefficient k_S1Z of the inharmonic spurious mode and increase the electromechanical coupling coefficient k_S0 of the main mode.

In one aspect of the present embodiment, a relationship of $Wz1/Ez = 0.074 = 0.006$ and $Wz2/Ez = 0.074 = 0.006$ is established.

According to the configuration, it is possible to further decrease the electromechanical coupling coefficient k_S1Z of the inharmonic spurious mode and further increase the electromechanical coupling coefficient k_S0 of the main mode.

Fourth Embodiment

Figure 41:
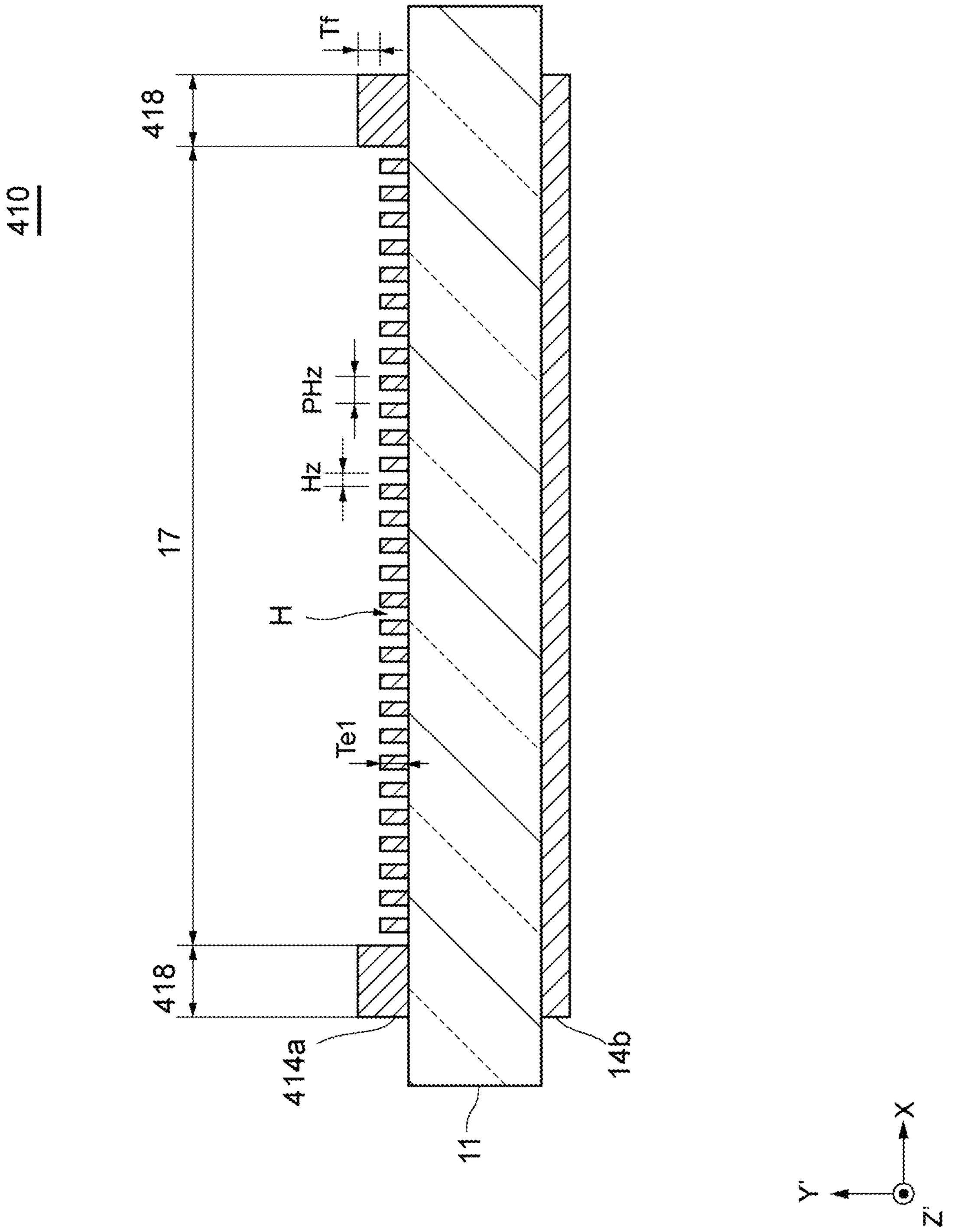
FIG. 41 is a cross-sectional view of a quartz crystal resonator according to a fourth embodiment.

Next, a configuration of the quartz crystal resonator 410 according to a fourth embodiment will be described with reference to FIG. 41. FIG. 41 is a cross-sectional view of the quartz crystal resonator 410 according to the fourth embodiment.

The thickness Te1+Tf of the first excitation electrode 414*a* in the low acoustic velocity region 418 is thicker than the thickness Te1 of the first excitation electrode 414*a* in the high acoustic velocity region 417 in a case where it is assumed that the holes H are excluded. A first metal film having a thickness Te1 and a second metal film having a thickness Tf are laminated on the first excitation electrode 414*a* in the low acoustic velocity region 418. The first metal film extends from the low acoustic velocity region 418 to the high acoustic velocity region 417. A material of the second metal film is, for example, the same as a material of the first metal film. The thickness Tf of the second metal film is, for example, thinner than the thickness Te1 of the first metal film.

As described above, according to the present embodiment, the thickness Te1+Tf of the first excitation electrode 414*a* in the low acoustic velocity region 418 is thicker than the thickness Te1 of the first excitation electrode 414*a* in the high acoustic velocity region 417 in a case where it is assumed that the plurality of holes H are excluded.

According to the configuration, the mass difference between the low acoustic velocity region 418 and the high acoustic velocity region 417 is further increased by the thickness Tf. Therefore, it is possible to further decrease the electromechanical coupling coefficients k_S1X and k_S1Z of the inharmonic spurious mode and further increase the electromechanical coupling coefficient k_S0 of the main mode.

In addition, the thickness and the material of the second metal film are not limited to the thickness and the material described above. The thickness of the second metal film may be the same as the thickness of the first metal film, or may be thicker than the thickness of the first metal film. The material of the second metal film may be different from the material of the first metal film. For example, by setting the material of the second metal film to a material having a larger specific gravity than the material of the first metal film, the mass difference between the low acoustic velocity region and the high acoustic velocity region can be further increased. In addition, instead of the second metal film, a mass addition film made of a non-metallic conductive material or an insulating material may be provided. In addition, the second metal film or the mass addition film may be provided between the quartz crystal element and the first metal film. In addition, a multi-layer film including at least one of a metal film or a mass addition film may be provided on at least one side of the first metal film on the quartz crystal element side in the low acoustic velocity region, or a side opposite to the first metal film.

Fifth Embodiment

Figure 42:
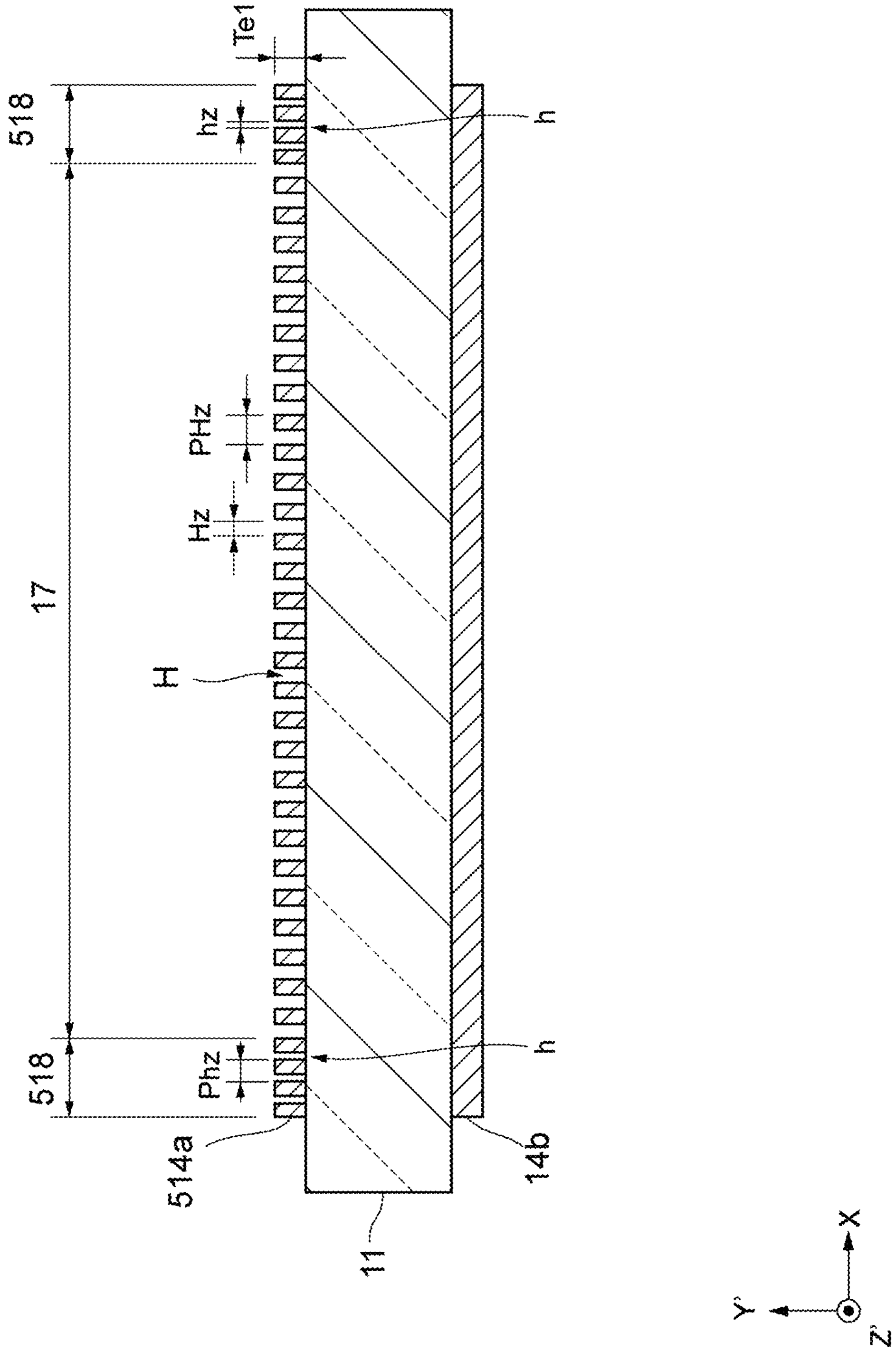
FIG. 42 is a cross-sectional view of a quartz crystal resonator according to a fifth embodiment.

Next, a configuration of the quartz crystal resonator 510 according to a fifth embodiment will be described with reference to FIG. 42. FIG. 42 is a cross-sectional view of the quartz crystal resonator 510 according to the fifth embodiment.

A plurality of sub holes h are formed on the first excitation electrode 514*a* in the low acoustic velocity region 518. The sub hole h is a through hole that penetrates the first excitation electrode 514*a* in the Y' axis direction. Here, the sub hole h is not limited to the through hole, and may be a groove shape with a bottom that is open in the Y' axis direction.

A dimension of the sub hole h in the Z' axis direction is defined as hz, and a dimension of the sub hole h in the X axis direction is defined as hx. A planar shape of the sub hole h is a square shape having a side extending along the Z' axis direction and a side extending along the X axis direction. That is, hz=hx. In FIG. 42, hx is omitted.

The planar shape of the sub hole h is not limited to a square shape, and may be a rectangular shape satisfying hz<hx or a rectangular shape satisfying hx<hz. The planar shape of the sub hole h may be a rectangular shape having a side extending in a direction intersecting with the X axis direction and the Y' axis direction. In addition, the planar shape of the sub hole h may be a polygonal shape, a circular shape, an elliptical shape, or a combination thereof.

A pitch of the plurality of sub holes h in the Z' axis direction, that is, a distance between the end portions of two sub holes h, which are adjacent to each other in the Z' axis direction and are on the negative Z' axis direction side, is defined as Phz. A pitch of the sub holes h in the X axis direction, that is, a distance between the end portions of two sub holes h, which are adjacent to each other in the X axis direction and are on the negative X axis direction side, is defined as Phx. The plurality of sub holes h are disposed at equal intervals in each of the Z' axis direction and the X axis direction. That is, Phz=Phx. In FIG. 42, Phx is omitted.

The pitch of the plurality of sub holes h is not limited to the pitch described above, and may be Phz<Phx or Phx<Phz. Further, the direction in which the plurality of sub holes h are disposed is not limited to the Z' axis direction and the X axis direction, and the plurality of sub holes h may be disposed in a direction that intersects with the Z' axis direction and the X axis direction. The plurality of sub holes h may be disposed in a zigzag shape. In addition, the plurality of sub holes h may be randomly disposed.

In the present embodiment, the length hx=hz of one side of the sub hole h is shorter than the length Hx=Hz of one side of the hole H (hx=hz<Hx=Hz). In addition, in the present embodiment, the pitch Phz of the plurality of sub holes h is the same as the pitch PHz of the plurality of holes H (Phz≈PHz), and the pitch Phx of the plurality of sub holes h is the same as the pitch PHx of the plurality of holes H (Phx≈PHx). Thereby, the opening ratio har of the sub holes h that is represented by the expression har=(hx/Phx)×(hz/Phz) is lower than the opening ratio Har of the holes H (har<Har).

According to the configuration, the sub holes h are formed on the first excitation electrode 514*a* in the low acoustic velocity region 518, and thus, the total mass of the first excitation electrode 514*a* is further decreased. Therefore, the resonant frequency of the quartz crystal resonator 510 can be further higher.

Sixth Embodiment

Figure 43:
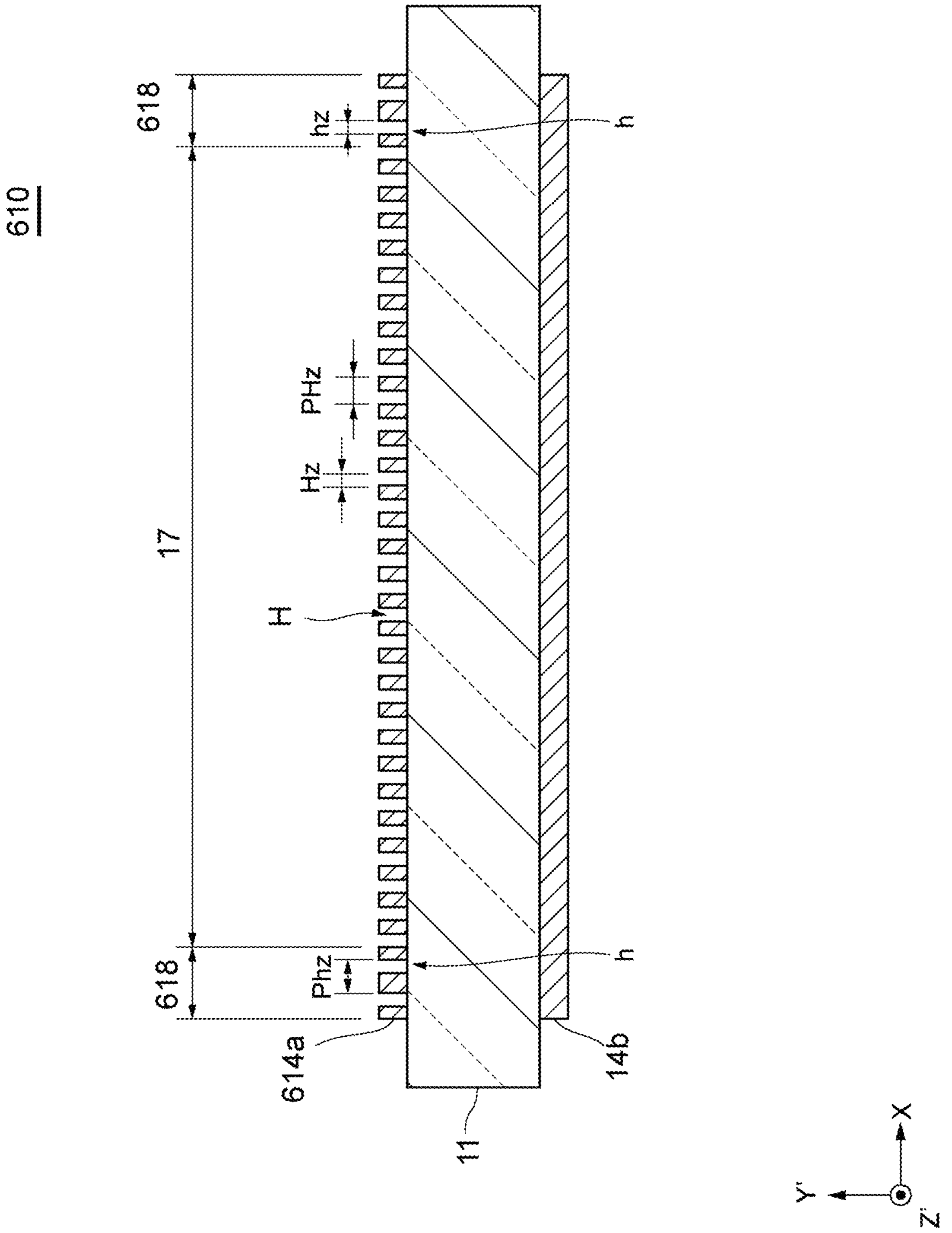
FIG. 43 is a cross-sectional view of a quartz crystal resonator according to a sixth embodiment.

Next, a configuration of the quartz crystal resonator 610 according to a sixth embodiment will be described with reference to FIG. 43. FIG. 43 is a cross-sectional view of the quartz crystal resonator 610 according to the sixth embodiment.

In the present embodiment, the length hx=hz of one side of the sub hole h is the same as the length Hx=Hz of one side of the hole H (hx=hz=Hx=Hz). In addition, in the present embodiment, the pitch Phz of the plurality of sub holes h is larger than the pitch PHz of the plurality of holes H (PHz<Phz), and the pitch Phx of the plurality of sub holes h is larger than the pitch PHx of the plurality of holes H (PHx<Phx). Thereby, the opening ratio har of the sub holes h is lower than the opening ratio Har of the holes H (har<Har). In FIG. 43, hx is omitted, and Phx is omitted.

The configuration in which a relationship of hx=hz<Hx=Hz is established is described as the fifth embodiment, and the configuration in which a relationship of PHz<Phz and PHx<Phx is established is described as the sixth embodiment. On the other hand, the present disclosure is not limited to these configurations as long as a relationship of har<Har is established. For example, the pitch Phz of the sub holes h may be smaller than the pitch PHz of the holes H (Phz<PHz), and the pitch Phx of the sub holes h may be smaller than the pitch PHx of the holes H (Phx<PHx). At this time, in order to satisfy a relationship of har<Har, the area hz×hx of the sub hole h is smaller than the area Hz×Hx of the hole H (hz×hx<Hz×Hx).

In addition, as long as a relationship har<Har is established, the area hz×hx of the sub hole h may be equal to or larger than the area Hz×Hx of the hole H (Hz×Hx≤hz×hx). At this time, in order to satisfy a relationship of har<Har, at least one of a relationship in which the pitch Phz of the sub holes h is larger than the pitch PHz of the holes H (PHz<Phz) or a relationship in which the pitch Phx of the sub holes h is larger than the pitch PHx of the holes H (PHx<Phx) is established.

Here, even in a case where the area hz×hx of the sub hole h is larger than the area Hz×Hx of the hole H (Hz×Hx<hz×hx), the length hz=hx=hr of one side of the sub hole h satisfies the relationship of 0<hr/Tp≤2.0, similarly to the length Hz=Hx=Hr of one side of the hole H. Thereby, the decrease rate of the electrostatic capacity is suppressed to 1% or less, and thus the low acoustic velocity region 518 can function as an excitation electrode. When 0<hr/Tp≤1.5, the decrease rate of the electrostatic capacity can be suppressed to 0.5% or less, and when 0<Hr/Tp≤1.0, the decrease rate of the electrostatic capacity can be suppressed to 0.1% or less. In a case where the planar shape of the sub hole h is a square shape, hr is a length of one side of the square shape, and in a case where the planar shape of the sub hole h is a shape other than a square shape, hr is a length of one side of a shape obtained by converting the shape of the sub hole h into a square shape while keeping the area constant.

Seventh Embodiment

Figure 44:
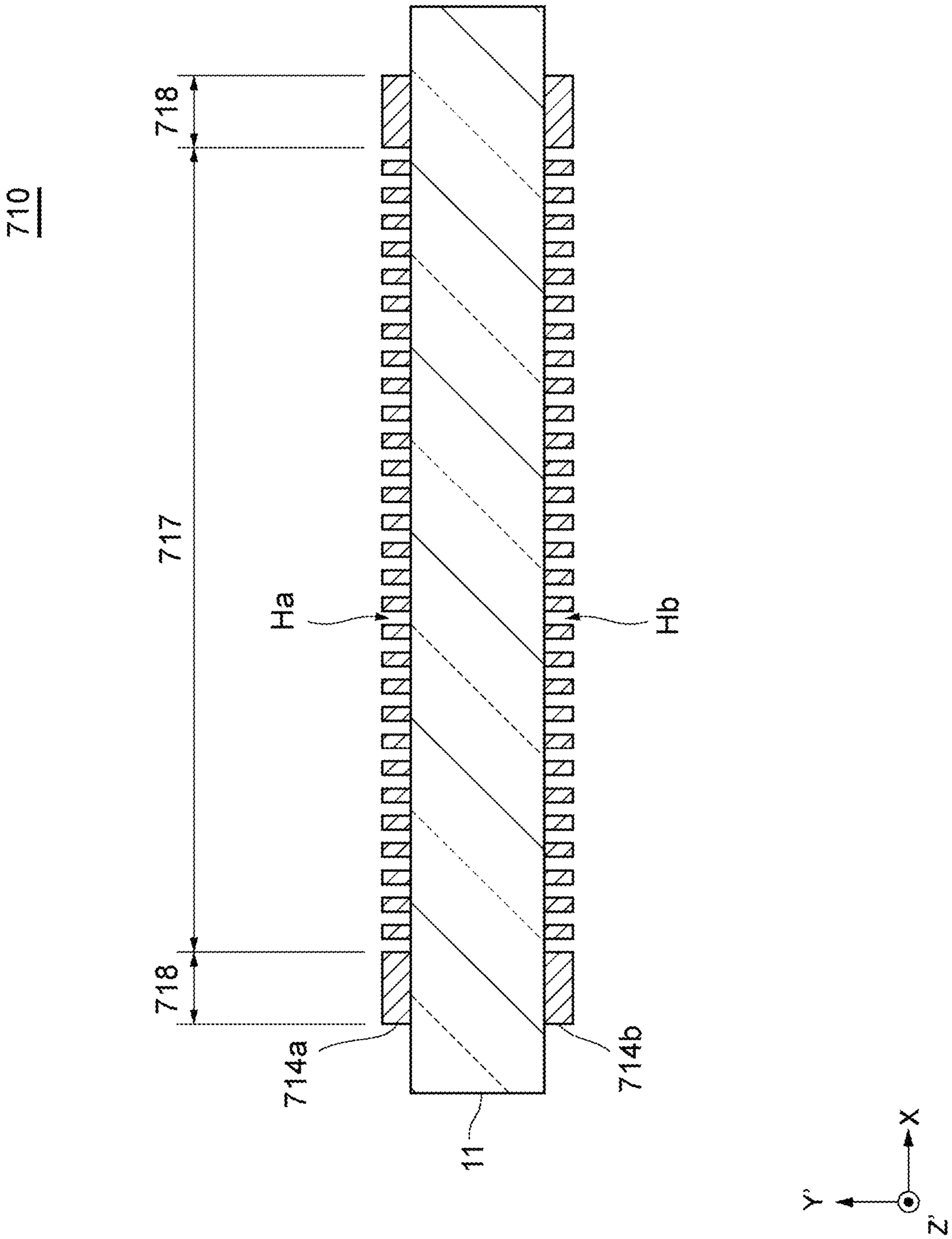
FIG. 44 is a cross-sectional view of a quartz crystal resonator according to a seventh embodiment.

Next, a configuration of the quartz crystal resonator 710 according to a seventh embodiment will be described with reference to FIG. 44. FIG. 44 is a cross-sectional view of the quartz crystal resonator 710 according to the seventh embodiment.

A plurality of holes Ha are formed on the first excitation electrode 714*a* in the high acoustic velocity region 717, and a plurality of holes Hb are formed on the second excitation electrode 714*b* in the high acoustic velocity region 717. The holes Ha and Hb have the same configuration as the holes H described above.

According to the present embodiment, the mass difference between the low acoustic velocity region 418 and the high acoustic velocity region 417 is further increased. Therefore, it is possible to further decrease the electromechanical coupling coefficients k_S1X and k_S1Z of the inharmonic spurious mode and further increase the electromechanical coupling coefficient k_S0 of the main mode.

The diameters of the plurality of holes formed on the first excitation electrode may be different from the diameters of the plurality of holes formed on the second excitation electrode. In addition, the pitch of the plurality of holes formed on the first excitation electrode may be different from the pitch of the plurality of holes formed on the second excitation electrode.

Eighth Embodiment

Figure 45:
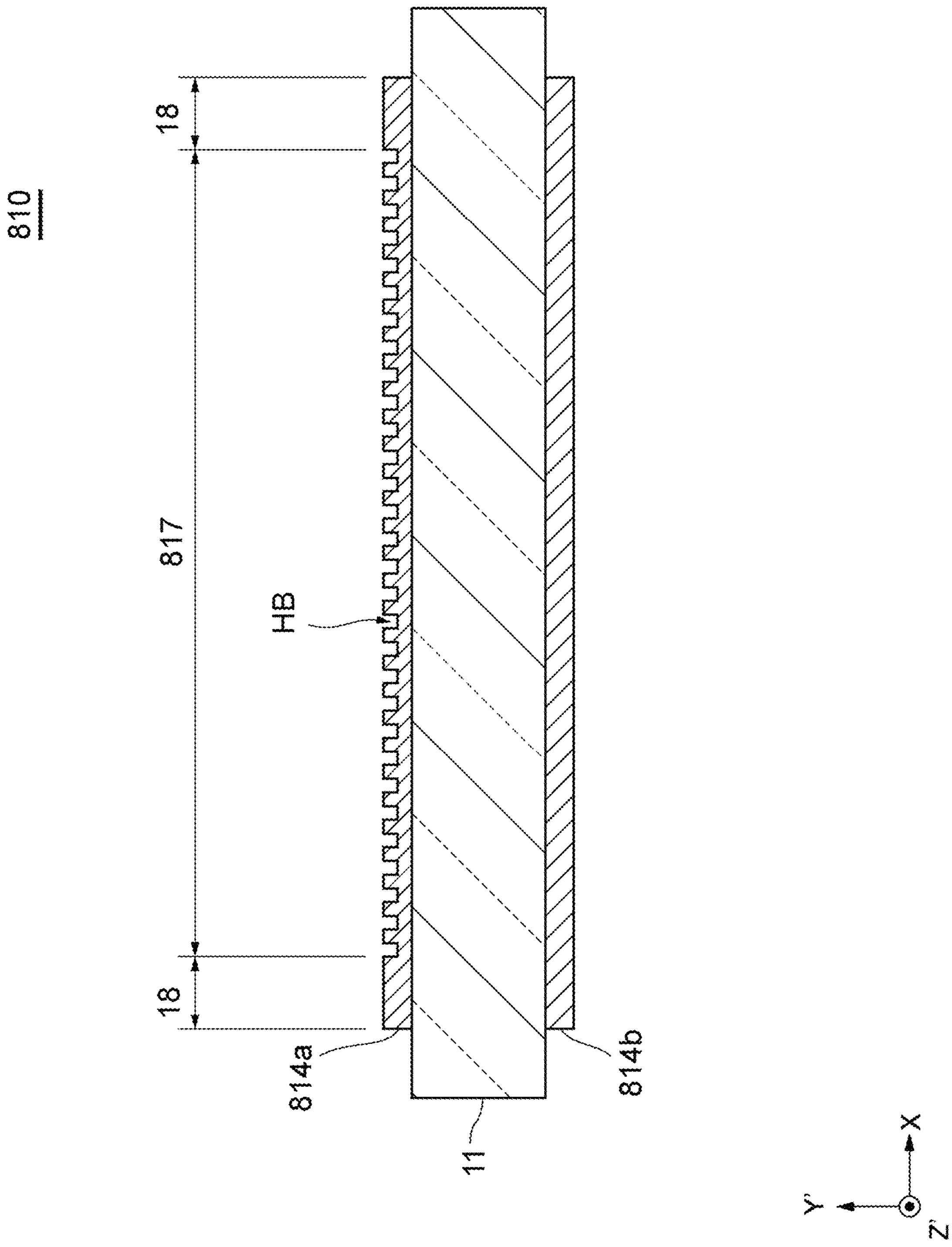
FIG. 45 is a cross-sectional view of a quartz crystal resonator according to an eighth embodiment.
Figure 46:
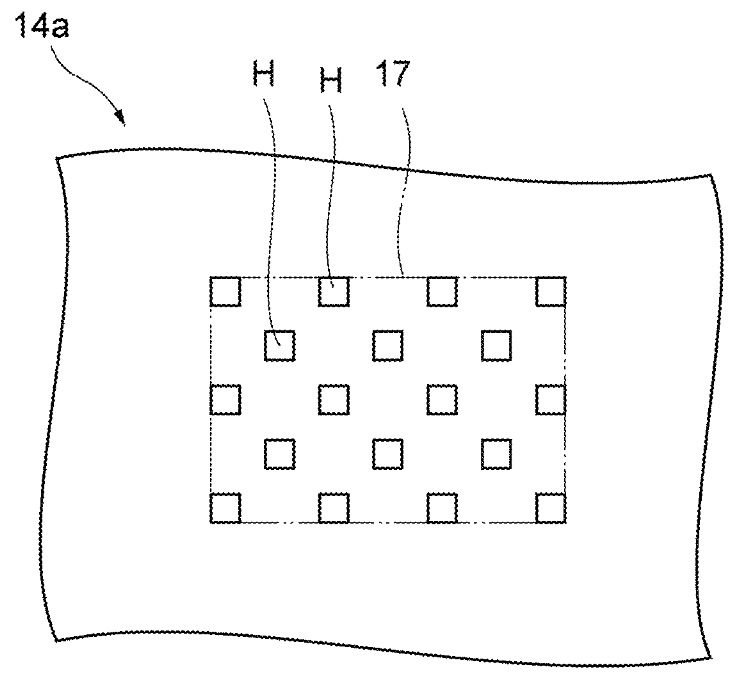
FIG. 46 is a plan view of a modification example of a high acoustic velocity region.

Next, a configuration of the quartz crystal resonator 810 according to an eighth embodiment will be described with reference to FIG. 45. FIG. 45 is a cross-sectional view of the quartz crystal resonator 810 according to the eighth embodiment.

A plurality of holes HB formed on the first excitation electrode 814*a* in the high acoustic velocity region 817 have a groove shape with a bottom, and are non-through holes.

According to the configuration, even in a case where the length hr of one side of the hole HB is larger than 2.0 μm, a decrease in the electrostatic capacity does not occur, and thus a degree of freedom in designing the hole HB is improved.

Hereinafter, a part or all of the embodiments of the present invention will be appended below. The present invention is not limited to the following appendices.

<1> A piezoelectric resonator including: a piezoelectric member and an excitation electrode that overlap with each other in a thickness direction, wherein the piezoelectric member has a high acoustic velocity region and a low acoustic velocity region in which an acoustic velocity is lower than an acoustic velocity in the high acoustic velocity region, in a plan view in the thickness direction, the high acoustic velocity region overlaps a center portion of the excitation electrode, and the low acoustic velocity region overlaps an end portion of the excitation electrode, the excitation electrode includes a plurality of holes in the high acoustic velocity region such that mass per unit area of the high acoustic velocity region is smaller than mass per unit area of the low acoustic velocity region, in a first direction intersecting the thickness direction, a dimension of a portion of the low acoustic velocity region that is adjacent to the high acoustic velocity region in the first direction is smaller than a dimension of the high acoustic velocity region in the first direction, and in the plan view in the thickness direction, an area of the low acoustic velocity region is smaller than an area of the high acoustic velocity region.

<2> The piezoelectric resonator according to <1>, in which the piezoelectric member is an AT-cut quartz crystal element, which has crystallographic axes including an X axis, a Y axis, and a Z axis, in which a Y' axis direction obtained by rotating the Y axis around the X axis is set as the thickness direction, and which has a main surface defined by a Z' axis direction obtained by rotating the Z axis around the X axis and an X axis direction parallel to the X axis.

<3> The piezoelectric resonator according to <2>, in which the low acoustic velocity region includes a first low acoustic velocity region adjacent to the high acoustic velocity region in the X axis direction, a second low acoustic velocity region adjacent to the high acoustic velocity region on a side opposite to the first low acoustic velocity region, a third low acoustic velocity region adjacent to the high acoustic velocity region in the Z' axis direction, and a fourth low acoustic velocity region adjacent to the high acoustic velocity region on a side opposite to the third low acoustic velocity region, and when a dimension of the excitation electrode in the X axis direction is defined as Ex, a dimension of the excitation electrode in the Z' axis direction is defined as Ez, a dimension of the first low acoustic velocity region in the X axis direction is defined as Wx1, a dimension of the second low acoustic velocity region in the X axis direction is defined as Wx2, a dimension of the third low acoustic velocity region in the Z' axis direction is defined as Wz1, and a dimension of the fourth low acoustic velocity region in the Z' axis direction is defined as Wz2: 0<Wx1/Ex≤0.07, 0<Wx2/Ex≤0.07, 0<Wz1/Ez≤0.08, and 0<Wz2/Ez≤0.08.

<4> The piezoelectric resonator according to <3>, wherein Wx1/Ex=0.062±0.006, Wx2/Ex=0.062±0.006, Wz1/Ez=0.070±0.006, and Wz2/Ez=0.070±0.006.

<5> The piezoelectric resonator according to <2>, in which the low acoustic velocity region includes a first low acoustic velocity region adjacent to the high acoustic velocity region in the X axis direction, and a second low acoustic velocity region adjacent to the high acoustic velocity region on a side opposite to the first low acoustic velocity region, the high acoustic velocity region, the first low acoustic velocity region, and the second low acoustic velocity region extend across an entire width of the excitation electrode from a first end portion to a second end portion of the excitation electrode in the Z' axis direction, and when a dimension of the excitation electrode in the X axis direction is defined as Ex, a dimension of the first low acoustic velocity region in the X axis direction is defined as Wx1, and a dimension of the second low acoustic velocity region in the X axis direction is defined as Wx2: 0<Wx1/Ex≤0.074, and 0<Wx2/Ex≤0.074.

<6> The piezoelectric resonator according to <5>, wherein Wx1/Ex=0.066±0.006, and Wx2/Ex=0.066±0.006.

<7> The piezoelectric resonator according to <2>, in which the low acoustic velocity region includes a third low acoustic velocity region adjacent to the high acoustic velocity region in the Z' axis direction, and a fourth low acoustic velocity region adjacent to the high acoustic velocity region on a side opposite to the third low acoustic velocity region, the high acoustic velocity region, the third low acoustic velocity region, and the fourth low acoustic velocity region extend across an entire width of the excitation electrode from a first end portion to a second end portion of the excitation electrode in the Z' axis direction, and when a dimension of the excitation electrode in the Z' axis direction is defined as Ez, a dimension of the third low acoustic velocity region in the Z' axis direction is defined as Wz1, and a dimension of the fourth low acoustic velocity region in the Z' axis direction is defined as Wz2: 0<Wz1/Ez≤0.082, and 0<Wz2/Ez≤0.082.

<8> The piezoelectric resonator according to <7>, wherein Wz1/Ez=0.074±0.006, and Wz2/Ez=0.074±0.006.

<9> The piezoelectric resonator according to any one of <1> to <8>, in which the plurality of holes are through holes that penetrate the excitation electrode in the thickness direction, and when a thickness of the piezoelectric member is defined as Tp, and where a shape of each of the plurality of holes is a square shape in the plan view, a length of a first side of the square shape is defined as Hr, and where a shape of each of the plurality of holes is a shape other than the square shape in the plan view, a length of the first side of the shape obtained by converting the shape into the square shape while keeping an area of the shape constant is defined as Hr: 0<Hr/Tp≤2.0.

<10> The piezoelectric resonator according to <9>, wherein 0<Hr/Tp≤1.45.

<11> The piezoelectric resonator according to <10>, wherein Hr/Tp=1.3±0.1.

<12> The piezoelectric resonator according to any one of <1> to <11>, wherein the plurality of holes are through holes that penetrate the excitation electrode in the thickness direction, and when an opening ratio of the plurality of holes is defined as Har, 0<Har≤0.5.

<13> The piezoelectric resonator according to <12>, wherein Har=0.4±0.06.

<14> The piezoelectric resonator according to any one of <1> to <8>, wherein the plurality of holes have a groove shape with a bottom.

<15> The piezoelectric resonator according to any one of <1> to <14>, wherein a thickness of the excitation electrode in the low acoustic velocity region is equal to a thickness of the excitation electrode in the high acoustic velocity region, excluding a thickness at the plurality of holes.

<16> The piezoelectric resonator according to any one of <1> to <14>, wherein a thickness of the excitation electrode in the low acoustic velocity region is thicker than a thickness of the excitation electrode in the high acoustic velocity region, excluding a thickness at the plurality of holes.

<17> The piezoelectric resonator according to any one of <1> to <16>, wherein the low acoustic velocity region of the excitation electrode includes a plurality of sub holes, an opening ratio of the plurality of sub holes is lower than an opening ratio of the plurality of holes, and when a thickness of the piezoelectric member is defined as Tp, and where a shape of each of the plurality of sub holes is a square shape in the plan view, a length of a first side of the square shape is defined as hr, and where a shape of each of the plurality of sub holes is a shape other than the square shape in the plan view, a length of the first side of the shape obtained by converting the shape into the square shape while keeping an area of the shape constant is defined as hr: 0<hr/Tp≤2.0.

In the present specification, a quartz crystal resonator including a quartz crystal element as a piezoelectric element is described as an example, but the piezoelectric resonator is not limited thereto. As a piezoelectric element that can be appropriately used for the piezoelectric resonator unit according to the present embodiment, for example, a piezoelectric ceramic such as PZT or aluminum nitride, a piezoelectric single crystal such as lithium niobate or lithium tantalate, and the like are used. On the other hand, the material of the piezoelectric element is not limited thereto, and can be selected as appropriate.

The embodiments according to the present invention are not particularly limited, and can be applied to any device that converts electromechanical energy using a piezoelectric effect, such as a timing device, a sound generator, an oscillator, or a load sensor.

As described above, according to an aspect of the present invention, it is possible to provide a piezoelectric resonator capable of improving an electromechanical coupling coefficient.

The embodiments described above are intended to facilitate understanding of the present invention, and are not intended to be interpreted as limiting the present invention. The present invention may be modified/improved without departing from the gist of the present invention, and the present invention also includes equivalents thereof. That is, the scope of the present invention includes designs obtained by appropriately changing the embodiments and/or the modification example by those skilled in the art as long as the designs have the characteristics of the present invention. For example, each component included in the embodiments and/or the modification example, arrangement, a material, a condition, a shape, a size, and the like of the component are not limited to those illustrated, and can be changed as appropriate. In addition, the embodiments and the modification examples are merely examples, and it goes without saying that partial substitutions or combinations of the configurations illustrated in the different embodiments and/or modification examples can be made, and substitutions or combinations are also included within the scope of the present invention as long as the substitutions or combinations include the characteristics of the present invention.

REFERENCE SIGNS LIST

100 CRYSTAL OSCILLATOR
130 MOUNTING SUBSTRATE
140 LID
QUARTZ CRYSTAL RESONATOR UNIT
10 QUARTZ CRYSTAL RESONATOR
11 QUARTZ CRYSTAL ELEMENT
11A UPPER SURFACE
11B LOWER SURFACE
**14*a*** FIRST EXCITATION ELECTRODE
**14*b*** SECOND EXCITATION ELECTRODE
**15*a*** FIRST EXTENDED ELECTRODE
**15*b*** SECOND EXTENDED ELECTRODE
**16*a*** FIRST CONNECTION ELECTRODE
**16*b*** SECOND CONNECTION ELECTRODE
17 HIGH ACOUSTIC VELOCITY REGION
18 LOW ACOUSTIC VELOCITY REGION
18A FIRST LOW ACOUSTIC VELOCITY REGION
18B SECOND LOW ACOUSTIC VELOCITY REGION
18C THIRD LOW ACOUSTIC VELOCITY REGION
18D FOURTH LOW ACOUSTIC VELOCITY REGION
30 BASE MEMBER
40 LID MEMBER
50 BONDING PORTION
H HOLE

The invention claimed is:

1. A piezoelectric resonator comprising:
a piezoelectric member and an excitation electrode that overlap with each other in a thickness direction,
wherein the piezoelectric member has a high acoustic velocity region and a low acoustic velocity region in which an acoustic velocity is lower than an acoustic velocity in the high acoustic velocity region,
in a plan view in the thickness direction, the high acoustic velocity region overlaps a center portion of the excitation electrode, and the low acoustic velocity region overlaps an end portion of the excitation electrode,
the excitation electrode includes a plurality of holes in the high acoustic velocity region such that a mass per unit area of the high acoustic velocity region is smaller than a mass per unit area of the low acoustic velocity region,
in a first direction intersecting the thickness direction, a dimension of a portion of the low acoustic velocity region that is adjacent to the high acoustic velocity region in the first direction is smaller than a dimension of the high acoustic velocity region in the first direction, and
in the plan view in the thickness direction, an area of the low acoustic velocity region is smaller than an area of the high acoustic velocity region.

2. The piezoelectric resonator according to claim 1, wherein the piezoelectric member is an AT-cut quartz crystal element, which has crystallographic axes including an X axis, a Y axis, and a Z axis, in which a Y' axis direction obtained by rotating the Y axis around the X axis is set as the thickness direction, and which has a main surface defined by a Z' axis direction obtained by rotating the Z axis around the X axis and an X axis direction parallel to the X axis.

3. The piezoelectric resonator according to claim 2,
wherein the low acoustic velocity region includes a first low acoustic velocity region adjacent to the high acoustic velocity region in the X axis direction, a second low acoustic velocity region adjacent to the high acoustic velocity region on a side opposite to the first low acoustic velocity region, a third low acoustic velocity region adjacent to the high acoustic velocity region in the Z' axis direction, and a fourth low acoustic velocity region adjacent to the high acoustic velocity region on a side opposite to the third low acoustic velocity region, and
when a dimension of the excitation electrode in the X axis direction is defined as Ex, a dimension of the excitation electrode in the Z' axis direction is defined as Ez, a dimension of the first low acoustic velocity region in the X axis direction is defined as Wx1, a dimension of the second low acoustic velocity region in the X axis direction is defined as Wx2, a dimension of the third low acoustic velocity region in the Z' axis direction is defined as Wz1, and a dimension of the fourth low acoustic velocity region in the Z' axis direction is defined as Wz2:

$0<Wx1/Ex\leq 0.07$,
$0<Wx2/Ex\leq 0.07$,
$0<Wz1/Ez\leq 0.08$, and
$0<Wz2/Ez\leq 0.08$.

4. The piezoelectric resonator according to claim 3, wherein $Wx1/Ex=0.062\pm 0.006$,
$Wx2/Ex=0.062\pm 0.006$,
$Wz1/Ez=0.070\pm 0.006$, and
$Wz2/Ez=0.070\pm 0.006$.

5. The piezoelectric resonator according to claim 2,
wherein the low acoustic velocity region includes a first low acoustic velocity region adjacent to the high acoustic velocity region in the X axis direction, and a second low acoustic velocity region adjacent to the high acoustic velocity region on a side opposite to the first low acoustic velocity region, the high acoustic velocity region, the first low acoustic velocity region, and the second low acoustic velocity region extend across an entire width of the excitation electrode from a first end portion to a second end portion of the excitation electrode in the Z' axis direction, and when a dimension of the excitation electrode in the X axis direction is defined as Ex, a dimension of the first low acoustic velocity region in the X axis direction is defined as Wx1, and a dimension of the second low acoustic velocity region in the X axis direction is defined as Wx2:

$0<Wx1/Ex\leq 0.074$, and $0<Wx2/Ex\leq 0.074$.

6. The piezoelectric resonator according to claim 5, wherein $Wx1/Ex=0.066\pm 0.006$, and $Wx2/Ex=0.066\pm 0.006$.

7. The piezoelectric resonator according to claim 2, wherein the low acoustic velocity region includes a third low acoustic velocity region adjacent to the high acoustic velocity region in the Z' axis direction, and a fourth low acoustic velocity region adjacent to the high acoustic velocity region on a side opposite to the third low acoustic velocity region, the high acoustic velocity region, the third low acoustic velocity region, and the fourth low acoustic velocity region extend across an entire width of the excitation electrode from a first end portion to a second end portion of the excitation electrode in the Z' axis direction, and when a dimension of the excitation electrode in the Z' axis direction is defined as Ez, a dimension of the third low acoustic velocity region in the Z' axis direction is defined as Wz1, and a dimension of the fourth low acoustic velocity region in the Z' axis direction is defined as Wz2:

$0<Wz1/Ez\leq 0.082$, and $0<Wz2/Ez\leq 0.082$.

8. The piezoelectric resonator according to claim 7, wherein $Wz1/Ez=0.074\pm 0.006$, and $Wz2/Ez=0.074\pm 0.006$.

9. The piezoelectric resonator according to claim 1, wherein the plurality of holes are through holes that penetrate the excitation electrode in the thickness direction, and when a thickness of the piezoelectric member is defined as Tp, and where a shape of each of the plurality of holes is a square shape in the plan view, a length of a first side of the square shape is defined as Hr, and where a shape of each of the plurality of holes is a shape other than the square shape in the plan view, a length of the first side of the shape obtained by converting the shape into the square shape while keeping an area of the shape constant is defined as Hr: $0<Hr/Tp\leq 2.0$.

10. The piezoelectric resonator according to claim 9, wherein $0<Hr/Tp\leq 1.45$.

11. The piezoelectric resonator according to claim 10, wherein $Hr/Tp=1.3\pm 0.1$.

12. The piezoelectric resonator according to claim 1, wherein the plurality of holes are through holes that penetrate the excitation electrode in the thickness direction, and when an opening ratio of the plurality of holes is defined as Har: $0<Har\leq 0.5$.

13. The piezoelectric resonator according to claim 12, wherein $Har=0.4\pm 0.06$.

14. The piezoelectric resonator according to claim 1, wherein the plurality of holes have a groove shape with a bottom.

15. The piezoelectric resonator according to claim 1, wherein the plurality of holes are through holes that penetrate the excitation electrode in the thickness direction.

16. The piezoelectric resonator according to claim 1, wherein a thickness of the excitation electrode in the low acoustic velocity region is equal to a thickness of the excitation electrode in the high acoustic velocity region, excluding a thickness at the plurality of holes.

17. The piezoelectric resonator according to claim 1, wherein a thickness of the excitation electrode in the low acoustic velocity region is thicker than a thickness of the excitation electrode in the high acoustic velocity region, excluding a thickness at the plurality of holes.

18. The piezoelectric resonator according to claim 1, wherein the low acoustic velocity region of the excitation electrode includes a plurality of sub holes, an opening ratio of the plurality of sub holes is lower than an opening ratio of the plurality of holes, and when a thickness of the piezoelectric member is defined as Tp, and where a shape of each of the plurality of sub holes is a square shape in the plan view, a length of a first side of the square shape is defined as hr, and where a shape of each of the plurality of sub holes is a shape other than the square shape in the plan view, a length of the first side of the shape obtained by converting the shape into the square shape while keeping an area of the shape constant is defined as hr: $0<hr/Tp\leq 2.0$.

19. The piezoelectric resonator according to claim 1, wherein the low acoustic velocity region of the excitation electrode includes a plurality of sub holes, and an opening ratio of the plurality of sub holes is lower than an opening ratio of the plurality of holes.

* * * * *